United States Patent [19]

Nii et al.

[11] 4,107,778

[45] Aug. 15, 1978

[54] DIGITAL FAULT-LOCATION CALCULATION SYSTEM

[75] Inventors: Yoshiji Nii, Kawaguchi; Takayuki Matsuda, Tokyo; Yoichi Yamazaki; Haruo Nohara, both of Hitachi, all of Japan

[73] Assignees: Hitachi, Ltd.; The Tokyo Electric Power Co., Inc., both of Japan

[21] Appl. No.: 768,841

[22] Filed: Feb. 15, 1977

[30] Foreign Application Priority Data

Feb. 18, 1976 [JP] Japan .................................. 51-15979

[51] Int. Cl.² ..................... G01R 31/08; G06F 15/20
[52] U.S. Cl. .................................. 364/492; 364/483; 324/52; 361/80
[58] Field of Search ..................... 235/151.31, 151.21, 235/150, 151.3; 324/76 R, 78 D, 83 D, 51, 52, 103 R; 361/79, 80, 107, 109, 110, 114

[56] References Cited

U.S. PATENT DOCUMENTS

| | | | |
|---|---|---|---|
| 3,569,785 | 3/1971 | Durbeck et al. | 235/151.31 X |
| 3,590,368 | 6/1971 | Esclangon | 361/80 X |
| 3,723,864 | 3/1973 | Ricard | 361/80 X |
| 3,731,152 | 5/1973 | Rockefeller, Jr. | 235/151.31 X |
| 3,735,204 | 5/1973 | Maenicke | 361/80 |
| 3,758,763 | 9/1973 | Nohara et al. | 235/151.31 |
| 3,885,199 | 5/1975 | Nohara et al. | 235/151.31 X |
| 3,931,502 | 1/1976 | Kohlas | 235/151.31 |
| 3,983,377 | 9/1976 | Vitins | 235/151.31 |
| 3,984,737 | 10/1976 | Okamura et al. | 361/80 |

*Primary Examiner*—Edward J. Wise
*Attorney, Agent, or Firm*—Craig & Antonelli

[57] ABSTRACT

Provided is a digital fault-location calculation system which comprises first means for obtaining data including voltage and current information of a power transmission system subjected to fault-location calculation, a computer, and second means coupled between the first means and the computer for transferring the obtained data to the computer from the first means. The computer has at least two functions, one of which is the detection of occurrence of a fault in the transmission line and the other is the calculation of distance from the point of installation of the system to the fault point, in response to the data transferred through the second means and in accordance with predetermined processes. The distance to the fault point is computed by the other function of the computer only upon the detection of occurrence of a fault in the transmission line by the one function of the same.

30 Claims, 53 Drawing Figures

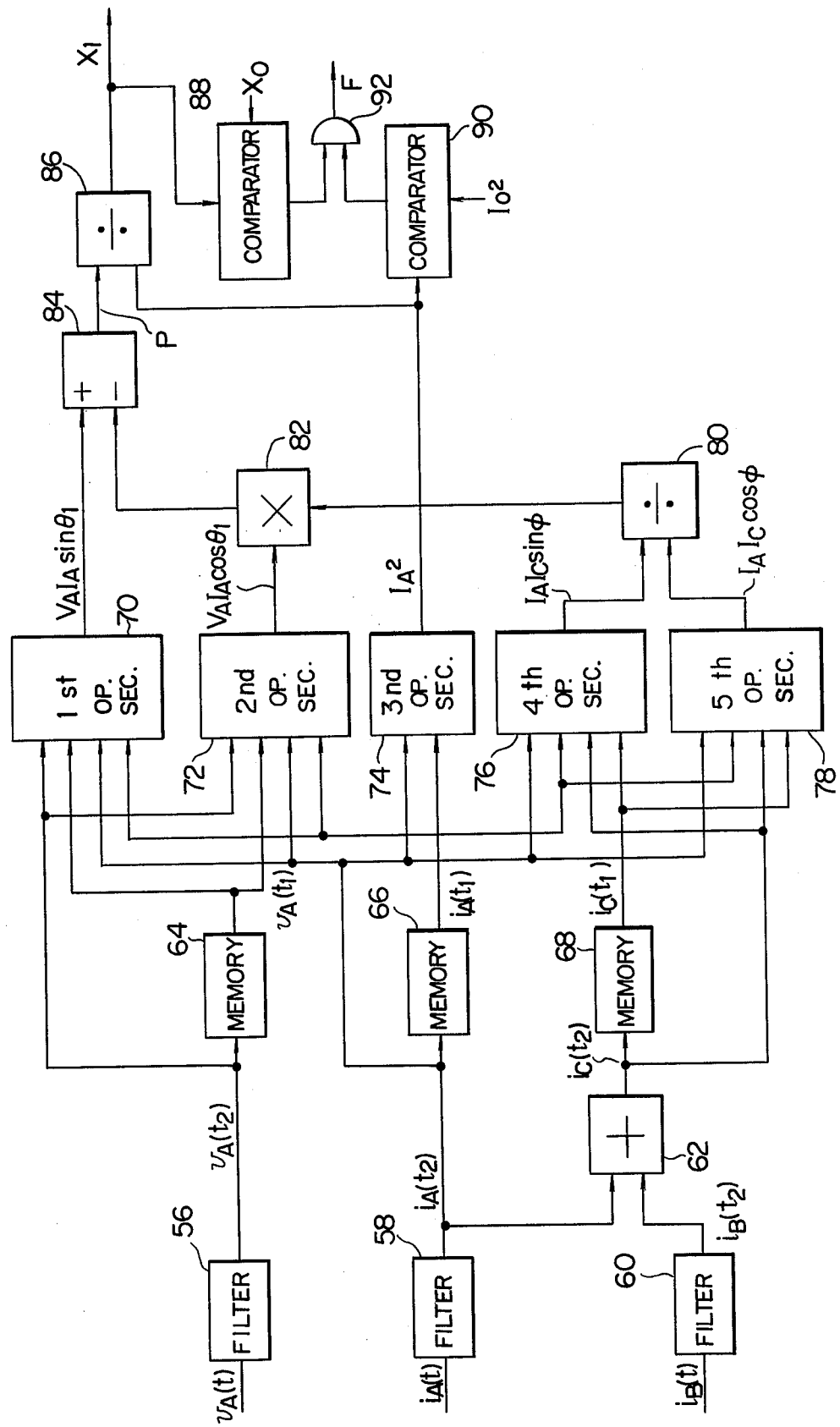
F I G. 14

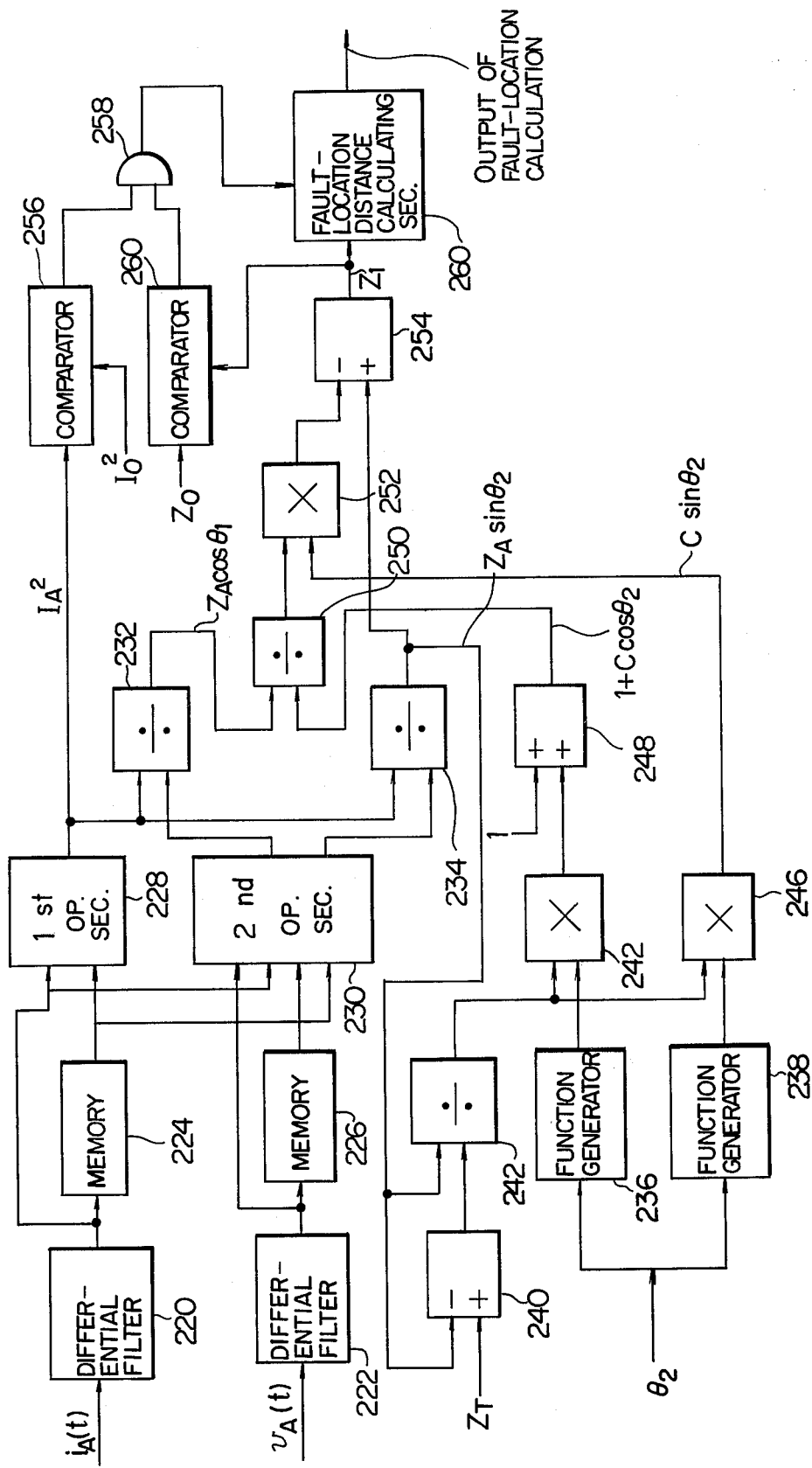
F I G. 21

F I G. 23
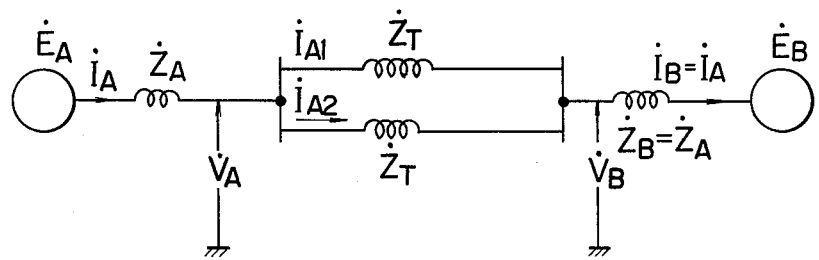
F I G. 24
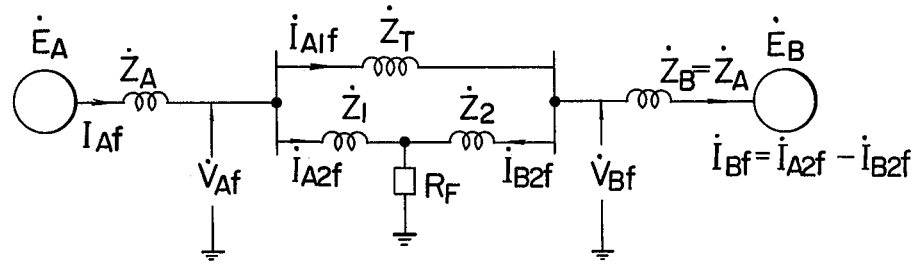
F I G. 26
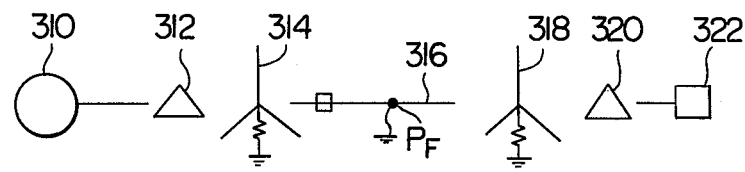

F I G. 30
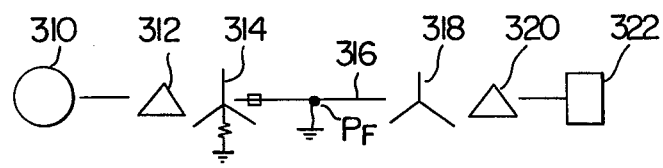
F I G. 31
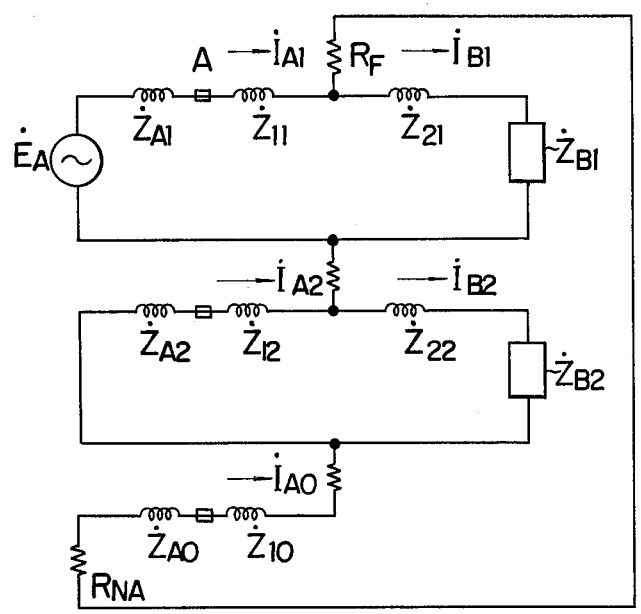
F I G. 32
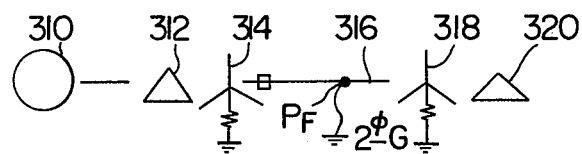

F I G. 36
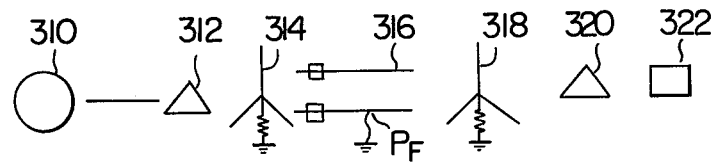
F I G. 37
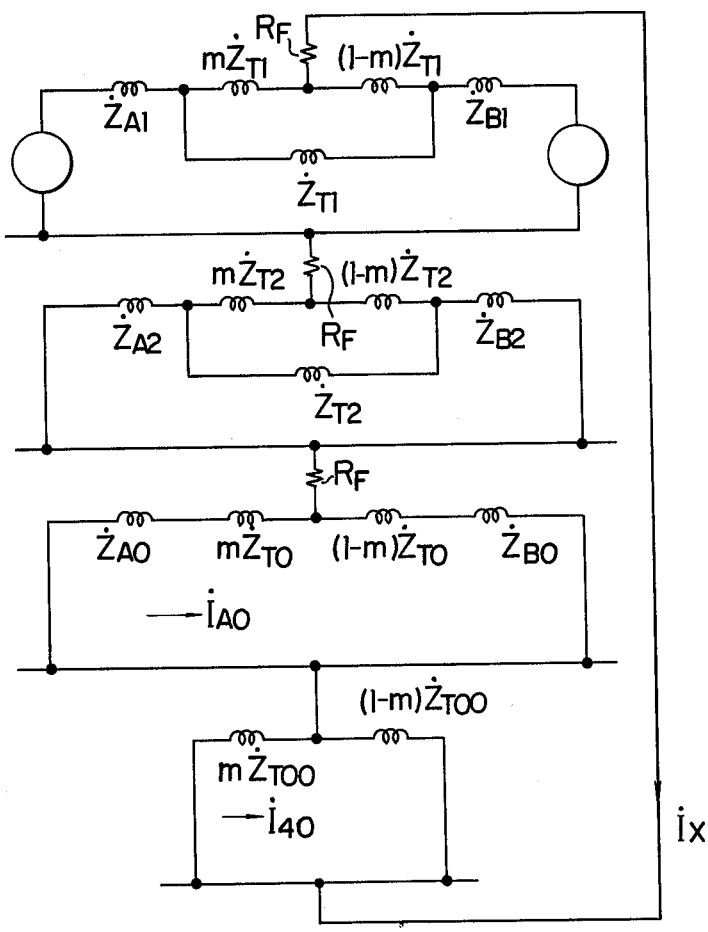

F I G. 40
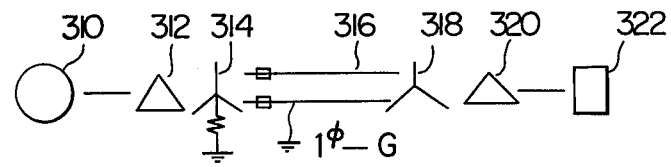
F I G. 41
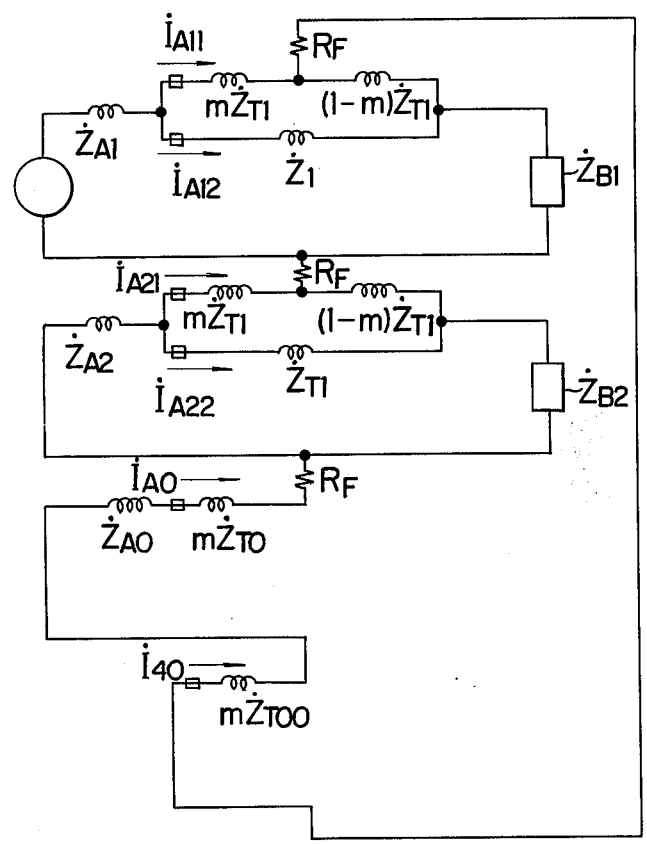

F I G. 42
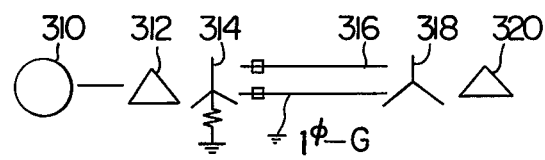
F I G. 43
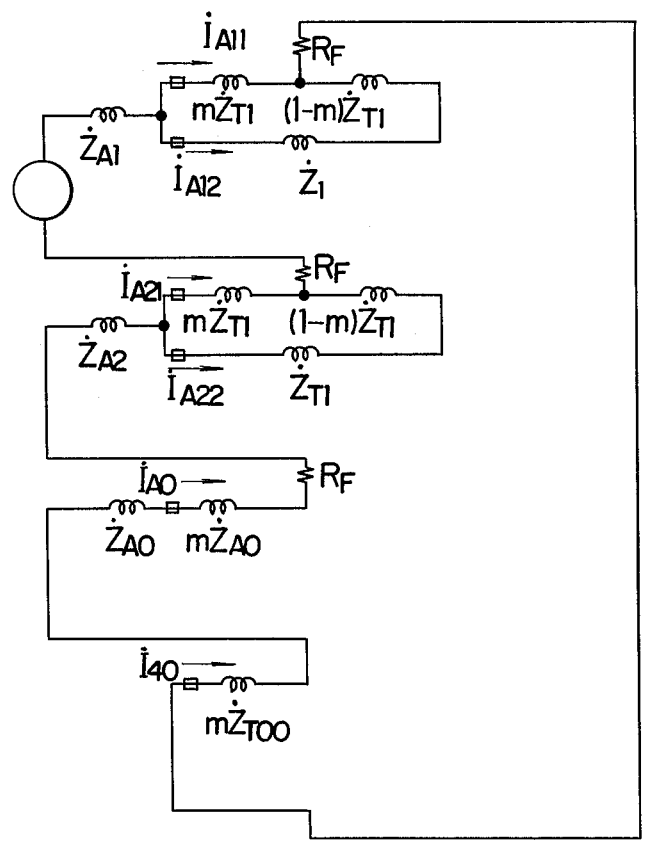

DIGITAL FAULT-LOCATION CALCULATION SYSTEM

BACKGROUND OF THE INVENTION

1. Field of the Invention

This invention relates to a fault-location calculating system for an electric power transmission system, or more in particular to a digital fault-location calculating system suitable for a large electric power transmission system with many protecting sections.

2. Description of the Prior Art

In commercialized conventional fault-location calculating systems, a fault-location is calculated by analog operation on the basis of analog information showing the conditions of voltage and current at a point on the power transmission line. For more accurate calculation of a fault-location, a system was recently studied and devised for calculating a fault-location by digital conversion of voltage/current information of a power transmission line and by digital operation based on the digital information. The principle and embodiments of such a system are disclosed, for example, in the U.S. Pat. No. 3,758,763 issued to H. Nohara et al. on Sept. 11, 1973 and entitled "METHOD OF DIGITALLY PROCESSING SINUSOIDAL AC SIGNALS", a patent application for which was filed by H. Nohara et al. on Nov. 5, 1971.

The conventional digital fault-location calculating systems are arranged such that they perform the fault-location calculating operation even under normal conditions free from any abnormalities in the power transmission system. The fault-location calculating operation under normal conditions is wasteful and deteriorates the utilization rate of the calculating system. The conventional fault-location calculating systems which are constantly subjected to abnormality detecting operations or relaying operations and fault-location calculating operations are quite low in efficiency and have the disadvantage of a greatly limited number of power transmission lines which may be processed by one fault-location calculating system.

In the conventional digital fault-location calculating systems, the time point at which the current exceeds a predetermined value is detected and the data subsequent to this time point are used for the fault-location calculation. A disadvantage of such a method is that the requirement of detection of the fact that the current exceeds a predetermined value increases the processing period of time.

Still another disadvantage of the conventional fault-location calculating systems is that since they use only the voltage/current information at the end of the power transmission system where a fault-location calculating system is installed (hereinafter referred to as the installation end), the result of calculation of the calculating system is affected by the arc resistance at the fault-location, power flow and back impedance, etc. making accurate fault-location calculation impossible.

SUMMARY OF THE INVENTION

One object of the present invention is to provide an improved digital fault-location calculating system.

Another object of the invention is to provide a highly efficient digital fault-location calculating system which is available for a large number of power transmission lines.

Still another object of the invention is to provide a digital fault-location calculating system capable of fault-location calculating operation accurately, without being affected by the arc resistance at the fault-location, back impedance, power flow, etc.

In order to achieve these objects, there is provided according to the present invention a digital fault-location calculating system comprising first means for obtaining voltage and current data of a power transmission system subjected to fault-location calculation, a computer, and second means coupled between the first means and the computer for transferring the obtained data to the computer from the first means, the computer having at least two functions, one of which is the detection of occurrence of a fault in the power transmission system and the other of which is the calculation of the distance from the installation point of the calculating system to the fault point in response to the data transferred through the second means and in accordance with predetermined processes.

BRIEF DESCRIPTION OF THE DRAWINGS

The above and other objects, features and advantages will be made apparent by the detailed description of the embodiments taken below in conjunction with the accompanying drawings, in which:

FIG. 14 is a block diagram showing another embodiment of the digital calculating device shown in FIG. 9;

FIG. 21 is a block diagram showing a further embodiment of the digital fault-location calculating device in FIG. 9;

FIG. 23 is a diagram for explaining parallel lines under normal conditions;

FIG. 24 is a diagram for explaining parallel lines in the presence of a fault;

FIGS. 26, 28, 30, 32, 34, 36, 38, 40, 42, 44, 46, 48 and 50 are diagrams showing examples of power transmission system to which the present invention is applicable;

FIGS. 27, 29, 31, 33, 35, 37, 39, 41, 43, 45, 47, 49 and 51 are diagrams showing equivalent circuits of the above-mentioned respective power transmission systems according to the method of symmetrical coordinates;

DETAILED DESCRIPTION OF THE PREFERRED EMBODIMENTS

Figure 1:
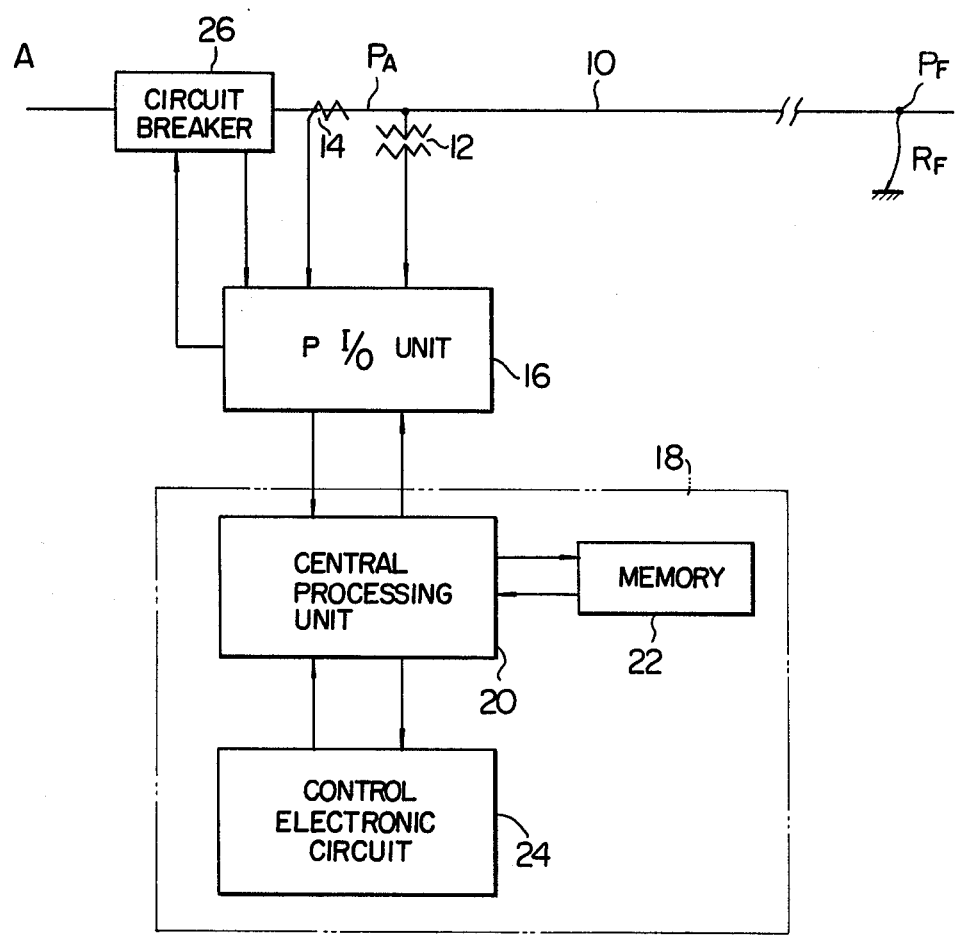
FIG. 1 is a schematic diagram showing the fundamental configuration of a digital fault location calculating system according to the present invention.

Embodiments of the invention will be described below with reference to the accompanying drawings. FIG. 1 is a schematic diagram showing a fundamental construction of the digital fault-location calculating system according to the invention and the arrangement for only one power transmission line of a power transmission system subjected to fault-location calculation is shown therein. The voltage and current of the power transmission line 10 involved are detected by a potential transformer 12 and a current transformer 14 respectively. A process input/output unit 16 (hereinafter referred to as P I/O unit) is provided for coupling the transformers 12 and 14 with a computer 18 and includes a sampling-A/D converter circuit. The analog outputs from the potential transformer 12 and the current transformer 14 are sampled at predetermined intervals and converted into digital signals by the sampling-A/D converter circuit included in the P I/O unit 16. A digital output signal which is produced from a circuit breaker 26 provided for protection of the power transmission line 10 and represents the on-off conditions of the circuit breaker 26 is introduced to the digital computer 18 through the P I/O unit 16 together with the digitally converted data of the transformers 12 and 14. The digital computer 18 has at least two functions one of which is the detection of occurrence of a fault in the power transmission line and the other of which is the calculation of distance from the installation point $P_A$ of the potential transformer 12 and the current transformer 14 to the fault location point $P_F$ in accordance with predetermined processes. The digital computer 18 may be an ordinary one including a central processing unit 20 (hereinafter referred to as CPU 20), a memory means or storing device 22 and a control electronic-circuit 24. The digital computer 18 may of course be replaced by a circuit made up of a combination of various devices, as explained later.

Figure 2:
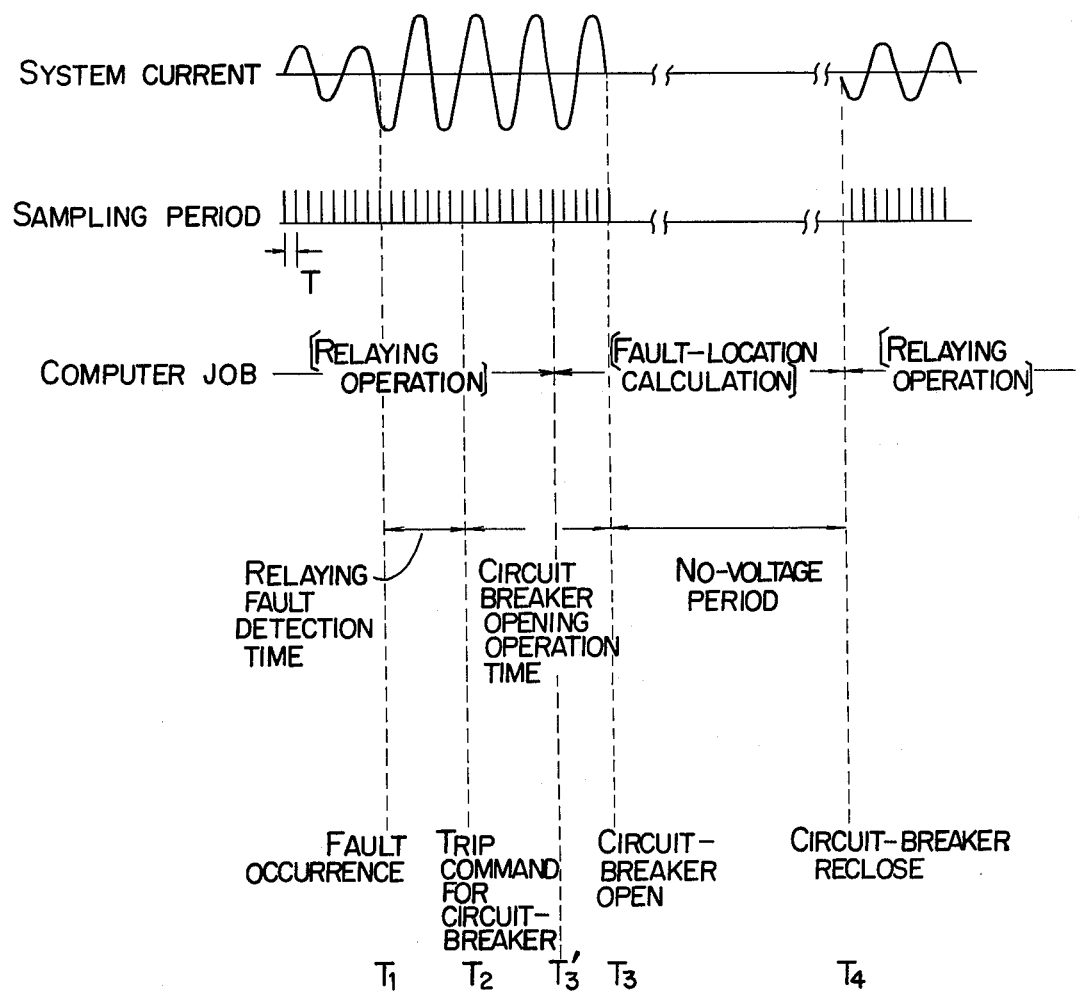
FIG. 2 is a diagram for explaining the operation of the system of FIG. 1.

The operation of this calculating system will be described below with reference to FIGS. 1 and 2.

The power transmission system data, in the form of, say, voltage or current, representing the conditions of the power transmission line 10 are detected by the potential transformer 12 and the current transformer 14 respectively. The analog signals representing the values thus detected are sampled by the P I/O unit 16 at a proper period T (for instance, at the repetitive rate of 1200 Hz, i.e., 24 times per cycle of power data in an AC system of 50 Hz). The sampled analog signal is converted into a digital signal, for instance, a binary one having a predetermined number of bits. This digital signal is applied through the CPU 20 of the digital computer 18 to a memory 22. The CPU 20 reads out sequentially the information stored in the memory 22 so as to perform normally the relaying operation or fault-occurrence detecting operation on the basis of such information. Thus, when a fault occurs at time point $T_1$, the CPU 20 finds the fault at time point $T_2$ and immediately applies a trip signal through the P I/O unit 16 to the circuit breaker 26 thereby to open the breaker 26. Upon the completion of the opening of the circuit breaker 26 at time point $T_3$, a signal showing the opening of the breaker 26 is applied via the P I/O unit 16 to the digital computer 18. In response to the circuit breaker open signal, the CPU 20 performs the fault-location calculating operation for measuring the distance from the installation point $P_A$ of the potential transformer 12 and the current transformer 14 to the fault-location point $P_F$ in such a manner as disclosed in the above-mentioned U.S. Pat. No. 3,758,863, on the basis of the data that has been stored in the memory 22 up to time point $T_3$. At time point $T_4$, a circuit breaker reclosing signal is applied to the circuit breaker 26 from a high speed reclosing system (not shown). In response to the closing of the circuit breaker 26, the P I/O unit 16 starts again the relaying operation. In the case of the high speed reclosing system, the no-voltage period from $T_3$ to $T_4$ is very short, for example, on the order of 250 to 450 ms, but during which period of time a fault is fully located. The fault-location calculating system according to the invention is especially suitable for the power transmission system of such a high speed reclosing system. Although the fault-location calculating operation may be started at time point $T_2$ when the fault is detected, it would be better to postpone the fault-location calculating operation until time point $T_3$. This is because it is possible to perform the fault-location calculating operation by the use of data which was reduced in DC components of power transmission system current with greater accuracy in the calculation of the fault point. Further, the resultant elimination of the need for a decision as to whether a predetermined level of current is exceeded or a predetermined voltage is not exceeded simplifies the processing operations.

The control electronic circuit 24 included in the digital computer 18 is an ordinary one for energizing the CPU 20 in accordance with the procedures as mentioned above.

It was already explained that in FIG. 1, the digital data from the P I/O unit 16 is applied through the CPU 20 to the memory 22. As an alternative, the digital data may of course be directly applied to the memory 22 when the processing capacity of the CPU 20 is low. Also, memory 22 may take the form of an auxiliary memory attached to the digital computer 18, if required.

Figure 3:
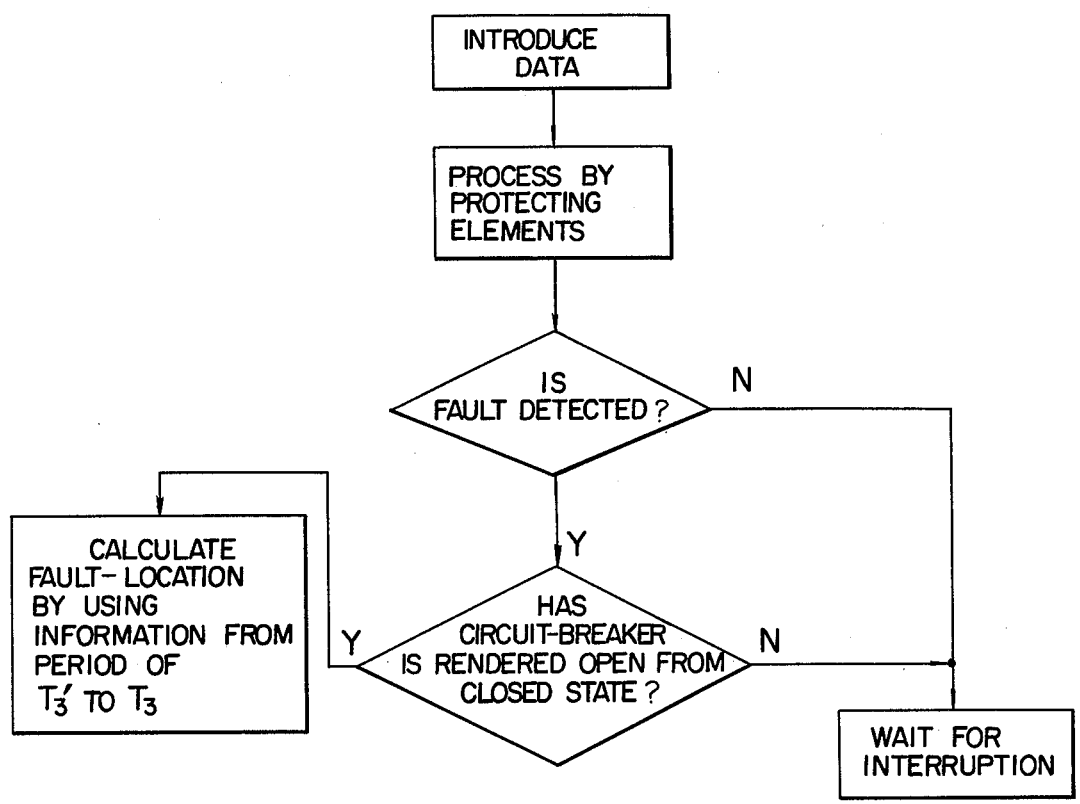
FIG. 3 is a flowchart for explaining the processing operation of fault-location calculation by the fault-location calculating system according to the invention.

A flowchart of the procedures for fault-location calculation explained above is shown in FIG. 3. As seen from this drawing, the voltage-current information and circuit breaker information are introduced or obtained each time of sampling for relaying operation. In the case where no occurrence of a fault is detected, the next interruption is awaited, while when a fault occurrence is detected, whether the circuit breaker 26 has changed over from its closed to open state or not is decided. If not changed-over, the next interruption is waited for. If the circuit breaker 26 has been changed over from the closed to open state at time point $T_3$, on the other hand, fault-location calculation is performed by the use of information during a certain period from time point $T_3'$, which is a little before time point $T_3$, to $T_3$ as shown in FIG. 2.

Figure 4:
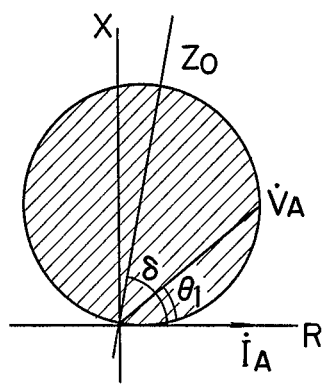
FIG. 4 is a diagram showing the mho relay element characteristics.

Next, explanation will be made of a specific example of processes for fault occurrence detection and fault-location calculation by the use of a mho relay element. FIG. 4 shows well-known characteristics of a mho relay element, in which the shadowed part represents the operating area, reference character $Z_0$ a setting impedance, and $V_A$ and $I_A$ the voltage and current respectively applied to the computer from the point $P_A$ of the power transmission system to be protected. In this case, the formula as shown below is used to realize the mho relay element by the multiplying operation of sampled instantaneous values.

$$\{Z_0 I_A - V_A\} V_A \geq 0 \tag{1}$$

Figure 5:
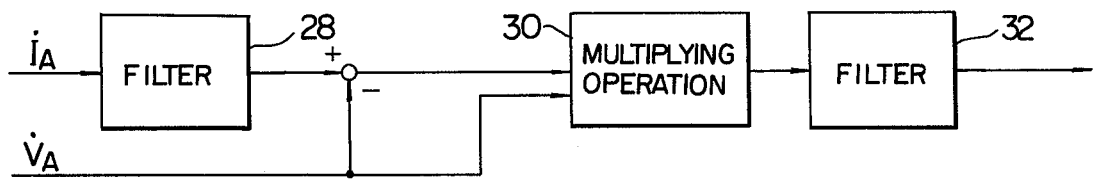
FIG. 5 is a block diagram showing the mho relay element.

An embodiment for this process by the computer is shown in the flowchart of FIG. 5. The input data concerning the voltage and current of the power transmission system is sampled at predetermined intervals by the P I/O unit 16, so that the sampled values $i_A(t)$ and $v_A(t)$ taking the form of digital values converted from the input data are applied to the computer 18. Here, $i_A(t)$ and $v_A(t)$ respectively show the sampled values of current and voltage at time point $t$. A first filter 28 in FIG. 5 is for a purpose to obtain the characteristics angle $\alpha$ and the value $I_A Z_0$ in FIG. 4. On the basis of the inputs $v_A(t)$ and $i_A(t)$ introduced into the computer 18 and the setting impedance $Z_0$, $Z_0 I_A - V_A$ is composed by operation. Device 30 is for multiplying the composed value $Z_0 I_A - V_A$ by $V_A$. The output of the device 30, which is a DC component plus a second harmonic if the input data includes only the fundamental wave component, is integrated for a certain period of time (say, for half a cycle) to eliminate the second harmonic component by a second filter 32. Thus, the output of the second filter 32 is given as $$\{Z_0 I_A - V_A\} V_A = \frac{1}{2} \{I_A Z_{FL1} Z_0 \cos(\alpha - \theta_1) - I_A^2 Z_{FL1}^2\}, \tag{2}$$

where $I_A$, $V_A$ and $Z_0$ are maximum values of vectors $\dot{I}_A$, $\dot{V}_A$ and $\dot{Z}_0$ respectively, and $$\dot{Z}_{FL1} = \frac{\dot{V}_A}{\dot{I}_A},$$

and $\alpha$ and $\theta_1$ are impedance angles of $\dot{Z}_0$ and $\dot{Z}_{FL1}$ respectively.

Thus, if such a configuration is provided as to determine the occurrence of a fault by the inequality $$I_A^2 Z_{FL1} Z_0 \cos(\alpha - \theta_1) - I_A^2 Z_{FL1}^2 < 0, \tag{3}$$

it is obvious that a mho relay element with such a phase characteristic is obtained as to satisfy the relation $$Z_{FL1} > Z_0 \cos(\alpha - \theta_1). \tag{4}$$

Figure 6:
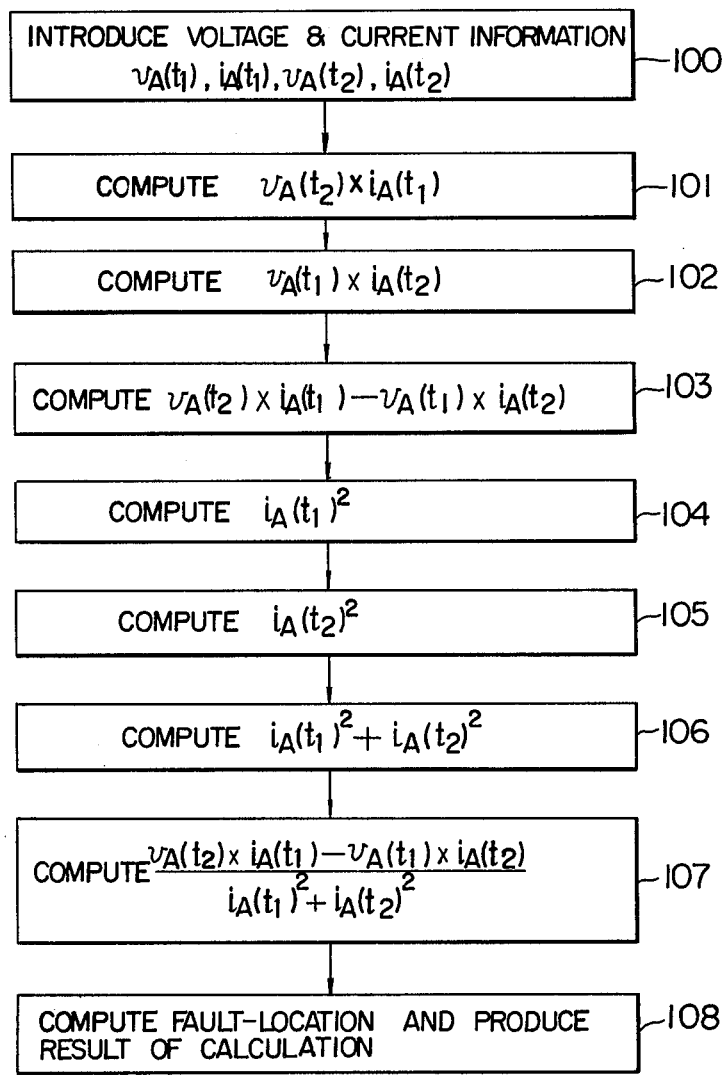
FIG. 6 is a flowchart of an example of processes for fault-location calculation.

Now, explanation will be made how a fault is detected by the mho relay element and the calculation of the fault-location, namely, the distance from the system installation point to the fault point is effected upon the completion of changing-over from closed to open state of the circuit breaker 26. In this process, the sampled values $v_A(t)$ and $i_A(t)$ of the voltage and current at terminal A at time point $t$ are expressed as $$v_A(t) = V_A \sin(\omega t)$$

$$i_A(t) = I_A \sin(\omega t + \theta_1) \tag{5}$$

where $\omega$ is an angular frequency. On the basis of these equations, the reactance component $X_{FL1}$ of $\dot{Z}_{FL1}$ is obtained from the equation below. Since the line substantially consists of only a reactance component, the distance to the fault-location is considered almost proportional to $X_{FL1}$, which has so far provided the conventional basis for calculation of a fault-location.

$$\begin{aligned} X_{FL1} &= \frac{V_A}{I_A} \sin \theta_1 \\ &= \frac{V_A I_A}{I_A^2} \sin \theta_1 \\ &= \frac{v_A(t_2) i_A(t_1) - v_A(t_1) i_A(t_2)}{i_A(t_1)^2 + i_A(t_2)^2} \end{aligned} \tag{6}$$

where $v_A(t_1)$ and $i_A(t_1)$ are sampled values of voltage and current respectively at time point $t_1$, $v_A(t_2)$ and $i_A(t_2)$ sampled values of voltage and current at time point $t_2$, and a sampling interval is determined in such a manner that $t_2 = t_1 + \pi/2\omega$, that is, $t_2$ is behind $t_1$ by $\pi/2\omega$. Also, $t_2$ is the time point immediately prior to the cut off of the circuit breaker 26. The processes of fault-location calculation effected at the time of changing-over of the circuit breaker from closed to open state in response to the fault detection by the mho relay element is shown in the flowchart of FIG. 6. The voltage and current data $v_A(t_1)$, $v_A(t_2)$, $i_A(t_1)$ and $i_A(t_2)$ are introduced at the block 100, $v_A(t_2)$ is multiplied by $i_A(t_1)$ at 101, $v_A(t_1)$ is multiplied by $i_A(t_2)$ at 102, the result of 102 is subtracted from that of 101 at 103, the squares of $i_A(t_1)$ and $i_A(t_2)$ are obtained at 104 and 105 respectively, the results of 104 and 105 are added to each other at 106, the result of 103 is divided by the result of 106 at 107, and the fault-location is computed based on the result of 107 and displayed at 108.

It will thus be seen that the calculating system according to the invention permits calculation of fault-location of any kind of fault in a shorter processing time, thereby greatly improving the protecting ability of the computer and the economy of the control device. Further, the relaying operation of fault occurrence detection and fault-location calculating operation are performed with such a high efficiency without wasteful time that a highly efficient digital fault-location calculation is made possible over a multiplicity of transmission lines of an especially large power transmission system.

The foregoing description is the discussion of problems primarily concerning the timing of introduction of data showing the conditions of the power transmission system for fault-location calculation. The calculation of fault-location by means of $X_{FL1}$, however, is accompanied by an error as a result of arc resistance at the time of the fault and power flow of the power transmission system. The discussion below refers to several conceivable methods and sources of data introduction for accurate calculation of fault-location without being affected by such factors.

Figure 7:
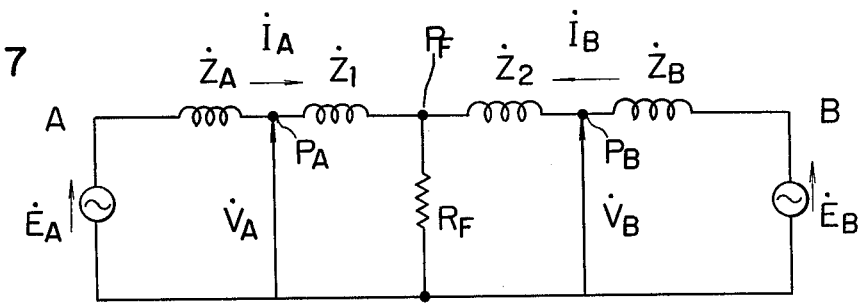
FIG. 7 is a diagram showing an equivalent circuit of a single-phase power transmission system in the presence of a fault.

First, discussion will be made of why the fault-location calculation is affected by power flow and arc resistance, with reference to FIGS. 7 and 8. An equivalent circuit of the power transmission line in the presence of a fault is shown in FIG. 7. In this drawing showing the power transmission line connecting two terminal points A and B, reference character $R_F$ shows a fault resistance including arc resistance at the fault-location point $P_F$, $\dot{V}_A$ and $\dot{V}_B$ voltages at measuring points $P_A$ and $P_B$ at terminals A and B respectively, $\dot{I}_A$ and $\dot{I}_B$ the current passing points $P_A$ and $P_B$ respectively, $\dot{Z}_1$ and $\dot{Z}_2$ impedances from points $P_A$ and $P_B$ to fault point $P_F$ respectively, $\dot{Z}_A$ and $\dot{Z}_B$ back impedances at terminals A and B respectively, and $\dot{E}_A$ and $\dot{E}_B$ source voltages at terminals A and B respectively.

The voltage and current are related to each other as follows:

$$\dot{V}_A = \dot{Z}_1 \dot{I}_A + R_F(\dot{I}_A + \dot{I}_B) \quad (7)$$

$$\dot{V}_B = \dot{Z}_2 \dot{I}_B + R_F(\dot{I}_A + \dot{I}_B). \quad (8)$$

The values of $\dot{Z}_1$ and $\dot{Z}_2$ cannot be obtained accurately from $(\dot{V}_A, \dot{I}_A)$ or $(\dot{V}_B, \dot{I}_B)$. This is for the reason that in detecting the impedance only at terminal A, for example, $R_F(1 + \dot{I}_B/\dot{I}_A)$ of the second term on the right side of the equation (9) below is introduced as an error since $\dot{Z}_{FL1}$ led from equation (7) and expressed below is assumed to be $\dot{Z}_1$.

$$Z_{FL1} = \frac{\dot{V}_A}{\dot{I}_A}$$

$$= \dot{Z}_1 + R_F(1 + \frac{\dot{I}_B}{\dot{I}_A}) \quad (9)$$

Figure 8:
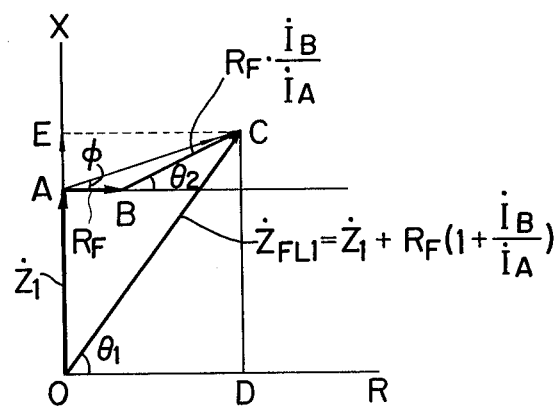
FIG. 8 is an impedance vector diagram in the presence of a fault.

A vector diagram showing the impedance at point $P_A$ of terminal A is shown in FIG. 8. In the drawing, since the line impedance is composed of a reactance component for the most part and the resistance component is negligibly small, the line impedance may be regarded as a pure reactance. Symbol $\overline{OA}$, $\overline{AB}$ and $\overline{BC}$ respectively represent $\dot{Z}_1$, $R_F$ and $R_F \dot{I}_B/\dot{I}_A$, so that $\overline{AC}$ represents $R_F + R_F \dot{I}_B/\dot{I}_A$ and hence $\overline{OC}$ indicates $\dot{Z}_{FL1} = \dot{V}_A/\dot{I}_A$. Thus, the use of impedance at terminal A alone causes a detection error due to the effect of current $\dot{I}_B$ at point $P_B$ and unknown fault-location resistance $R_F$. The error is caused for the reason that, in spite of detection of the pure reactance, the true value $\overline{OA}$ is undesirably detected as if it is $\overline{OE}$.

The conventional calculating systems in which a fault-location is calculated only by means of voltage and current information solely at the installation end A are all affected by the unknown value $R_F$ of fault-location resistance, back impedances $\dot{Z}_A$ and $\dot{Z}_B$ and power flow (phase difference between $\dot{V}_A$ and $\dot{V}_B$) and therefore are incapable of fault-location calculation with high accuracy.

Methods for data introduction to overcome such problems will be described below.

According to a first method, not only the power transmission system voltage and current information at the installation end A are introduced, but the power transmission system voltage and current information at the other end B are also obtained through a communication circuit. Further, the distance from the installation end A to a fault location point $P_F$ is calculated by vectorial operation of the power transmission system voltage and current data at the installation end A and the other end B.

Figure 9:
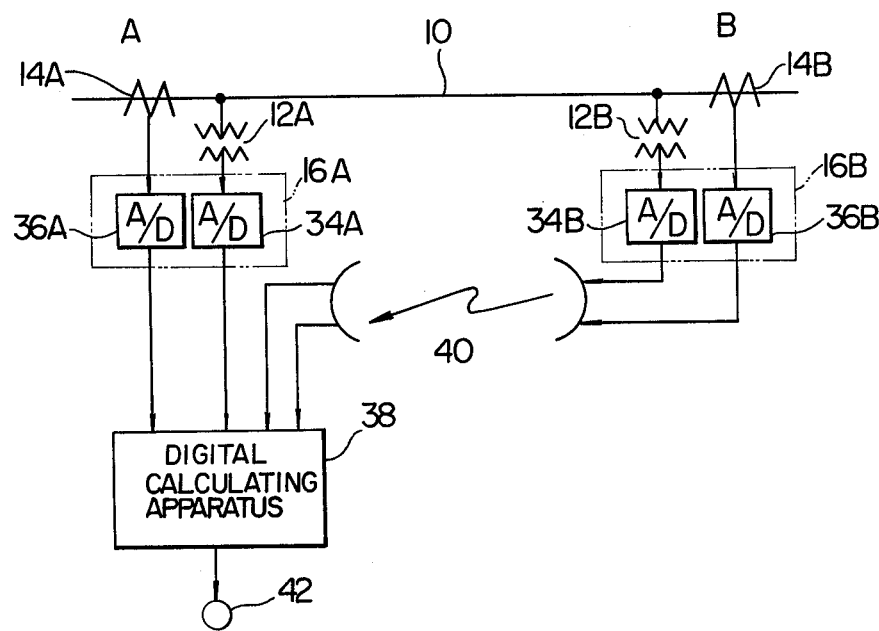
FIG. 9 is a schematic diagram showing an embodiment of the fault-location calculating system according to the invention.

An example of the fault-location calculating system according to the first method is shown in FIG. 9. This system is installed at terminal A of the single-phase power transmission system of FIG. 7. In FIG. 9, the voltage $\dot{V}_A$ and current $\dot{I}_A$ at terminal A are introduced by the potential transformer 12A and current transformer 14A respectively, converted into digital signals by the A/D converters 34A and 36A of the P I/O unit 16A, and applied to the digital calculating apparatus 38.

The voltage $\dot{V}_B$ and current $\dot{I}_B$ at the other terminal B of the power transmission line 10, on the other hand, are introduced by the potential transformer 12B and current transformer 14B, and after being converted into digital values by the A/D converters 34B and 36B of the P I/O unit 16B, they are properly modulated and transmitted to terminal A through a microwave circuit 40. At terminal A, these signals received via the microwave circuit 40 are demodulated and applied to the digital calculating apparatus 38.

If the impedance $\dot{Z}_T$ of the power transmission line 10, which is expressed by the equation (10) is known, the unknown values $R_F$ and $\dot{Z}_2$ are eliminated from equations (7), (8) and (10) thereby to obtain the equation (11).

$$\dot{Z}_T = \dot{Z}_1 + \dot{Z}_2 \quad (10)$$

$$\dot{Z}_1 = \frac{\dot{V}_A - \dot{V}_B + \dot{Z}_T \dot{I}_B}{\dot{I}_A + \dot{I}_B} \quad (11)$$

The digital calculating apparatus 38 in FIG. 9 is such that, on the basis of equation (11), the impedance $\dot{Z}_1$ up to the fault point $P_F$ is calculated from the voltage $\dot{V}_A$ and current $\dot{I}_A$ at terminal A and voltage $\dot{V}_B$ and $\dot{I}_B$ at terminal B, so that the distance up to the fault point is produced at an output terminal 42.

Figure 10:
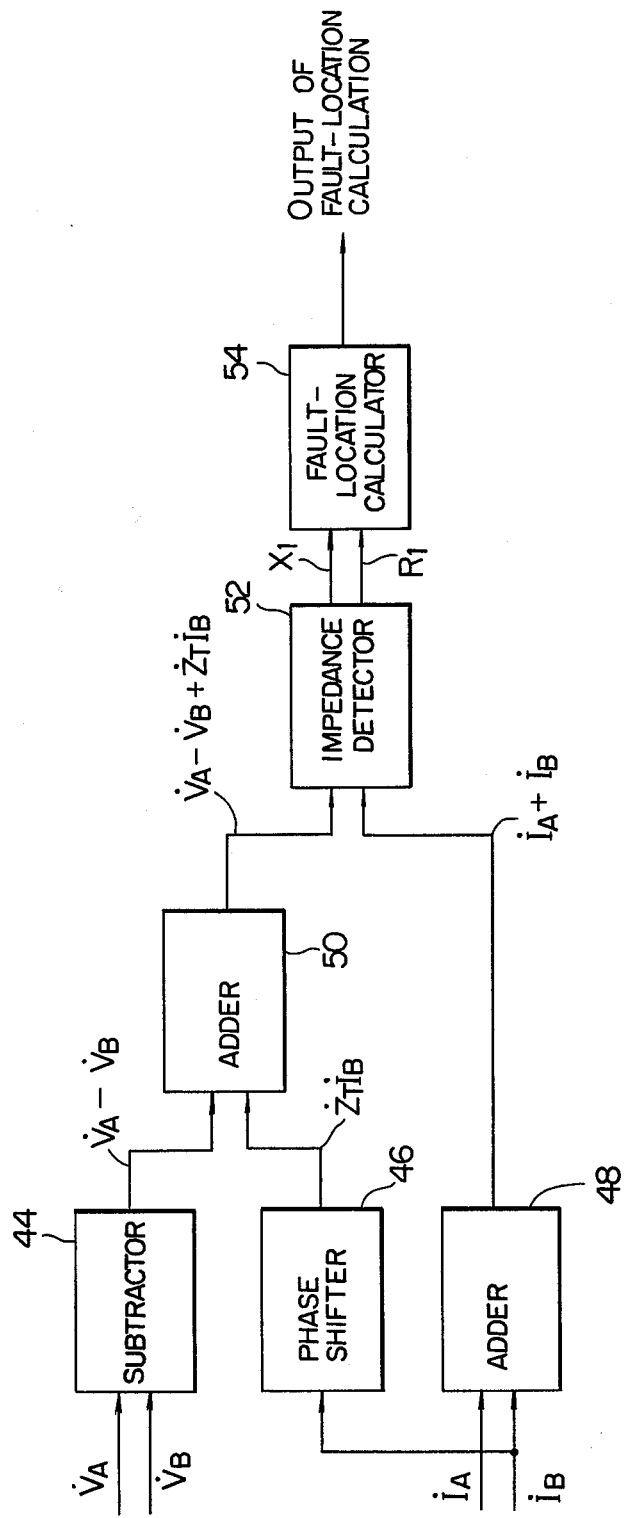
FIG. 10 is a block diagram showing an embodiment of the digital calculating device in FIG. 9.

An embodiment of the digital calculating apparatus 38 in FIG. 9 is shown in the block diagram of FIG. 10. In this drawing, the respective voltage information $\dot{V}_A$ and $\dot{V}_B$ at terminals A and B are input to a subtractor 44 thereby to produce the difference therebetween, i.e., $\dot{V}_A - \dot{V}_B$. The respective current information $\dot{I}_A$ and $\dot{I}_B$ at terminals A and B, on the other hand, are applied to an adder 48 thereby to produce the sum thereof, i.e., $\dot{I}_A + \dot{I}_B$. Further, the current information $\dot{I}_B$ at terminal B is applied to the phase shifter 46, thereby producing information corresponding to $\dot{Z}_T \dot{I}_B$. The outputs of the subtractor 44 and the phase shifter 46 are applied to an adder 50, which in turn produces information corresponding to the numerator of equation (11).

The respective outputs of the adders 50 and 48 are applied to an impedance detector 52. In response to the information corresponding to the numerator and denominator of equation (11), the impedance detector 52 produces the resistance portion $R_1$ and reactance portion $X_1$ of the impedance $\dot{Z}_1$ up to the fault point by vectorial division. A fault point distance calculator 54 is for calculating and producing the distance up to the fault point in response to the output of the impedance detector 52.

The fault-location calculation may be effected in the same way at terminal B. In other words, $R_F$ and $\dot{Z}_1$ are eliminated from equations (7), (8) and (10) thereby to obtain $$\dot{Z}_2 = \frac{\dot{V}_B - \dot{V}_A - \dot{Z}_T \dot{I}_A}{\dot{I}_A + \dot{I}_B} . \tag{12}$$

It is thus possible to calculate a fault-location at terminal B by using a digital calculating apparatus with quite the same configuration as that shown in FIG. 10.

Although the foregoing description refers to the single-phase power transmission system, the fault-location calculating system according to the invention may be applied to a poly-phase power transmission system with equal effect as well. For three phase power transmission system, for instance, the voltage and current of the equivalent circuit of FIG. 1 are replaced by the phase voltage and the difference in line current respectively, with the result that the equation (13) below showing the impedance up to the fault point short-circuiting between phases is given as $$\dot{Z}_1 = \frac{(\dot{V}_{Aa} - \dot{V}_{Ba}) + \dot{Z}_T(\dot{I}_{Ba} - \dot{I}_{Bb})}{(\dot{I}_{Aa} - \dot{I}_{Ab}) + (\dot{I}_{Ba} - \dot{I}_{Bb})} \tag{13}$$

where $\dot{V}_{Aa}$ and $\dot{V}_{Ba}$ are voltages of phase $a$ at terminals A and B respectively, $\dot{I}_{Aa}$ and $\dot{I}_{Ba}$ currents of phase $a$ at terminals A and B respectively, $\dot{I}_{Ab}$ and $\dot{I}_{Bb}$ the currents of phase $b$ at terminals A and B respectively, and $\dot{Z}_1$ the impedance up to the fault point from terminal A. Equation (13) is used for calculation of distance in the case of short-circuiting between phases $a$ and $b$ or among phases $a$, $b$ and $c$. In similar fashion, for the distance calculation in the presence of short-circuiting incident between phases $b$ and $c$ or $c$ and $a$, the characters $a$ and $b$ in the equation (13) are replaced by $b$ and $c$, or by $c$ and $a$ respectively.

Figure 11:
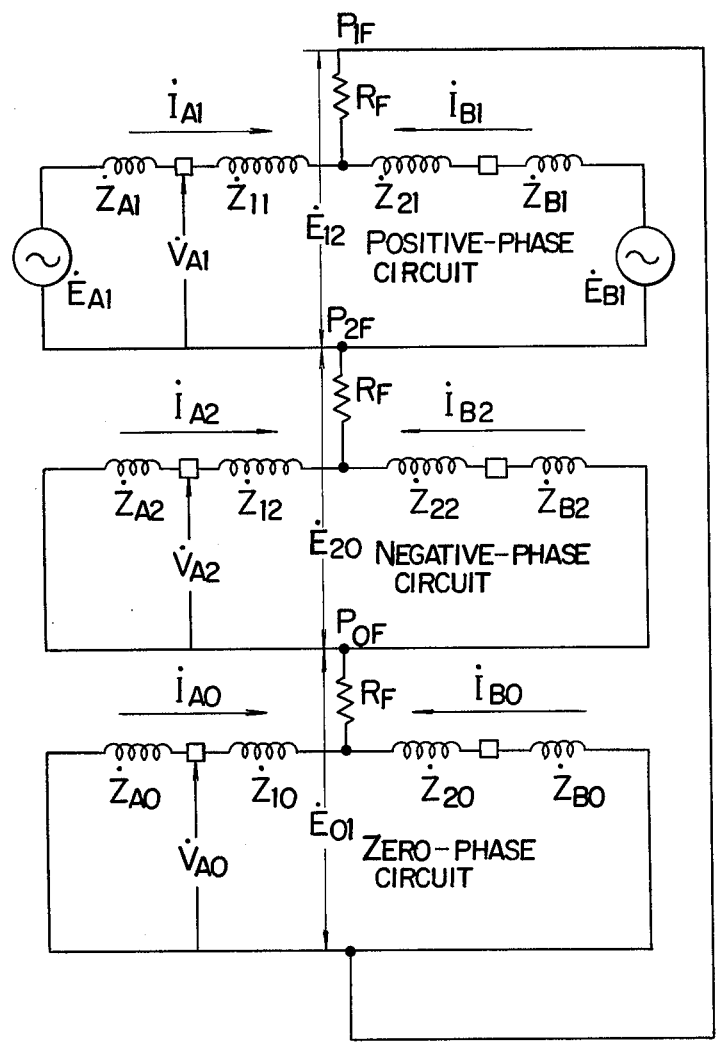
FIG. 11 shows an equivalent circuit of a three-phase power transmission system in the presence of a fault.

An equivalent circuit in the case of one line grounded fault is shown in FIG. 11. In this drawing, symbols $\dot{E}_{A1}$, $\dot{E}_{A2}$ and $\dot{E}_{A0}$ show source voltages of positive, negative and zero phase sequences respectively at the installation end; $\dot{E}_{B1}$, $\dot{E}_{B2}$ and $\dot{E}_{B0}$ source voltages at positive, negative and zero phase sequences respectively at terminal B; $\dot{Z}_{11}$, $\dot{Z}_{12}$ and $\dot{Z}_{10}$ line impedances of positive, negative and zero phase sequences respectively from terminal A to a fault-location point; $\dot{Z}_{21}$, $\dot{Z}_{22}$ and $\dot{Z}_{20}$ the line impedances at positive, negative and zero phase sequences respectively from terminal B to a fault location point; $\dot{Z}_{A1}$, $\dot{Z}_{A2}$ and $\dot{Z}_{A0}$ the back impedances at positive, negative and zero phase sequences respectively at terminal A; $\dot{Z}_{B1}$, $\dot{Z}_{B2}$ and $\dot{Z}_{B0}$ back impedances at positive, negative and zero phase sequences respectively at terminal B; and $R_F$ the resistance at grounding fault points $P_{1F}$, $P_{2F}$ and $P_{0F}$.

Under this condition, the voltages $\dot{V}_{A1}$, $\dot{V}_{A2}$ and $\dot{V}_{A0}$ at terminal A are expressed as $$\dot{V}_{A1} = \dot{Z}_{11}\dot{I}_{A1} + R_F(\dot{I}_{A1} + \dot{I}_{B1}) + \dot{E}_{12} \tag{14}$$

$$\dot{V}_{A2} = \dot{Z}_{12}\dot{I}_{A2} + R_F(\dot{I}_{A2} + \dot{I}_{B2}) + \dot{E}_{20} \tag{15}$$

$$\dot{V}_{A0} = \dot{Z}_{10}\dot{I}_{A0} + R_F(\dot{I}_{A0} + \dot{I}_{B0}) + \dot{E}_{01}, \tag{16}$$

where $\dot{E}_{12}$, $\dot{E}_{20}$ and $\dot{E}_{01}$ are voltages between fault locations $P_{1F}$ and $P_{2F}$, between $P_{2F}$ and $P_{0F}$, and between $P_{0F}$ and $P_{1F}$ respectively, and $$\dot{E}_{12} + \dot{E}_{20} + \dot{E}_{01} = 0. \tag{17}$$

Therefore, if $\dot{Z}_{11}$ is equal to $\dot{Z}_{12}$, from equations (14) to (17), $$\begin{aligned}
\dot{V}_{Aa} &= \dot{V}_{A1} + \dot{V}_{A2} + \dot{V}_{A0} \\
&= \dot{Z}_{11}\dot{I}_{A1} + \dot{Z}_{11}\dot{I}_{A2} + \dot{Z}_{10}\dot{I}_{A0} + R_F(\dot{I}_{Aa} + \dot{I}_{Ba}) \\
&= \dot{Z}_{11}\dot{I}_{Aa} + (\dot{Z}_{10} - \dot{Z}_{11})\dot{I}_{A0} + R_F(\dot{I}_{Aa} + \dot{I}_{Ba}),
\end{aligned} \tag{18}$$

where $$\left. \begin{aligned} \dot{I}_{Aa} &= \dot{I}_{A1} + \dot{I}_{A2} + \dot{I}_{A0} \\ \dot{I}_{Ba} &= \dot{I}_{B1} + \dot{I}_{B2} + \dot{I}_{B0} \end{aligned} \right\} \tag{19}$$

Thus, by dividing equation (18) by $\dot{I}_{Aa}$, equation (20) below is introduced.

$$\frac{\dot{V}_{Aa}}{\dot{I}_{Aa}} = \dot{Z}_{11} + (\dot{Z}_{10} - \dot{Z}_{11})\frac{\dot{I}_{A0}}{\dot{I}_{Aa}} + R_F(1 + \frac{\dot{I}_{Ba}}{\dot{I}_{Aa}}). \tag{20}$$

The impedance $\dot{V}_{Aa}/\dot{I}_{Aa}$ may be calculated only from the information obtained at the installation end A and is assumed to be $\dot{Z}_{11}$. Then, an error expressed by the second and third terms in equation (20) occurs.

Assuming that $\dot{Z}_{11} = \dot{Z}_{12}$, $\dot{Z}_{21} = \dot{Z}_{22}$, $\dot{Z}_{10} = 3\dot{Z}_{11}$, $\dot{Z}_{20} = 3\dot{Z}_{21}$, and $\dot{Z}_{T1} = \dot{Z}_{11} + \dot{Z}_{21}$, $$\dot{Z}_{11} = \frac{\dot{V}_{Aa} - \dot{V}_{Ba} + \dot{Z}_{T1}(\dot{I}_{Ba} + 2\dot{I}_{B0})}{\dot{I}_{Aa} + \dot{I}_{Ba} + 2(\dot{I}_{A0} + \dot{I}_{B0})} . \tag{21}$$

As a consequence, by using the equation (21), the distance up to the fault point of one line grounded fault can be calculated accurately.

Figure 12:
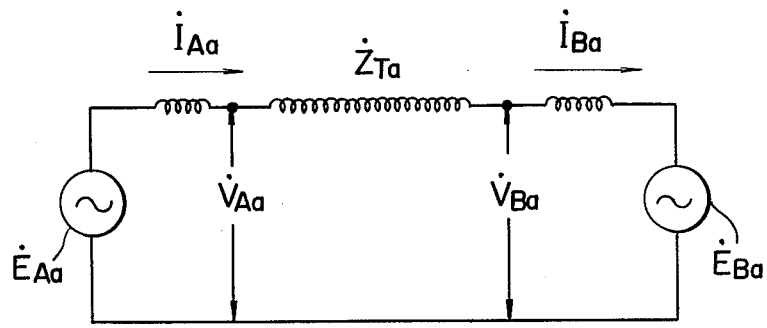
FIG. 12 shows an equivalent circuit of the positive-phase-sequence of a three-phase power transmission system under normal conditions.

As a modification of this first method, the voltage information out of the information at the other end B may be estimated by calculation from the power flow immediately before the occurrence of a fault. The diagram of FIG. 12 shows an equivalent circuit of the positive-phase-sequence of a normal three-phase power transmission system. Since $\dot{I}_{Ba} = \dot{I}_{Aa}$, the voltage $\dot{V}_{Ba}$ at terminal B is given as $$\dot{V}_{Ba} = \dot{V}_{Aa} - \dot{Z}_{Ta}\dot{I}_{Aa}. \tag{22}$$

By estimating the voltage at the other end by the use of this equation (22), another embodiment of the invention may be realized in which the fault-location is calculated from the voltage and current at the installation end A and the current at the other end B. In other words, it will be easily understood from FIG. 9 that only current data at the other end B may be introduced into the digital calculating apparatus 38 at the installation end A through the current transformer 14B, the A/D converter 36B of the P I/O unit 16B and the microwave circuit 40.

Further, in the event that only one of two parallel lines in such a case as a superhigh power transmission system, in which two parallel lines are used generally instead of a single line, is subjected to a fault, the voltage at the other end B may be estimated from the other normal line according to equation (22).

It will be obvious from the foregoing description that, according to this method, the fault-location may be calculated with high accuracy without being affected by the fault-location resistance, power flow or back impedance, unlike the conventional systems for calculating a fault-location from the voltage and current information only at the installation end A. Apart from the above-mentioned embodiments which all involve digital calculation, embodiments of the invention are easily realized also by analog methods as evident from the block diagram of FIG. 10. Further, in the case of a digital system, a control digital computer may be used for performing the various processes in FIG. 10 according to a program, in which case the digital calculating apparatus 38 makes up the digital computer 18 shown in FIG. 1.

A second method will be discussed. By this method, the respective distances up to a fault point from the installation end A and the other end B are calculated at both the installation end A and the other end B of a power transmission line, and further the result of calculation at the installation end A is corrected on the basis of the calculation result at the other end B.

In equation (9), the impedance $\dot{Z}_1$ exactly proportional to the distance may be obtained if data on the current $\dot{I}_B$ at the other end B is introduced to the installation end A. For this purpose, however, the delay occurring in transmission of the current information at the other end B on the power transmission line must be compensated for. Provision of this compensating ability only for calculation of a fault-location is uneconomical. For this reason, the distance up to the fault point and the magnitude of current are first calculated at both ends of the power transmission line as mentioned above, so that these pieces of information are transmitted through a transferring network thereby to obtain the distance of the fault-location accurately.

Fault-location calculating systems are installed at both ends of the power transmission line. As in equation (9), the impedances $\dot{Z}_{FL1}$ and $\dot{Z}_{FL2}$ as viewed from the fault-location calculating systems at the installation end A and the other end B respectively are expressed as $$\left.\begin{aligned}\dot{Z}_{FL1} &= \dot{Z}_1 + R_F(1 + \frac{\dot{I}_B}{\dot{I}_A}) \\ \dot{Z}_{FL2} &= \dot{Z}_2 + R_F(1 + \frac{\dot{I}_A}{\dot{I}_B})\end{aligned}\right\} \quad (23)$$

Also, the total impedance $\dot{Z}_T$ of the power transmission line is given, as in equation (10), as $$\dot{Z}_T = \dot{Z}_1 + \dot{Z}_2. \quad (24)$$

From equations (10) and (23), the reactance component $X_1$ of $Z_1$ is $$X_1 = \frac{X_{FL2} - X_T + X_{FL1}/k^2}{\frac{1}{k^2} - 1}, \quad (25)$$

where $X_{FL1}$, $X_{FL2}$, and $X_T$ are reactance components of $\dot{Z}_{FL1}$, $\dot{Z}_{FL2}$ and $\dot{Z}_T$ respectively, and $k$ the ratio between the current $\dot{I}_A$ at the installation end A and the current $\dot{I}_B$ at the other end B.

It is clear from equation (25) that in order to obtain the reactance $X_1$ up to the fault point accurately, calculation at the installation end A is not sufficient, but $X_{FL2}$ and $k^2$ must be provided. The value $k$, which is the ratio $\dot{I}_B/\dot{I}_A$ between the respective currents at the installation end A and the other end B, may be calculated if the magnitude of current at the other end B is known.

The present invention, therefore, is intended to detect a fault-location accurately by introducing the data on both ends A and B as mentioned above.

A method for calculating $\dot{Z}_{FL1}$ and $\dot{Z}_{FL2}$ on the basis of voltage and current information sampled at regular intervals of time will be explained in detail below.

If the voltage and current information obtained at the installation end point $P_A$ at time point $t$ is given as in equation (5) as $$\left.\begin{aligned}v_A(t) &= V_A \sin(\omega t) \\ i_A(t) &= I_A \sin(\omega t + \theta_1),\end{aligned}\right\} \quad (26)$$

the voltage and current information at the installation terminal A sampled at time $t_1$ are given as $$\left.\begin{aligned}v_A(t_1) &= V_A \sin(\omega t_1) \\ i_A(t_1) &= I_A \sin(\omega t_1 + \theta_1).\end{aligned}\right\} \quad (27)$$

The voltage and current information sampled at time point $t_2$ which is $\pi/2\omega$ later than $t_1$ are by contrast expressed as $$\left.\begin{aligned}v_A(t_2) &= V_A \cos(\omega t_1) \\ i_A(t_2) &= I_A \cos(\omega t_1 + \theta_1).\end{aligned}\right\} \quad (28)$$

From this information, the impedance $\dot{Z}_{FL1}$ calculated by the calculating system at the installation end A, which comprises the resistance component $R_{FL1}$ and the reactance component $X_{FL1}$, is given as $$\begin{aligned}\dot{Z}_{FL1} &= R_{FL1} + jX_{FL1} \\ &= \frac{V_A}{I_A}(\cos\theta_1 + j\sin\theta_1) \\ &= \frac{V_A I_A \cos\theta_1}{I_A^2} + j\frac{V_A I_A \sin\theta_1}{I_A^2} \\ &= \frac{v_A(t_1)i_A(t_1) + v_A(t_2)i_A(t_2)}{i_A(t_1)^2 + i_A(t_2)^2} \\ &\quad + j\frac{v_A(t_1)i_A(t_2) - v_A(t_2)i_A(t_1)}{i_A(t_1)^2 + i_A(t_2)^2}.\end{aligned} \quad (29)$$

Next, assume that the voltage and current information at the other end B is $$\left.\begin{aligned}v_B(t) &= V_B \sin(\omega t) \\ i_B(t) &= I_B \sin(\omega t + S_1).\end{aligned}\right\} \quad (30)$$

Then, as in equations (27) and (28), the information sampled at time point $t_1$ and time $t_2$ which is $\pi/2\omega$ later than $t_1$ is expressed respectively below.

$$\left.\begin{array}{l} v_B(t_1) = V_B \sin \omega t_1 \\ i_B(t_1) = I_B \sin(\omega t_1 + \delta_1) \\ v_B(t_2) = V_B \cos \omega t_1 \\ i_B(t_2) = I_B \cos(\omega t_1 + \delta_1) \end{array}\right\} \quad (31)$$

The impedance $\dot{Z}_{FL2}$ calculated by the calculating system at the other end B, which comprises the resistance component $R_{FL2}$ and reactance component $X_{FL2}$, is given as $$\begin{aligned} \dot{Z}_{FL2} &= R_{FL2} + jX_{FL2} \\ &= \frac{v_B(t_1)i_B(t_1) + v_B(t_2)i_B(t_2)}{i_B(t_1)^2 + i_B(t_2)^2} \\ &+ j\frac{v_B(t_1)i_B(t_2) - v_B(t_2)i_B(t_1)}{i_B(t_1)^2 + i_B(t_2)^2}. \end{aligned} \quad (32)$$

After thus producing data from the calculations at both ends, the calculation for accurate determination of reactance $X_1$ is carried out as described below. First, assume that $k^2$ in equation (25) is given as $$k^2 = \frac{i_B(t_1)^2 + i_B(t_2)^2}{i_A(t_1)^2 + i_A(t_2)^2}. \quad (33)$$

The method for obtaining $X_1$ from equations (29), (32), (33) and (25) will be explained below.

Figure 18:
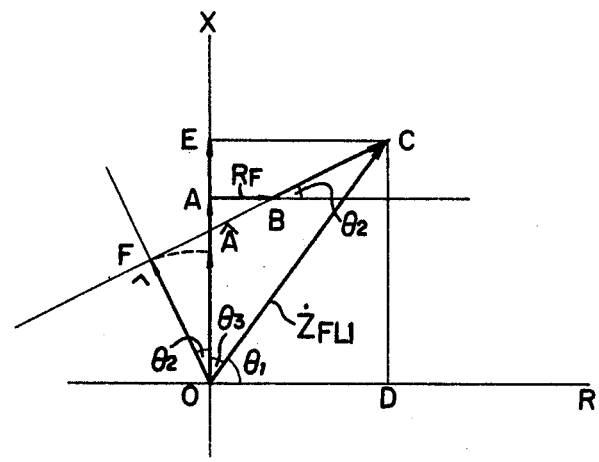
FIG. 18 is an impedance vector diagram for explaining the operation of a further embodiment of the invention.

The relation between equation (29) and FIG. 18 is $$\left.\begin{array}{l} R_{FL1} = R_F(1 + k \cos \theta_2), \\ X_{FL1} = X_1 + k R_F \sin \theta_2. \end{array}\right\} \quad (34)$$

On the other hand, the relation between equation (32) and the vector diagram of the impedance as viewed from the calculating system at the other end B is given as $$\left.\begin{array}{l} R_{FL2} = R_F(1 + \frac{1}{k} \cos \theta_2) \\ X_{FL2} = X_2 + \frac{1}{k} R_F \sin \theta_2. \end{array}\right\} \quad (35)$$

The relation $X_T = X_1 + X_2$ is substituted into equations (34) and (35) and thus $R_F$, $\sin \theta_2$ and $\cos \theta_2$ are removed, leading to equation (25).

Figure 13:
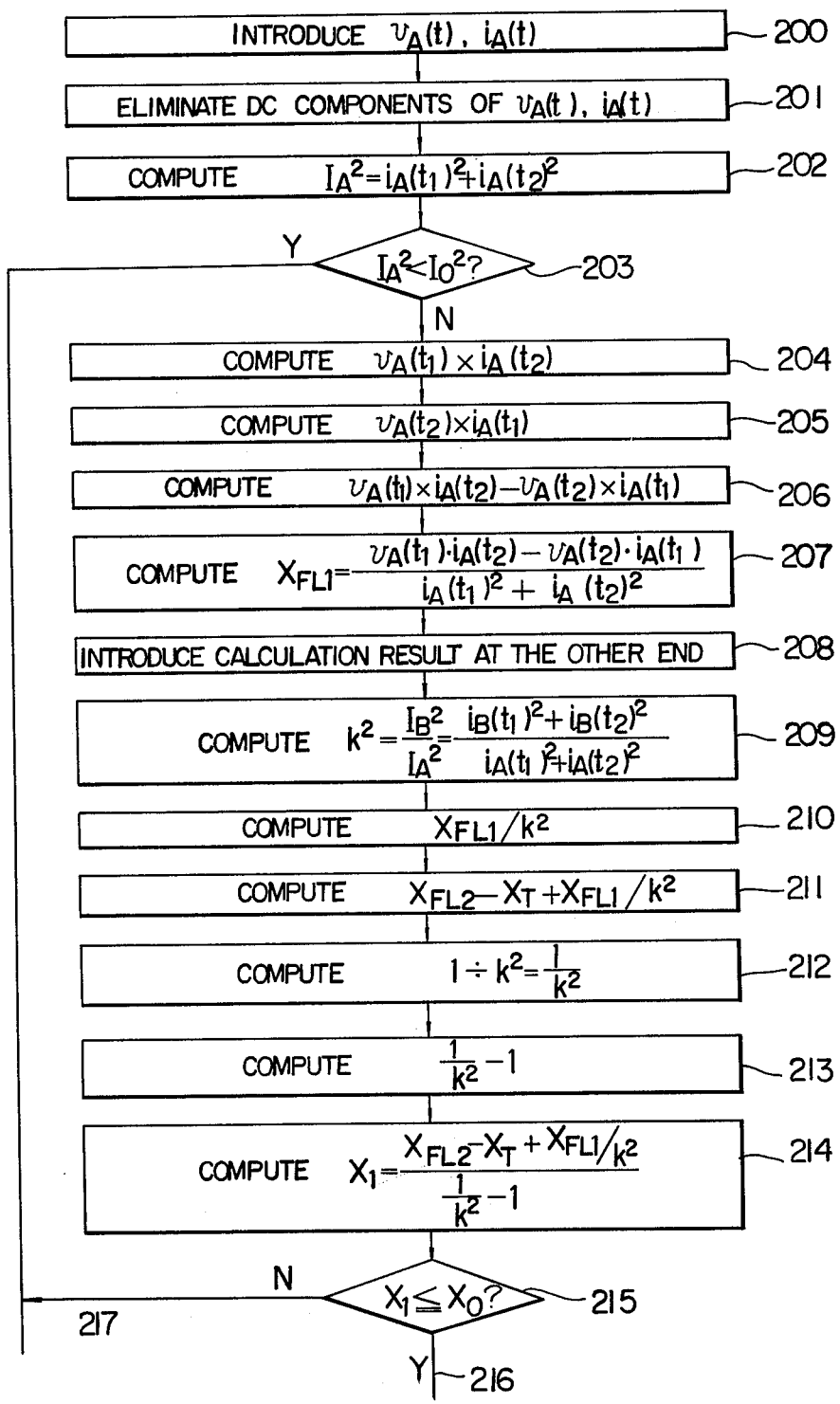
FIG. 13 is a flowchart of another example of processes for fault-location calculation.

The process flowchart for this operation is shown in FIG. 13. Voltage and current information are introduced at block 200, the DC components of voltage and current information are removed at block 201, and the square of maximum current value $I_A^2$ is calculated from the sum of the square of the sampled value of current at present and the square of the sampled value of the current ¼ cycle before. At block 203, $I_A^2$ is compared with the square of the constant value $I_0$, and if $I_A^2$ is smaller than $I_0^2$, the power transmission system is considered sound and the process for the next phase is conducted at 217. When $I_A^2$ is larger than $I_0^2$, on the other hand, the current $i_A(t_2)$ obtained at present time point $t_2$ is multiplied by the voltage $v_A(t_1)$ obtained at time point $t_1$ prior to time point $t_2$ by ¼ cycle, at block 204; the voltage $v_A(t_2)$ obtained at the instant time point $t_2$ is multiplied by the current $i_A(t_1)$ obtained at time point $t_1$ prior to time point $t_2$ by ¼ cycle, at block 205; the result of 205 is subtracted from that of 204 at 206; and the result of 206 is divided by that of 202 at 207. $X_{FL2}$ and $I_B^2$ are also calculated in similar manner at the other end B, the result of which is introduced at the block 208 to installation end A, followed by dividing $I_B^2$ by the result of 202 at 209, dividing the result of 207 by that of 209 at 210. Also, $X_T$ is subtracted from $X_{FL2}$ and the result of 210 is added thereto at 211; 1 is divided by the result of 210 at 212; 1 is subtracted from the result of 212 at 213; and the result of 211 is divided by that of 213 at 214. At block 215, the result $X_1$ of 214 is compared with a constant value $X_0$, and if $X_1$ is smaller than the constant value $X_0$, it shows the fault-location exists within the range of fault-location calculation and therefore the distance to the fault point is computed and displayed at 216. When the result of 215 shows $X_1$ is higher than the constant value $X_0$, it indicates outside of the range of fault-calculation, so that the process for another phase is conducted at 217.

As explained above, the second method makes possible accurate fault-location calculation by elimination of an error attributable to arc resistance, overcoming the disadvantages of the conventional calculating systems. Further, the fact that the fault-location is calculated from the sampled values of voltage and current prevents reduction in accuracy due to phase difference between voltage and current, unlike the prior art systems.

The foregoing description refers to an example in which fault-location calculation is started in response to an excess current element. If it is to be started by a deficiency voltage element, on the other hand, instead of producing $I_A^2$ at 202 in FIG. 13, the square of maximum voltage value $V_A$ is obtained by equation (36) below and compared with the square of a constant value $V_0$ at 203.

$$V_A^2 = v_A(t_1)^2 + v_A(t_2)^2 \quad (36)$$

When $V_A^2$ is lower than $V_0^2$, the processes subsequent to 204 inclusive may be followed.

Now, a third method will be described. According to this method, the power transmission system voltage and current information at the installation end A and the power transmission system current information at the other end B are introduced at the same time point, while the power transmission system impedance at the installation end A is corrected by the respective current information at the installation end A and the other end B, thereby calculating the distance up to the fault point by determining the line impedance from the installation end A to the fault location point $P_F$.

The principle and embodiments of this method will be described in detail below with reference to drawings.

In FIG. 8, $\overline{OC}$ shows the impedance $\dot{Z}_{FL1}$ at terminal A, as expressed below.

$$\dot{Z}_{FL1} = \frac{V_A}{\dot{I}_A} = Z_{FL1} e^{j\theta_1} \quad (37)$$

where $\theta_1$ is the phase difference angle between the voltage $V_A$ at terminal A and the current $\dot{I}_A$ at the same terminal, and $\overline{AB}$ the fault-location resistance $R_F$, $\overline{BC}$ shows $$R_F \frac{\dot{I}_B}{\dot{I}_A} = R_F \frac{I_B}{I_A} e^{j\theta_2} \tag{38}$$

where $\theta_2$ is the phase difference between the currents $\dot{I}_A$ and $\dot{I}_B$ at terminals A and B respectively.

Since the line impedance is substantially made up of reactance components, it may be considered as a pure reactance for practical purposes. Referring again to FIG. 8, the line impedance from terminal A to the fault location $$\dot{Z}_1 = jX_1 \tag{39}$$

is expressed as $\overline{OA}$, where $$|\overline{OE}| = |\overline{OC}| \sin \theta_1 = Z_{FL1} \sin \theta_1 \tag{40}$$

$$|\overline{EA}| = |\overline{OD}| \tan \phi \tag{41}$$

$$|\overline{OD}| = |\overline{OC}| \cos \theta_1 = Z_{FL1} \cos \theta_1 \tag{42}$$

$$|\overline{OA}| = |\overline{OE}| - |\overline{AE}|. \tag{43}$$

The line reactance $X_1$ up to the fault point from the installation end A, therefore, may be given as $$X_1 = Z_{FL1} (\sin \theta_1 - \cos \theta_1 \tan \phi). \tag{44}$$

In equation (44), $Z_{FL1}$ and $\theta_1$ are obtained from the power transmission system voltage and current information at the installation ends, while $\tan \phi$ is produced from the respective current information at the installation end A and the other end B, as shown below.

$$\tan \phi = \frac{I_B \sin \theta_2}{I_A + I_B \cos \theta_2} \tag{45}$$

From equations (44) and (45), the reactance $X_1$ up to the fault point from the installation end A is obtainable accurately regardless of the fault-location resistance $R_F$ or phase difference between terminals A and B. In other words, the power transmission system impedance $Z_{FL1}\sin \theta_1$ obtained from the voltage and current information at the installation end A may be corrected by subtracting the correction value $Z_{FL1}\cos \theta_1\tan \phi$ therefrom, on the basis of the respective current information at the installation end A and the other end B, with the result that the effect of the fault-location resistance and power flow is compensated for thereby to calculate the line reactance $X_1$ up to the fault location point accurately.

The third method may be realized by the configuration of FIG. 9. In this case the digital fault-location calculating apparatus 38 of FIG. 9 may includes such a configuration as shown in FIG. 14. In FIG. 14, the voltage $v_A(t)$ and current $i_A(t)$ at terminal A and the current information $i_B(t)$ at terminal B as shown below are sampled at the intervals of $\pi/2$(rad), and after being digitally converted, applied as an input to the calculation apparatus 38.

$$v_A(t) = V_A \sin(\omega t) \tag{46}$$

$$i_A(t) = I_A \sin(\omega t + \theta_1) \tag{47}$$

$$i_B(t) = I_B \sin(\omega t + \theta_1 + \theta_2) \tag{48}$$

The DC component of each information may be eliminated by filters 56, 58, and 60 by finding remainder between the respective sampled values at a certain previous time and the present time. The respective current information at terminals A and B are applied to an adder 62 for producing the sum thereof, so that the current expressed by equation (49) below is produced.

$$i_C(t) = i_A(t) + i_B(t) = I_C \sin(\omega t + \phi) \tag{49}$$

The information $v_A(t)$, $i_A(t)$ and $i_C(t)$ are temporarily stored in memories 64, 66 and 68 for the period corresponding to one sampling, which memories respectively produce sampled values as of one sampling period before. Assume that the sampled values at present, i.e., time point $t_2$ are $v_A(t_2)$, $i_A(t_2)$ and $i_C(t_2)$ and those at time point $t_1$ which is earlier than $t_2$ by one sampling period, i.e., $\pi/2$(rad) are $v_A(t_1)$, $i_A(t_1)$ and $i_C(t_1)$. As in equations (27) and (28), those values may be expressed as follows:

$$\left. \begin{array}{l} v_A(t_1) = V_A \sin(\omega t_1) \\ v_A(t_2) = V_A \cos(\omega t_1) \end{array} \right\} \tag{50}$$

$$\left. \begin{array}{l} i_A(t_1) = I_A \sin(\omega t_1 + \theta_1) \\ i_A(t_2) = I_A \cos(\omega t_1 + \theta_1) \end{array} \right\} \tag{51}$$

$$\left. \begin{array}{l} i_C(t_1) = I_A \sin(\omega t_1 + \phi) \\ i_C(t_2) = I_A \cos(\omega t_1 + \phi) \end{array} \right\} \tag{52}$$

A first operating section 70 receives $v_A(t_1)$, $v_A(t_2)$, $i_A(t_1)$ and $i_A(t_2)$ and produces the operation result $V_A I_A \sin \theta_1$ according to equation (53).

$$\begin{aligned} v_A(t_1)i_A(t_2) - v_A(t_2)i_A(t_1) &= V_A I_A \sin(\omega t_1)\cos(\omega t_1 + \theta_1) \\ - V_A I_A \cos(\omega t_1)\sin(\omega t_1 + \theta_1) &= V_A I_A \sin \theta_1 \end{aligned} \tag{53}$$

Similarly, second to fifth operating sections 72, 74, 76 and 78 calculate and produce $V_A I_A \cos \theta_1$, $I_A^2$, $I_C I_A \sin \phi$ and $I_C I_A \cos \phi$ in accordance with the equations (54), (55), (56) and (57) below respectively.

$$v_A(t_1)i_A(t_1) + v_A(t_2)i_A(t_2) = V_A I_A \cos \theta_1 \tag{54}$$

$$i_A(t_1)^2 + i_A(t_2)^2 = I_A^2 \tag{55}$$

$$i_C(t_1)i_A(t_2) - i_C(t_2)i_A(t_1) = I_{CIA} \sin \phi \tag{56}$$

$$i_C(t_1)i_A(t_1) + i_C(t_2)i_A(t_2) = I_C I_A \cos \phi \tag{57}$$

The result of the fourth operating section 76 is divided by the result of the fifth operating section 78 by a divider 80; the result of the second operating section 72 is multiplied by the result of the divider 80 by a multiplier 82; and further the difference between the results of the first operating section 70 and the multiplier 81 is calculated by a subtractor 84. As a result, the subtractor 84 produces an output as expressed below.

$$\begin{aligned} P &= V_A I_A \sin \theta_1 - V_A I_A \cos \theta_1 \frac{I_C I_A \sin \phi}{I_C I_A \cos \phi} \\ &= V_A I_A (\sin \theta_1 - \cos \theta_1 \cdot \tan \phi) \\ &= Z_{FL1} I_A^2 (\sin \theta_1 - \cos \theta_1 \cdot \tan \phi) \\ &= X_1 I_A^2 \end{aligned} \tag{58}$$

The output of the subtractor 84 is divided by the result $I_A^2$ of the third operating section 74 by a divider 86, which produces the line reactance $X_1$ up to the fault-location from the installation end A.

The result $I_A^2$ of the third operating section 74, on the other hand, is compared with the reference value $I_0^2$ by a comparator 90, and when $I_A^2$ exceeds $I_0^2$, a logic 1 signal is produced indicating the occurrence of a fault. Further, the output $X_1$ of the divider 86 is compared with the reference value $X_0$ by a comparator 88, so that when $X_1$ is lower than $X_0$, a logic 1 signal is produced indicating the occurrence of a fault within the calculation range. The outputs of the comparators 88 and 90 are applied to an AND gate 92 for detecting a logic product thereof, and only when both inputs are logic 1, a signal F is produced indicating the occurrence of a fault within the calculation range.

Figure 15:
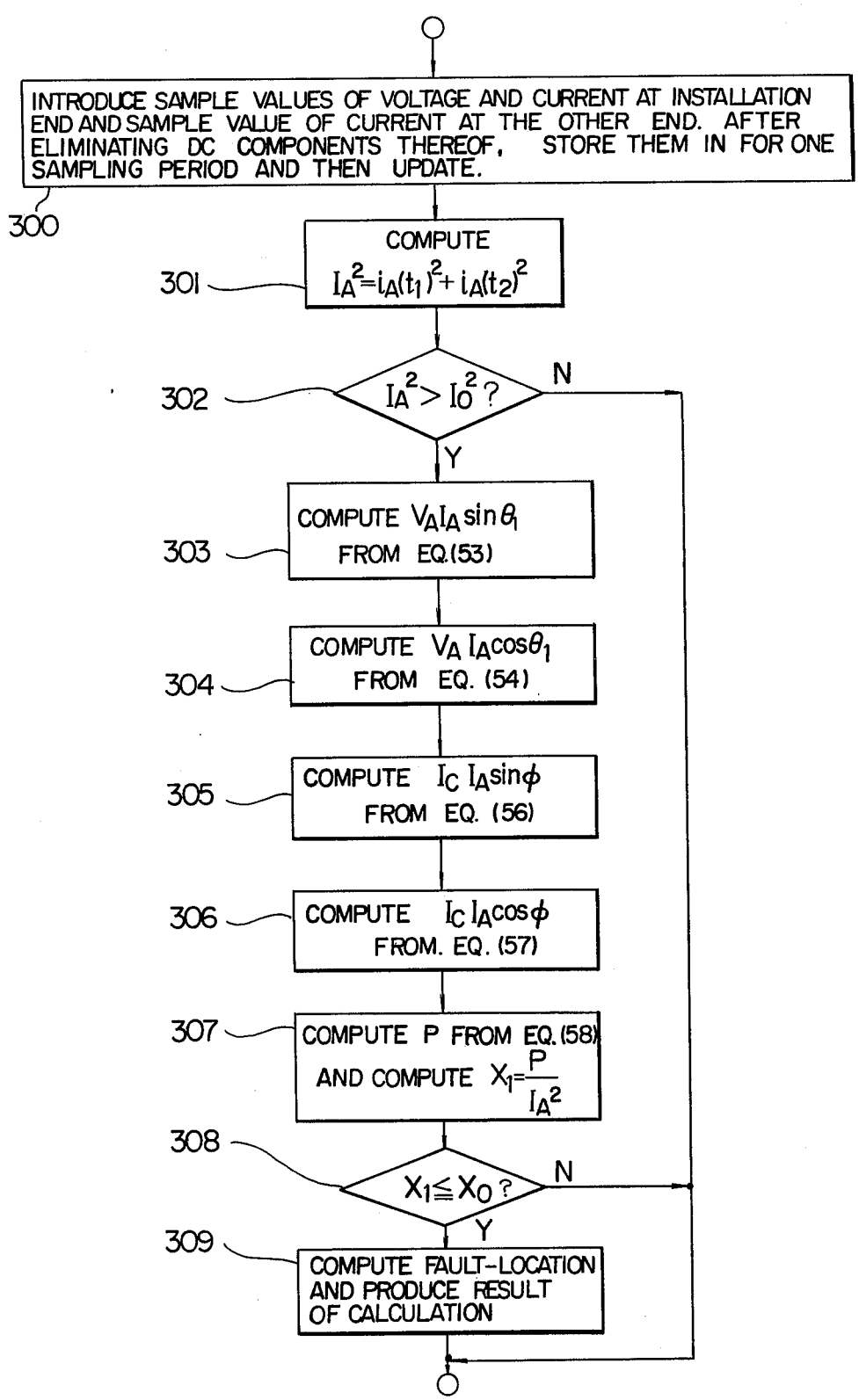
FIG. 15 is a flowchart of still another example of processes for fault-location calculation.

The digital fault location calculating apparatus 38 for carrying out this third method described with reference to FIG. 14 may take the form of the digital computer 18 shown in FIG. 1, whose operating processes may be utilized for easy implementation of fault-location calculation by this particular method. The diagram of FIG. 15 shows an example of the program process flowchart for the digital fault-location calculating system according to the invention using the digital computer 18. In FIG. 15, sample values of voltage and current at the installation end A and that of current at the other end B are introduced to block 300, where DC components are removed from them and the data are stored over one sampling period thereby to update them. Next, $I_A^2$ is calculated at block 301 on the basis of equation (55) and it is compared with a constant value $I_0^2$ at block 302. If $I_A^2$ is smaller than $I_0^2$, the process is completed and transferred to another process until the next sampling time.

When $I_A^2$ is larger than $I_0^2$, on the other hand, $V_A I_A \sin \theta_1$, $V_A I_A \cos \theta_1$, $I_C I_A \sin \phi$ and $I_C I_A \cos \phi$ are computed at blocks 303, 304, 305 and 306 respectively by multiplication and addition and subtraction in accordance with equations (53), (54), (56) and (57). Further, at block 307, P is computed on the basis of equation (58) and divided by $I_A^2$ thereby to calculate the line reactance $X_1$ up the fault point from the installation end A and compare it with the constant value $X_0$ at block 308. When $X_1$ is larger than $X_0$, the fault-location is outside of the calculation range and therefore the process is terminated at this point. If $X_1$ is smaller than $X_0$, by contrast, it indicates a fault within the calculation range and therefore the distance up to the fault point is calculated from the reactance $X_1$ at block 309 and displayed externally. The processes during one sampling period are thus completed to prepare for the next sampling time.

It will be noted from the foregoing description that according to the present invention, the current information at the other end B is used in addition to the power transmission system information at the installation end A to obtain the line impedance up to the fault point from the installation end A without regard to the fault-location resistance or power flow, thereby permitting a highly accurate calculation of the fault-location. Although the aforementioned embodiments all operate digitally, the same functions may be achieved by use of analog elements. Also, instead of the detection of an excess current forming the prerequisite for fault-location calculation in the above-mentioned embodiments, the deficiency voltage detection may form a prerequisite for fault-location calculation alternatively, as easily understood.

Reference is now made to a fourth method. According to this method, the digital fault-location calculating system of FIG. 9 operates such that the power transmission system impedance $\dot{Z}_{FL1}$ of equation (9) is obtained by digital operation from the voltage and current information sampled at the installation end A, the value $|\dot{I}_B/\dot{I}_A|$ is calculated from the effective current value at the other end, the phase difference between the respective currents at the installation end A and the other end B is obtained by estimation from the sampled values of the voltage and current information at the installation end A prior to the fault occurrence, and these values are used to eliminate the error of the second term of equation (9).

Embodiments of the invention according to this method will be explained below with reference to FIGS. 7, 8, 9, 16 and 17.

Figure 16:
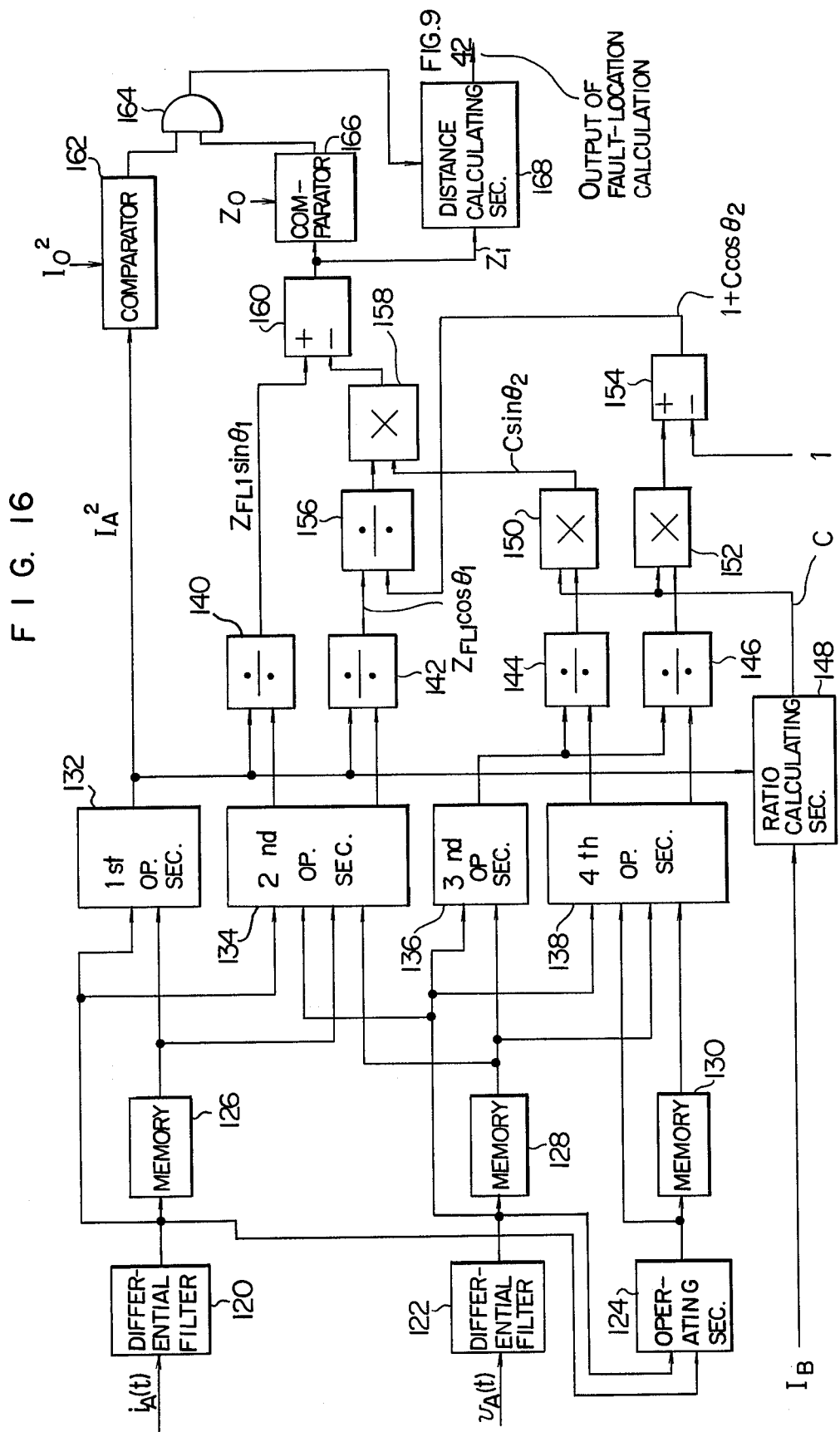
FIG. 16 is a block diagram showing a further embodiment of the digital fault-location calculating device in FIG. 9.

An example of the digital fault location calculating apparatus 38 in the embodiment of FIG. 9 is shown in the block diagram of FIG. 16.

Applied to the apparatus of FIG. 16 are the sampled values in digital form of the voltage $v_A(t)$ and current $i_A(t)$ at the installation end A and the maximum current value $I_B$ at the other end B. The input sampled information is first applied to differential filters 120 and 122 for finding remainder between the information sampled at present instance and information sampled a predetermined time before so as to eliminate DC components in the respective information. The sampling frequency is 4 times the power transmission system frequency, so that the power transmission system information is sampled for each one fourth of a cycle.

The sampled values $i_A(t)$ and $v_A(t)$ passed through the differential filters 120 and 122 are stored over one sampling period in memories 126, 128 and 130 which in turn produce immediately preceding sampled values at each time of sampling. Because of the sampling frequency of ¼ cycle, the equations below are obtained as in equations (27) and (28).

$$v_1(t_1) = V_A \sin(\omega t_1) \\ v_1(t_2) = V_A \cos(\omega t_1) \\ i_1(t_1) = I_A \sin(\omega t_1 + \theta_1) \\ i_1(t_2) = I_A \cos(\omega t_1 + \theta_1) \tag{59}$$

where $v_A(t_1)$ and $i_A(t_1)$ are sampled values of the voltage and current at the installation end A at time point $t_1$, $v_A(t_2)$ and $i_A(t_2)$ are sample values after one sampling period, i.e., at time point $t_2$ after $\pi/2\omega$, and $\omega$ the angular frequency of the power transmission system involved.

The phase difference $\theta_2$ between the currents $\dot{I}_A$ and $\dot{I}_B$ at the terminals A and B respectively satisfies the equation below.

$$\dot{C} = C(\cos \theta_2 + j \sin \theta_2) \tag{60}$$

where $$\dot{C} = \dot{I}_B/\dot{I}_A \tag{61}$$

Now, from the equivalent circuit of FIG. 7, the following equation (63) may be obtained:

$$\dot{C} = \frac{(\dot{Z}_1 + \dot{Z}_A)\dot{E}_B + (\dot{E}_B - \dot{E}_A)R_F}{(\dot{Z}_2 + \dot{Z}_B)\dot{E}_A + (\dot{E}_A - \dot{E}_B)R_R} \tag{62}$$

Where $|\dot{E}_A| \doteq |\dot{E}_B|$, equation (62) is approximated to equation (63) below.

$$\dot{C} = \frac{(\dot{Z}_1 + \dot{Z}_A)\dot{E}_B}{(\dot{Z}_2 + \dot{Z}_B)\dot{E}_A} \tag{63}$$

Further, in view of the fact that the impedance angles of $(\dot{Z}_1 + \dot{Z}_A)$ and $(\dot{Z}_2 + \dot{Z}_B)$ are substantially identical, the characteristics angle of C, i.e., the phase difference between the currents $\dot{I}_A$ and $\dot{I}_B$ at terminals A and B is equal to that between the source voltages $E_A$ and $E_B$. Furthermore, the phase difference between the source voltages $\dot{E}_A$ and $\dot{E}_B$ is considered almost the same as the phase difference between the voltage measurements $\dot{V}_A$ and $\dot{V}_B$ at terminal B prior to the fault occurrence, and therefore the equations below are obtained.

$$v_B(t_1) = v_A(t_1) - Z_T i_A(t_1) \tag{64}$$

$$v_B(t_2) = v_A(t_2) - Z_T i_A(t_2) \tag{65}$$

where $v_B(t_1)$ and $v_B(t_2)$ are instantaneous values of the voltage at terminal B respectively at time point $t_1$ and time point $t_2$ which is $\pi/2\omega$ or one sampling period later than $t_1$, and $Z_T$ is the total line impedance. A device 124 produces the values of $v_B(t_1)$ and $v_B(t_2)$ in accordance with equations (64) and (65).

The sampled values expressed by equations (59), (64) and (65) are applied to first to fourth operating sections 132, 134, 136, and 138 for effecting predetermined calculating operations. First, the sampled values $i_A(t_1)$ and $i_A(t_2)$ of currents at the installation end A are applied to the first operating section 132, where the sum of the squares of the respective sampled values $i_A(t_1)$ and $i_A(t_2)$ is calculated so as to produce $I_A^2$ according to the equation below.

$$i_A(t_1)^2 + i_A(t_2)^2 = I_A^2 \tag{66}$$

At the second operating section 134, the product of the value $i_A(t_2)$ of the current at the installation end A at time point $t_2$ and the value $v_A(t_1)$ of the voltage at the installation end A at time point $t_1$ one sampling period earlier is subtracted from the product of the sampled value of the voltage $v_A(t_2)$ at the installation end and the value $i_A(t_1)$ of the current at the installation end A at the time point $t_1$ one sampling period before. Thus, the operating section 134 produces $V_A I_A \sin \theta_1$ from the equation below as in equation (53).

$$v_A(t_2)i_A(t_1) - v_A(t_1)i_A(t_2) = V_A I_A \sin \theta_1 \tag{67}$$

The second operating section 134 further produces the sum of the product of the sampled values $v_A(t_2)$ and $i_A(t_2)$ of the voltage and current at the installation end A at time point $t_2$, and the sampled values $v_A(t_1)$ and $i_A(t_1)$ of the voltage and current at the installation end A at time point $t_1$ one sampling period before, with the result that $V_A I_A \cos \theta_1$ is also produced from the equation below as in equation (54).

$$v_A(t_2)i_A(t_2) + v_A(t_1)i_A(t_1) = V_A I_A \cos \theta_1 \tag{68}$$

At the operating section 136, the squares of the respective sampled values $v_A(t_1)$ and $v_A(t_2)$ of the voltage at the installation end A at time points $t_1$ and $t_2$ are added to each other, so that $V_A^2$ is produced by calculation according to the equation (69) below as in equation (36).

$$v_A(t_1)^2 + v_A(t_2)^2 = V_A^2 \tag{69}$$

At the fourth operating section 138, on the other hand, the product of the sampled value $v_A(t_1)$ of the voltage at the installation end A at time point $t_1$ and the value $v_B(t_2)$ of the voltage at the voltage at the other end B at time point $t_2$ is subtracted from the product of the sampled value $v_A(t_2)$ of the voltage at the installation end A at time point $t_2$ and the sampled value $v_B(t_1)$ of the voltage at the other end B at time point $t_1$ one sampling period before, thereby producing $V_A V_B \sin \theta_2$ from the equation below.

$$v_A(t_2)v_B(t_1) - v_A(t_1)v_B(t_2) = V_A V_B \sin \theta_2 \tag{70}$$

Further, the fourth operating section 138 is such that the product of $v_A(t_1)$ of the voltage at the installation end A and $v_B(t_1)$ of the voltage at the other end B at time point $t_1$ is added to the product of the voltage values $v_A(t_2)$ and $v_B(t_2)$ at time point $t_2$, thus producing $V_A V_B \cos \theta_2$ from the equation below.

$$v_A(t_1)v_B(t_1) + v_A(t_2)v_B(t_2) = V_A V_B \cos \theta_2 \tag{71}$$

The outputs of the second operating section 134 expressed by equations (67) and (68) are divided by the output $I_A^2$ of the first operating section 132, and the outputs of the fourth operating section 138 expressed by equations (70) and (71) are divided by the output $V_A^2$ of the third operating section 136, respectively, by dividers 140, 142, 144 and 146. The dividers 140 and 142 thus produce $Z_{FL1} \sin \theta_1$ and $Z_{FL1} \cos \theta_1$ respectively from the equations below.

$$\left. \begin{array}{l} Z_{FL1} \sin \theta_1 = (V_A I_A \sin \theta_1)/I_A^2 \\ Z_{FL1} \cos \theta_1 = (V_A I_A \cos \theta_1)/I_A^2 \end{array} \right\} \tag{72}$$

The maximum values of the voltages at the installation end A and the other end B are considered substantially equal to each other, i.e., $$V_A = V_B$$

and therefore the outputs below are obtained from the dividers 144 and 146 respectively.

$$\left. \begin{array}{l} \sin \theta_2 = (V_A^2 \sin \theta_2)/V_A^2 \\ \cos \theta_2 = (V_A^2 \cos \theta_2)/V_A^2 \end{array} \right\} \tag{73}$$

The ratio calculator 148, to which the maximum value $I_B$ of the current $\dot{I}_B$ at the other end B is applied, on the other hand, produces the ratio C below in response to $I_B$ and the maximum value $I_A$ of the current $\dot{I}_A$ at the installation end A.

$$C = I_B/I_A \tag{74}$$

The outputs of the dividers 144 and 146 expressed by equation (73) are multiplied by the output of the ratio calculator 148 by a multipliers 150 and 152 respectively, wherefrom the outputs below are produced.

$$\left. \begin{array}{l} C \sin \theta_2 = Im\,(\dot{I}_B/\dot{I}_A) \\ C \cos \theta_2 = Real\,(\dot{I}_B/\dot{I}_A) \end{array} \right\} \tag{75}$$

where symbols $Im$ and $Real$ respectively indicate an imaginary number and a real number. The output of the multiplier 152 is added to 1 at an adder 154; the output of the divider 142 is divided by the output of the adder 154 by a divider 156; and the output of the divider 156 is multiplied by the output of the multiplier 150 by a multiplier section 158. Further, the output of the multiplier 158 is subtracted from the output of the divider 140 by a subtractor 160. As a result, the output of the subtractor 160 is given as $$Z_{FL1}\sin\theta_1 - \frac{Z_{FL1}\cos\theta_1}{1 + C\cos\theta_2} C\sin\theta_2. \quad (76)$$

Assuming, on the other hand, that $Z_1$ and $Z_2$ are pure reactances in the equivalent circuit of FIG. 7, the following equations are obtained:

$$\begin{aligned}\text{Real}(\dot{Z}_{FL1}) &= Z_{FL1}\cos\theta_1 \\ &= R_F(1 + C\cos\theta_2) \\ \text{Im}(\dot{Z}_{FL1}) &= Z_{FL1}\sin\theta_1 \\ &= Z_1 + R_F(\sin\theta_2)\end{aligned} \quad (77)$$

Therefore, the output of the subtractor 160 expressed by equation (76) is $$\begin{aligned}\text{Im}(\dot{Z}_{FL1}) &- \frac{\text{Real}(Z_{FL1})}{1 + C\cos\theta_2} C\sin\theta_2 \\ &= Z_1 + R_F C\sin\theta_2 - \frac{R_F(1 + C\cos\theta_2)}{1 + C\cos\theta_2} C\sin\theta_2 \\ &= Z_1\end{aligned} \quad (78)$$

In this way, the line impedance $Z_1$ up to the fault point is obtained.

The square $I_A^2$ of the maximum value of the current $I_A$ at the installation end which is produced from the first operating section 132 is compared with a predetermined reference value $I_0^2$ at a comparator 162, and if it is determined that $$I_A^2 > I_0^2 \quad (79)$$

an AND gate 164 is supplied with a signal indicating the occurrence of a fault. The line impedance $Z_1$ up to the fault point, which is the output of the subtractor 160, on the other hand, is compared with a predetermined value $Z_0$ by a comparator 166, and if it is decided that $$Z_1 < Z_0 \quad (80)$$

the AND gate 164 is also supplied with a signal indicating the occurrence of a fault within the fault-location calculation range. Upon satisfaction of the inequalities (79) and (80), the AND gate 164 applies a command signal to a distance calculator 168 to cause it to calculate and produce at terminal 42 (FIG. 9) the distance up to the fault point from the installation end A.

Figure 17:
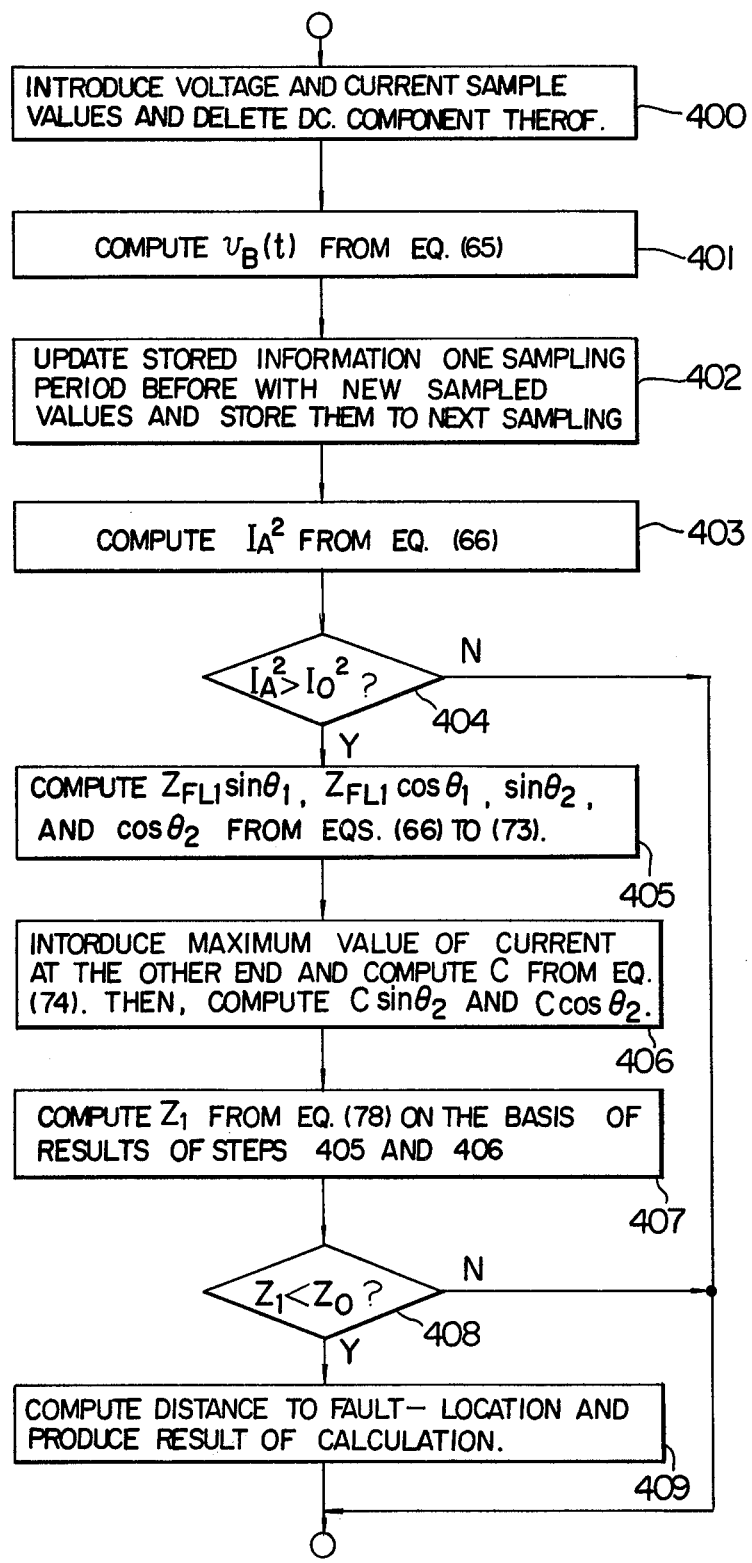
FIG. 17 is a flowchart of a still further embodiment of processes for fault-location calculation.

The operations of the foregoing embodiments may be easily performed by the use of the digital computer 18. FIG. 17 shows an example of flowchart for fault-location calculation by using such a digital computer 18 as shown in FIG. 1 instead of the fault-location calculating apparatus of FIG. 16. In FIG. 17, the sampled values $i_A(t_1)$ and $v_A(t_1)$ are first introduced at step 400 thereby to eliminate the DC components by differentially filtering. At step 401, the value $v_B(t_1)$ is obtained on the basis of equation (64). The step 402 is to update each information from its value as of one sampling period before and the updated data is stored until the next sampling. At step 403, $I_A^2$ is calculated according to equation (66), followed by verification of inequality (79) at step 404, so that if the inequality (79) is not established, the process of one sampling operation is completed at this point.

When inequality (79) is satisfied, operations are proceeded to step 405 for calculation of equations (67) to (73), thereby introducing $Z_{FL1}\sin\theta_1$, $Z_{FL1}\cos\theta_1$, $\sin\theta_2$ and $\cos\theta_2$. At step 406, the maximum value $I_B$ of the current at the other end B is introduced, C in equation (74) is calculated and then $C\sin\theta_2$ and $C\cos\theta_2$ are calculated. Step 407 is for calculating the line impedance $Z_1$ up to the fault point from the installation end A according to equation (78) on the basis of the results of steps 405 and 406. At step 408, the inequality (80) is verified, and if inequality (80) is not established, the process is stopped there. When inequality (80) is established, by contrast, the step 409 calculates and produces the distance up to the fault point.

It will be obvious from the foregoing description that this method eliminates the error which otherwise might occur due to arc resistance and power flow and makes possible fault location calculation with high accuracy. Further, according to this method, a fault-location is calculated digitally from sampled voltage and current information, and therefore no error is caused by the phase relation of voltage and current. Although the aforementioned embodiments use an excess current element for determining the occurrence of a fault, another element such as a deficiency voltage element may be used with equal effect, as evident to those skilled in the art.

A fifth method consists in correcting the effect of the phase difference $\theta_2$ of the respective currents at terminals A and B by an estimate of the phase difference therebetween. According to this method, the estimate value $\hat{\theta}_2$ of the phase difference $\theta_2$ between the respective currents at terminals A and B is used for the purpose of correction according to the equation below.

$$X_R = Z_{FL1}\cos(\theta_3 + k\hat{\theta}_2) \quad (81)$$
$$= Z_{FL1}\sin(\theta_1 - k\hat{\theta}_2)$$
where
$$Z_{FL1} = \left|\frac{\dot{V}_A}{\dot{I}_A}\right|\cos\theta_1 + j\sin\theta_1) \quad (82)$$
$$\theta_3 = \frac{\pi}{2} - \theta_1 \quad (83)$$

FIG. 18 is an impedance vector diagram for explaining the correction according to this method. In this drawing similar to FIG. 8, $\overline{OA}$, $\overline{AB}$, $\overline{BC}$ and $\overline{OC}$ respectively show $\dot{Z}_1$, $R_F$, $R_F(\dot{I}_B/\dot{I}_A)$ and $\dot{Z}_{FL1}$. OFC shows a right-angled triangle. From equations (81) and (82).

$$X_R = |\overline{OA}| = |\overline{OF}|$$

The vector $\overline{OA}$ shows the estimate of the impedance $\dot{Z}_1$ up to the fault point after the correction according to the invention, while $\overline{OE}$ is a vector showing only the detection of reactance at terminal A. The diagram of FIG. 18 is associated with $k = 1$.

When $\theta_2 = 0$, the value $X_R$ after correction according to this invention coincides with the value $|\overline{OE}|$ for only the detection of the reactance at terminal A. When $\theta_2 = 30°$ and $R_F = 0.5\ |\dot{Z}_1|$, $|\dot{I}_B|/|\dot{I}_A| = 4$, on the other hand, the detection value according to the conventional systems is $$|\overline{OE}| = (1 + 4 \times 0.5 \times \sin 30°) \cdot Z_1 = 2 Z_1$$

which is twice the true value, as compared with the value $X_R$ after correction of the invention, as shown below.

$$X_R \approx 3 \cos(48° + k \times 30°) \cdot Z_1$$

When $k = 1$, $$X_R \approx 0.63 Z_1$$

If $k = 0.8$, $X_R$ is more accurate and expressed as $$X_R \approx 0.93 Z_1$$

Further, if $\theta_2$ is $-30°$ under the same condition as the previous case, the detection value by the conventional method is $|\overline{OE}| = 0$, which compares with the post-correction value $X_R$ below according to the invention.

$$X_R \approx 2.23 \cos(90° - k \times 30°) \cdot Z_1$$

For $k = 1$, $Z_R \approx 1.13 Z_1$, while for $k$ of 0.8, $X_R \approx 0.91 Z_1$ resulting in a greater effect of the correction. The coefficient for correction, i.e., the constant $k$ in equation (81) is required to be properly selected depending on the constant of the power transmission system involved.

It is easy to measure the impedance $\dot{Z}_T$ between terminals A and B in advance and therefore this value $\dot{Z}_T$ may be regarded as a known value. First, using this value of impedance $\dot{Z}_T$, an estimated value $\hat{V}_B$ of the voltage $\dot{V}_B$ at terminal B is obtained from the equation below.

$$\hat{V}_B = \dot{V}_A + \dot{Z}_T \dot{I}_A \tag{84}$$

And the phase angle between $\dot{V}_A$ and $\hat{V}_B$ may be considered as an estimated value $\hat{\theta}_2$ of the phase angle $\theta_2$ between the currents at terminals A and B.

When $R_F$ is small, it is evident from FIG. 18 that the corrected value $X_R$ expressed by equation (81) is deteriorated as compared with when only reactance detection is involved according to the conventional systems. For a small $R_F$ therefore, the detection using $$X_R = Z_{FL1} \sin \theta_1 \tag{85}$$

is more preferable. According to the fault-location calculating system according to the method under consideration, therefore, it is determined whether or not $$Z_{FL1} \cos \theta_1 > R_{AB} \tag{86}$$

and if the inequality (86) is established, detection according to equation (81) is performed. When the inequality (86) is not satisfied, on the other hand, detection must be conducted according to equation (85). In the inequality (86), $R_{AB}$ shows the resistance component of the known line impedance $\dot{Z}_T$ between terminals A and B.

Figure 19:
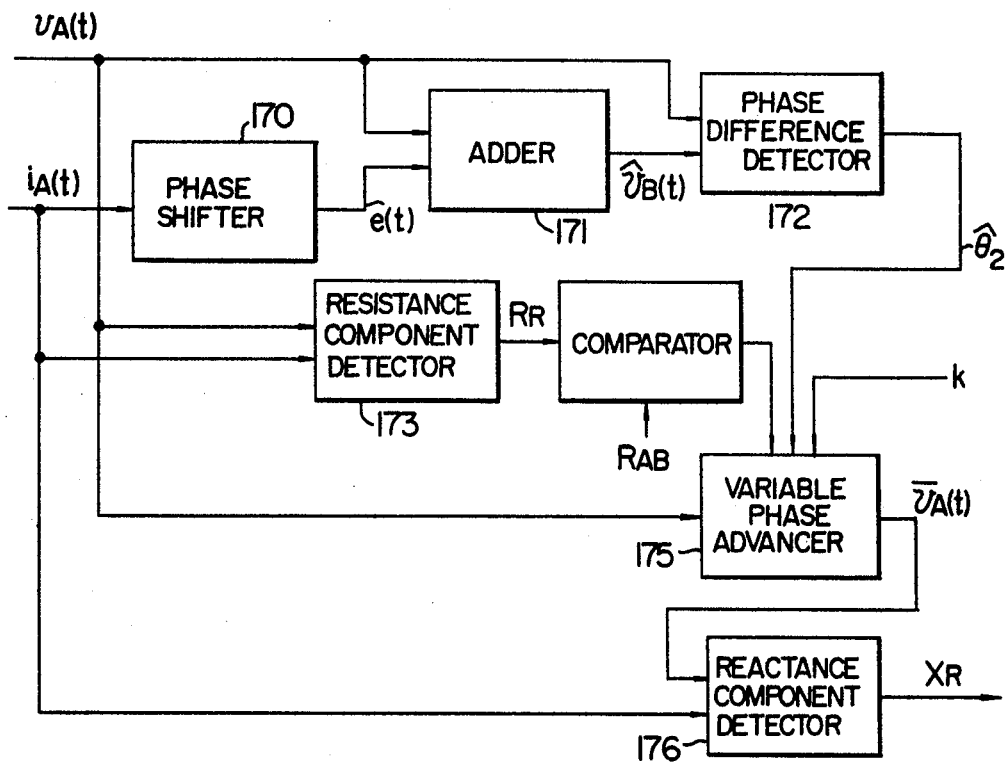
FIG. 19 is a block diagram showing an embodiment of the digital fault-location calculating device operated in accordance with the impedance characteristics of FIG. 18.

This method may be realized by the use of the digital computer 18 as in the embodiment of FIG. 1, but instead of such a computer, a fault-location calculating apparatus as shown in FIG. 19 may be used. In FIG. 19, the voltage and current information at terminal A is introduced as below $$v_A(t) = V_A \sin(\omega t + \theta_1) \tag{87}$$

$$i_A(t) = I_A \sin(\omega t) \tag{88}$$

First, the equation (89) below is calculated by a phase shifter 170.

$$e(t) = I_A Z_T \sin(\omega t + \beta) \tag{89}$$

where $$Z_T = Z_T e^{j\beta} \tag{90}$$

Next, $v_A(t)$ and $e(t)$ are applied to an adder 171, where an estimated value of the voltage at terminal B is calculated as below.

$$\hat{v}_B(t) = v_A(t) + e(t) \tag{91}$$

A phase difference detector 172 detects the phase difference $\hat{\theta}_2$ between $v_A(t)$ and $\hat{v}_B(t)$ and produces it as an estimated value of the phase difference $\theta_2$ between the respective currents at terminals A and B.

On the other hand, the voltage and current information $v_A(t)$ and $i_A(t)$ are applied to a resistance component detector 173 for detection of $$R_R = Z_{FL1} \cos \theta_1 = |\dot{V}_A/\dot{I}_A| \cos \theta_1 \tag{92}$$

This value $R_R$ is applied to a comparator 174 where it is compared with the known value $R_{AB}$, the result of which is applied to a variable phase advancer 175. When the inequality (86) is not satisfied as the result of comprison by the comparator 174, the variable phase advancer 175 produces the voltage information $v_A(t)$ directly in the form of $$\bar{v}_A(t) = v_A(t) \tag{93}$$

while if the inequality (86) is established, the voltage information $v_A(t)$ is advanced by $\hat{\theta}_2$, thereby producing $$\begin{aligned}\bar{v}_A(t) &= v_A(t - \frac{k\hat{\theta}_2}{\omega}) \\ &= V_A \sin(\omega t + \theta_1 - k\hat{\theta}_2)\end{aligned} \tag{94}$$

Both $\bar{v}_A(t)$ and $i_A(t)$ are applied to a reactance detector 176 for producing the reactance component $X_R$ as a calculation output. In other words, the calculation output $X_R$ is obtained from equations (81) or (85) depending on whether the inequality (86) is established or not respectively.

The blocks shown in FIG. 19 may take a form either including digital elements or, as used in the conventional systems, analog elements comprising relay means. In the case of digital elements, the voltage and current information sampled at regular intervals and thus digitally converted is used. For processing such a sampled data, the digital computer 18 as shown in FIG. 1 may be used, and the operations are easily realized by programming the functions of FIG. 19. The diagram of FIG. 20 shows an example of process flowchart during one sampling period with the digital computer 18.

Figure 20:
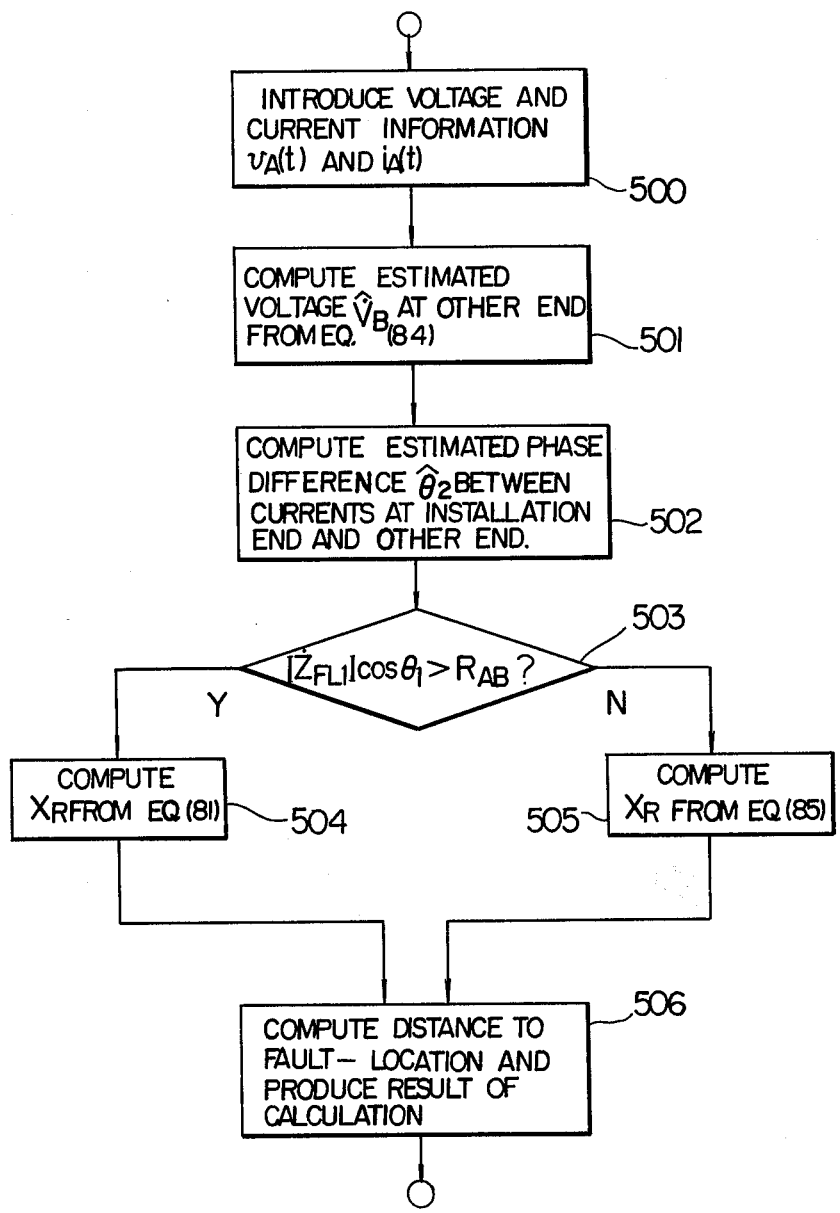
FIG. 20 is a flowchart of still another example of processes for fault-location calculation.

In FIG. 20, the voltage and current information is first introduced at block 500; an estimated value of the voltage at the other end B is calculated at block 501 according to equation (84); an estimated value $\hat{\theta}_2$ of the phase difference $\theta_2$ between the respective currents at the installation end A and the other end B is calculated at block 502; inequality (86) is verified at block 503; and if inequality (86) is established, the calculation of equation (81) is executed at block 504, while if inequality (86) is not established, calculation according to equation (85) is carried out at block 505. Thereafter, a calculation output is produced from the block 506 thereby completing the process of one sampling period.

It will be obvious from the foregoing description that according to the present invention, a fault-location is accurately calculated with a comparatively simple configuration only from the voltage and current information at the installation end A by correcting the effect of the fault-location resistance and the conditions at the other end B and thus without being affected by such factors.

According to a sixth method, the left side of equation (9) is obtained from sampled values of voltage and current at the installation end A at predetermined intervals. These values are then corrected by offsetting the second term of the right side of equation (9) by the use of the phase difference between the respective currents at the installation end A and the other end B, thereby producing the line impedance $Z_1$ up to the fault point from the installation end A. In this way, the digital fault-location calculation according to the invention is achieved.

Figure 22:
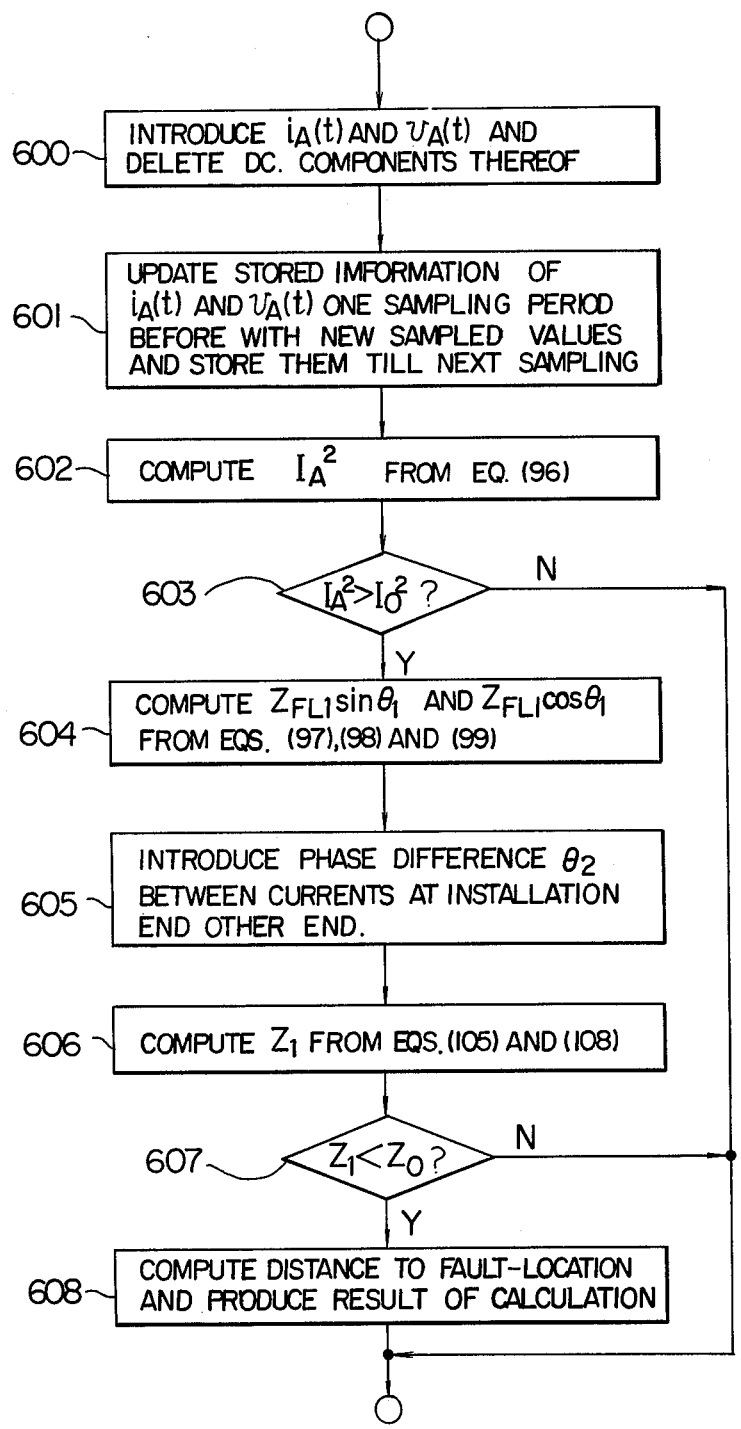
FIG. 22 is a flowchart of still another example of processes for fault-location calculation.

Embodiments of the invention according to the method under consideration will be described with reference FIGS. 21 and 22 below.

The block diagram of FIG. 21 shows an embodiment of the digital fault-location calculating apparatus 38 of FIG. 9 for carrying out the method under consideration. The system including the apparatus of FIG. 21 is applicable to the power transmission system of FIG. 7 and installed at point $P_A$ of terminal A in FIG. 7 for calculation of the distance from point $P_A$ to a fault point $P_F$. As shown in FIG. 8, the line impedances $\dot{Z}_1$ and $\dot{Z}_2$ are assumed to be pure reactances. The character $\theta_1$ shows the characteristic angle of the power system impedance $\dot{Z}_{FL1}$, and $\theta_2$ the phase difference between the respective currents $\dot{I}_A$ and $\dot{I}_B$ at terminals A and B.

In the apparatus of FIG. 21, the sampled digital information $i_A(t)$ and $v_A(t)$ of the current and voltage at the installation end A respectively are first introduced, together with the phase difference $\theta_2$ between the respective currents $\dot{I}_A$ and $\dot{I}_B$ at terminals A and B. The sampled information $i_A(t)$ and $v_A(t)$ are applied to differential filters 220 and 222 respectively thereby to remove DC components included therein. The thus introduced information has been sampled at a frequency four times the power transmission system frequency, so that the sample values are obtained in each one fourth of a cycle.

The sampled values $i_A(t)$ and $v_A(t)$, that have passed the differential filters 220 and 222, are stored over one sampling period in memories 224 and 226 respectively, which produce values as of one sampling period before each time of sampling. In view of the sampling frequency of ¼ cycle, equation (95) below is obtained as in equations (27) and (28).

$$\left.\begin{array}{l} V_a(t_1) = V_A \sin(\omega t_1) \\ i_A(t_1) = I_A \sin(\omega t_1 + \theta_1) \\ v_A(t_2) = V_A \cos(\omega t_1) \\ I_A(t_2) = I_A \cos(\omega t_1 + \theta_1) \end{array}\right\} \quad (95)$$

where $i_A(t_1)$ and $v_A(t_1)$ are sampled values at time point $t_1$, and $i_A(t_2)$ and $v_A(t_2)$ sampled values at time point $t_2$ which is one sampling period behind $t_1$ and equals $t_1 + \pi/2\omega$.

The sampled values expressed by equation (95) are applied to first and second operating sections 228 and 230 respectively for predetermined operations. First, the sampled values $i_A(t_1)$ and $i_A(t_2)$ of the current at the installation end A are applied to the first operating section 228, where the squares thereof are added to each other as shown below, like equation (55).

$$i_A(t_1)^2 + i_A(t_2)^2 = I_A^2 \tag{96}$$

thus producing $I_A^2$. At the second operating section 230, the product of the present sampled value $i_A(t_2)$ of the current at the installation end A and the value $v_A(t_1)$ of the voltage at the installation end A one sampling period before is subtracted from the product of the present sample value $v_A(t_2)$ and the value $i_A(t_1)$ of the current at the installation end A one sampling period before, and as in equation (70), $V_A I_A \sin \theta_1$ is produced according to the equation below.

$$v_A(t_2)i_A(t_1) - v_A(t_1)i_A(t_2) = V_A I_A \sin \theta_1 \tag{97}$$

Further, the product of the present sample values $v_A(t_2)$ and $i_A(t_2)$ of the voltage and current at the installation end A is added to the product of the values $v_A(t_1)$ and $i_A(t_1)$ of the voltage and current at the installation end A one sampling period before, thus producing, like equation (71), $V_A I_A \cos \theta_1$ as shown below.

$$v_A(t_2)i_A(t_2) + v_A(t_1)i_A(t_1) = V_A I_A \cos \theta_1 \tag{98}$$

The outputs $V_A I_A \sin \theta_1$ and $V_A I_A \cos \theta_1$ of the second operating section 230 expressed by equations (97) and (98) are divided by the output $I_A^2$ of the first operating section 228 at dividers 234 and 232 respectively as shown below.

$$\left.\begin{array}{l} V_A I_A \sin \theta_1 / I_A^2 = Z_{FL1} \sin \theta_1 \\ V_A I_A \cos \theta_1 / I_A^2 = Z_{FL1} \cos \theta_1 \end{array}\right\} \quad (99)$$

thus producing $Z_{FL1 \sin \theta 1}$ and $Z_{FL1} \cos \theta_1$ respectively.

The phase angle $\theta_2$ between the respective currents $\dot{I}_A$ and $\dot{I}_B$ at installation end A and the other end B, is applied to the function generators 236 and 238 for producing $\cos \theta_2$ and $\sin \theta_2$ respectively. At a subtractor 240, the output $Z_{FL1} \sin \theta_1$ of the divider 234 is subtracted from the line impedance $Z_T$ shown below over the entier line.

$$Z_T = Z_1 + Z_2 \tag{100}$$

A divider 242 divides the output $Z_{FL1} \sin \theta_1$ of the divider 234 by the output of the subtractor 240 and produces the output $$\frac{\dot{Z}_{FL1} \sin \theta_1}{Z_T - Z_{FL1} \sin \theta_1} = \frac{Im(\dot{Z}_{Fl1})}{Im(\dot{Z}_T) - Im(\dot{Z}_{Fl1})} \tag{101}$$

If the ratio of vectors between currents $\dot{I}_A$ and $\dot{I}_B$ at the installation end A and the other end B respectively is defined as $$\dot{C} = \frac{\dot{I}_B}{\dot{I}_A} \tag{102}$$

from the equivalent circuit of FIG. 7, the relation below is obtained.

$$C = |\dot{C}| \quad (103)$$

$$= \left|\frac{\dot{I}_B}{\dot{I}_A}\right|$$

$$= \left|\frac{(\dot{Z}_1 + \dot{Z}_A)\dot{E}_B + (\dot{E}_B - \dot{E}_A)R_F}{(\dot{Z}_2 + \dot{Z}_B)\dot{E}_A + (\dot{E}_A - \dot{E}_B)R_F}\right|$$

Since $|E_A| \approx |E_B|$, the equation (103) may be approximated to $$C \approx \left|\frac{\dot{Z}_1 + \dot{Z}_A}{\dot{Z}_2 + \dot{Z}_B}\right| \quad (104)$$

$$\approx \left|\frac{\dot{Z}_1}{\dot{Z}_2}\right|$$

$$= \left|\frac{\dot{Z}_1}{\dot{Z}_T - \dot{Z}_1}\right|$$

$$\approx \frac{I_m(\dot{Z}_{FL1})}{I_m(\dot{Z}_T) = I_m(\dot{Z}_{F1})}.$$

By the use of this approximation, the output of the divider 242 is given as $$C = \frac{Z_{F1} \sin \theta_1}{Z_T - Z_{F1} \sin \theta_1}. \quad (105)$$

The output C of the divider 242 expressed by equation (105) is applied to a multipliers 244 and 246 together with the respective outputs of the function generators 236 and 238, so that the multipliers 244 and 246 produce $C \cos \theta_2$ and $C \sin \theta_2$ respectively. The output of the multiplier 244 is added to 1 by an adder 248, while the output $Z_A \cos \theta_1$ of the divider 232 is divided by the output $(1 + C \cos \theta_2)$ of the adder 248 by a divider 250. Further, the output of the divider 250 is multiplied by the output of the multiplier 246 at a multiplier 252, while the output of the multiplier 252 is subtracted from the output of the divider 234 by a subtractor 254. As a result, the output of the subtractor 254 is expressed as $$Z_{FL1} \sin \theta_1 - \frac{Z_{FL1} \cos \theta_1}{1 + C \cos \theta_2} c \sin \theta_2. \quad (106)$$

Assume, on the other hand, that $Z_1$ and $Z_2$ are pure reactances in the equivalent circuit of FIG. 1.

$$\left.\begin{array}{l} \text{Real}(\dot{Z}_{FL1}) = Z_{FL1} \cos \theta_1 \\ \qquad = R_F(1 + C \cos \theta_2) \\ I_m(\dot{Z}_{FL1}) = Z_{FL1} \sin \theta_1 \\ \qquad = Z_1 + R_F C \sin \theta_2 \end{array}\right\} \quad (107)$$

Therefore, the output of the subtractor 254 expressed by the equation (106) is given as $$Z_1 = I_m(\dot{Z}_{FL1}) - \frac{\text{Real}(\dot{Z}_{FL1})}{1 + C \cos \theta_2} C \sin \theta_2 \quad (108)$$

thus producing the line impedance $Z_1$ up to the fault point from the installation end A.

The square $I_A^2$ of the current $I_A$ of the installation end A which is produced from the first operating section 228 is compared with a predetermined reference value $I_0^2$ by a comparator 256. If it is decided that $$I_A^2 > I_0^2 \quad (109)$$

a signal indicating the occurrence of a fault is applied to an AND gate 258. The line impedance $Z_1$ up to the fault point from the installation end A which is the output of the subtractor 254 is compared with a predetermined value $Z_0$ by a comparator 260, and if it is decided that $$Z_1 < Z_0 \quad (110)$$

the comparator 260 supplies the AND gate 258 with a signal indicating the occurrence of a fault within the fault-location calculation range. When both inequalities (109) and (110) are established, the AND gate 258 produces a command signal to a distance calculator 260 thereby causing it to produce the distance up to the fault point from the installation end A.

The operations of the above-mentioned embodiments may be easily accomplished with the digital computer 18 as shown in FIG. 1. The diagram of FIG. 22 shows an example of process flowchart involving the digital computer 18 of FIG. 1 instead of the fault-location calculating apparatus of FIG. 21, according to the present invention. In FIG. 22, the sampled values $i_A(t)$ and $v_A(i\,t)$ are first introduced into the block 600 where DC components thereof are eliminated by differentially filtering. Next, at step 601, the values of $i_A(t)$ and $v_A(t)$ one sampling period before are updated and the updated data is stored until the next sampling. At step 602, $I_A^2$ is calculated on the basis of equation (96), and at step 603 inequality (109) is verified, so that if inequality (109) fails to be established, the processes for one sampling operations are completed thereat.

When inequality (109) is established, on the other hand, operations are proceeded to step 604 for calculation of equations (97), (98) and (99) thereby to introduce $Z_{FL1} \sin \theta_1$ and $Z_{FL1} \cos \theta_1$. At step 605, the phase angle $\theta_2$ between the respective currents at the installation end A and the other end B is introduced to calculate $\sin \theta_2$ and $\cos \theta_2$. Step 606 is for producing C first and then $Z_1$ according to equations (105) and (108) on the basis of the results of steps 604 and 605. Finally, at step 607, inequality (110) is verified and if it is not established, the processes are terminated there, while if inequality (110) is established, step 108 calculates and produces the distance up to the fault point from the installation end A.

It will be understood from the foregoing explanation that according to the present invention the error which otherwise might occur due to arc resistance and power flow is eliminated, making possible fault-location calculation with high accuracy. Further, according to the invention, a fault-location is calculated by digital operation on the basis of sampled voltage and current information, thus precluding any error attributable to phase relation of voltage and current. According to this method, the phase difference between the respective currents at the installation end A and the other end B is required as an input data, which is comparatively easily obtained since a phase comparison method is used as a main protection.

Furthermore, the excess current element which is used for determining the occurrence of a fault in the aforementioned embodiments may be replaced with equal effect by another element such as a deficiency voltage element, as in the various methods mentioned above.

Generally, two parallel lines are used for each phase of a superhigh voltage power transmission system. A seventh method concerns the utilization of current information on the normal one of such two parallel lines employed for one phase of a superhigh voltage power transmission system. In other words, by the use of the current on the normal line and the impedance of the entire length of the power transmission line, the fault current at both ends of the transmission line under abnormal conditions is checked. In this case, the normal line is identified by the operating condition of the mho relay element of each line.

This method will be specifically explained with reference to FIGS. 23 and 24. These figures are for explaining the two parallel transmission lines employed for one phase, in which FIG. 23 shows the condition before the occurrence of a fault and FIG. 24 that after a fault. Assume that the first transmission line is free from a fault, while the second line is subjected to a fault. In such a circuit, equations below are satisfied.

$$\dot{E}_A - \dot{V}_A = \dot{I}_A \dot{Z}_A \quad (111)$$

$$\dot{E}_A - \dot{V}_{Af} = \dot{I}_{Af} \dot{Z}_A \quad (112)$$

where $\dot{E}_A$ is the back source voltage at the installation end A, $\dot{V}_A$ and $\dot{V}_{Af}$ voltages at measuring points at the installation end A before and after a fault respectively, and $\dot{I}_A$ and $\dot{I}_{Af}$ source currents at the installation end A before and after the fault respectively.

From equation (112), $$\dot{Z}_A = \frac{\dot{V}_{Af} - \dot{V}_A}{\dot{I}_A - \dot{I}_{Af}}. \quad (113)$$

Since back power is generally substantially equal in a trunk power system, the back impedance $\dot{Z}_B$ at the other end B is considered equal to $\dot{Z}_A$. Therefore, $$\left. \begin{array}{l} \dot{E}_B = \dot{V}_B - \dot{Z}_A \dot{I}_A \\ \dot{V}_B = \dot{V}_A - \dot{I}_{A2} \dot{Z}_T \end{array} \right\} \quad (114)$$

where $\dot{E}_B$ is the back source voltage at the other end B, $\dot{V}_B$ the voltage at the other end B under normal conditions, $Z_T$ the impedance determined by the entire length of the power transmission line, and $\dot{I}_{A2}$ the current under the normal condition of the second line. Under an abnormal condition, from FIG. 24

$$\dot{V}_{Bf} - \dot{E}_B = (\dot{I}_{A2f} - \dot{I}_{B2f}) \dot{Z}_A \quad (115)$$

where $\dot{V}_{Bf}$ is the voltage at the other end B under a fault, $\dot{I}_{A2f}$ the current at the installation end A flowing in the second line during the fault, and $\dot{I}_{Baf}$ the current at the other end B which flows in the second line during the fault. From equation (115), $\dot{I}_{B2f}$ is given as $$\dot{I}_{B2f} = -\frac{\dot{V}_{Bf} - \dot{E}_B}{\dot{Z}_A} + \dot{I}_{A2f}. \quad (116)$$

By substituting the ratio $\dot{I}_B/\dot{I}_A$ in equation (9) by the ratio $\dot{I}_{B2f}/\dot{I}_{A2f}$ between the currents at the installation end A and the other end B of the abnormal line, accurate calculation is made possible.

Next, a specific method for calculating the fault-location from sampled values according to the aforementioned processes will be described below.

Since $\dot{Z}_A$ is substantially made up of a reactance component, $$|\dot{Z}_A| = \frac{\int |v_{Af}(t) - v_A(t)| dt}{\int |i_A(t) - i_{Af}(t)| dt} \quad (117)$$

where $v_A(t)$ and $i_A(t)$ are sampled values of the voltage and current at the installation end A under normal conditions, and $v_{Af}(t)$ and $i_{Af}(t)$ sampled values of the voltage and current at the installation end A during a fault. From the value $|\dot{Z}_A|$ thus calculated and the sampled values $v_A(t)$, $v_B(t)$ and $i_A(t)$ of $\dot{V}_A$, $\dot{V}_B$ and $\dot{I}_A$ respectively, the instantaneous value $e_B(t)$ of the source voltage $\dot{E}_B$ at the other end B may be obtained by the equation (118) below.

$$\left. \begin{array}{l} e_B(t) = v_B(t) - |Z_A| i_A(t + \frac{\pi}{2\omega}) \\ v_B(t) = v_A(t) - i_{A2}(t + \frac{\pi}{2\omega}) \dot{Z}_T \end{array} \right\} \quad (118)$$

where $i_A(t + \pi/2\omega)$ and $i_{A2}(t + \pi/2\omega)$ lag behind $i_A(t)$ and $i_{A2}(t)$ respectively by $\pi/2\omega$. The difference between $e_B(t)$ and the instantaneous value $v_B(t)$ of $\dot{V}_{Bf}$, which is divided by $|\dot{Z}_A|$ and advanced by $\pi/2$(rad) is compared with the instantaneous value $i_{A1f}(t)$ of the $\dot{I}_{A1f}$ so that the resultant difference is integrated for a predetermined range thereby to produce a value proportional to the effective value of $|\dot{I}_{B2f}|$. In like manner, the instantaneous value $i_{A2f}(t)$ of $\dot{I}_{A2f}$ is integrated over a predetermined range to obtain a value proportional to the effective value of $|\dot{I}_{A2f}|$. From the ratio between $|\dot{I}_{B2f}|$ and $|\dot{I}_{A2f}|$ and the timing of the instantaneous value $i_{A2f}(t)$ and $i_{B2f}(t)$ passing zero, the phase relation between $\dot{I}_{B2f}$ and $\dot{I}_{A2f}$ is obtained. The value thus obtained is substituted into equation (9) and the resulting value of reactance component is used to determine the reactance up to the fault-location from the installation end A.

Figure 25:
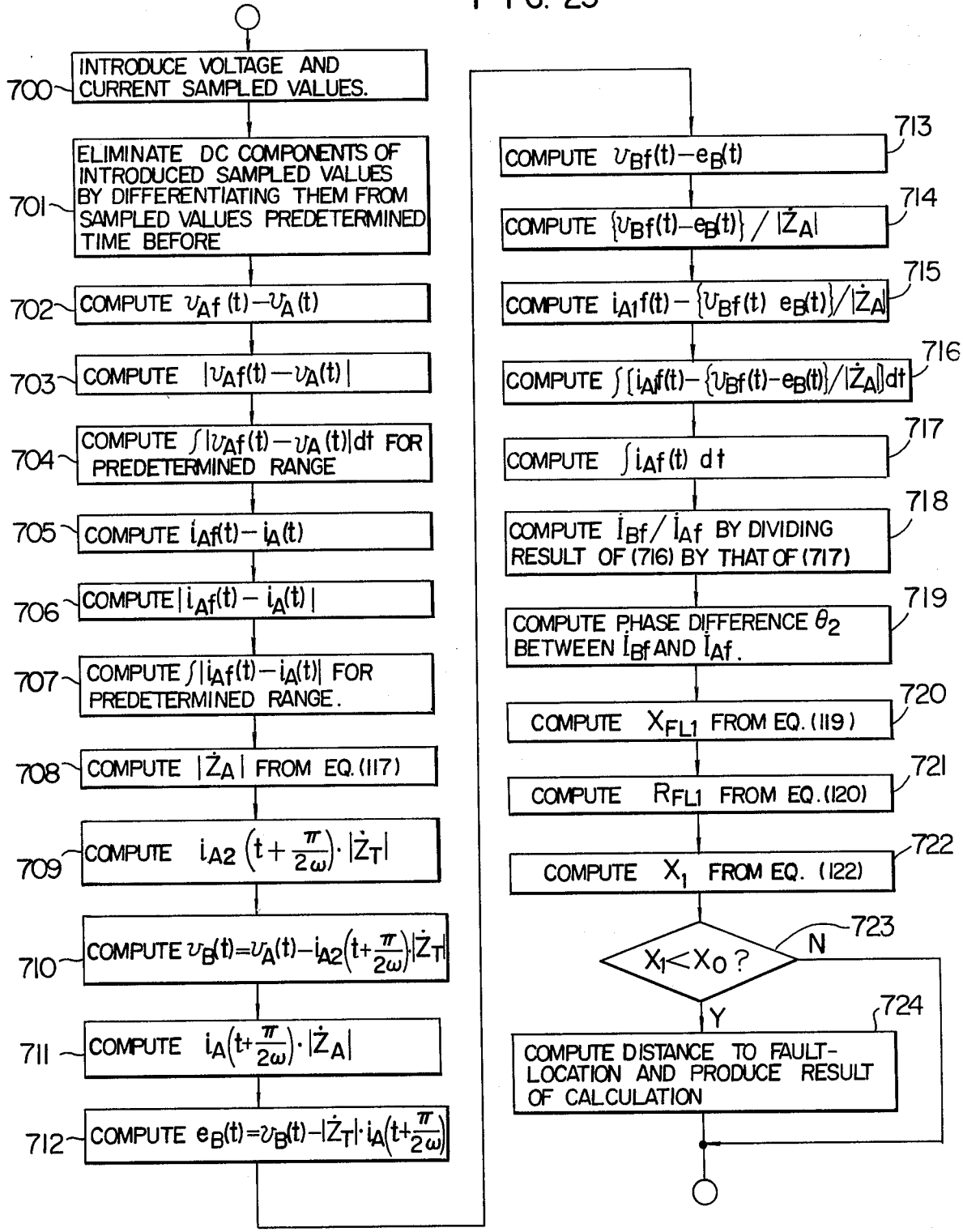
FIG. 25 is a flowchart of a still further example of processes for fault-location calculation.

The process flowchart for applying this method to the fault-location calculating system of FIG. 1 by use of the digital computer 18 is shown in FIG. 25. At block 700, sampled values of voltage and current are introduced; at block 701, DC components are eliminated by finding difference between the respective sampled values at present and at a certain time before; at 702, the difference between the sampled value of the voltage at present at the installation end A under abnormal conditions and the sampled value of the same at a predetermined time before under normal conditions is produced; at 703, the absolute value of such a difference of 702 is produced; at 704, the result of 703 is integrated over a predetermined range; at 705, the difference between the sampled value of the current at present at the installation end A under abnormal conditions and the sampled value thereof under normal conditions at a predetermined time before is produced; at 706, the absolute value of such a difference of 705 is obtained; at 707, the result of 706 is integrated over a predetermined range; and at 708, the result of 704 is divided by that of 707 thereby to obtain $|\dot{Z}_A|$. At 709, the sampled value $i_{A2}(t + \pi/2\omega)$ of the current at the installation end A at time point $(t + \pi/2\omega)$ before fault is multiplied by $|\dot{Z}_T|$; at 710, the result of 709 is subtracted from the sampled value $i_{A2}(t)$ of the voltage at the installation end A at a time point $t$, $\pi/2\omega$ before the time point $(t + \pi/2\omega)$, thereby to obtain $v_B(t)$; at 711, $|\dot{Z}_A|$ is multiplied by the source current $i_A(t + \pi/2\omega)$ at time point $(t + \pi/2\omega)$; at 712, the result of 711 is subtracted from that of 710 thereby to produce the instantaneous value $e_B(t)$ of the power source at the other end B; at 713, the difference between the instantaneous value $v_{Bf}(t)$ of the voltage at the other end B during the fault and the result $e_B(t)$ of 712 is produced; at 714, the result of 713 is divided by $|\dot{Z}_A|$; at 715, the result of 714 is subtracted from the present instantaneous value $i_{A1f}(t)$ on the first line during fault; at 716, the result of 715 is integrated over a predetermined range thereby to produce a value proportional to the effective value of fault current at the other end B; at 717, the instantaneous value of the current at the installation end B during fault is integrated over a predetermined range thereby to produce a value proportional to the value of fault current at the installation end A; at 718, the result of 716 is divided by that of 717 thereby to produce the ratio of fault currents, i.e., $\dot{I}_{Bf}/\dot{I}_{Af}$; at 719, the phase difference $\theta_2$ between the result of 715 during fault due to the change in the symbol of sampled values and the current at the installation end A is produced; and at 720, the equation below is obtained from the sampled values of the voltage and current at the installation end A during fault.

$$X_{FL1} = Z_{FL1} \sin \theta_1 \frac{v_A(t_1) i_A(t_2) - v_A(t_2) i_A(t_1)}{i_A(t_1)^2 + i_A(t_2)^2} \quad (119)$$

where $i_{Af}(t_1)$ and $v_{Af}(t_1)$ are sampled values at time point $t_1$, and $i_{Af}(t_2)$ and $v_{Af}(t_2)$ those at time point $t_2 (= t_1 + \pi/2\omega)$. At 721, the equation (120) below is produced from the sampled values of the voltage and current at the installation end during fault.

$$R_{FL1} = Z_{FL1} \cos \theta_1$$
$$= \frac{v_A(t_1) i_A(t_1) + v_A(t_2) i_A(t_2)}{i_A(t_1)^2 + i_A(t_2)^2} \quad (120)$$

From the results of equations (119) and (120) and FIG. 8, $$\left. \begin{array}{l} R_{FL1} = R_F(1 + \left|\frac{i_{Bf}}{i_{Af}}\right| \cos \theta_2) \\ X_{FL1} = X_1 + R_F \left|\frac{i_{Bf}}{i_{Af}}\right| \sin \theta_2 \end{array} \right\} \quad (121)$$

From equation (121), the reactance $X_1$ from the installation end A to the fault point is obtained as below.

$$X_1 = X_{FL1} - \frac{R_{FL1} \left|\frac{i_{Bf}}{i_{Af}}\right| \sin \theta_2}{1 + \left|\frac{i_{Bf}}{i_{Af}}\right| \cos \theta_2} \quad (122)$$

At 722, $X_1$ is computed from the results of 720, 721, 718 and 719 according to equation (122). At 723, the result $X_1$ of 722 is compared with a constant value $X_0$, and if $X_1$ is smaller than the constant value $X_0$, it means a fault within the fault-location calculation range, with the result that at 724, the distance up to the fault point from the installation end A is indicated. If the result of 723 is larger than the constant value, it means a fault outside of the fault-location calculation range and therefore transfer is made to the next sampling.

As will be seen from above, the method under consideration reduces the error due to arc resistance overcoming the disadvantages of the conventional systems, thereby making possible an accurate fault-location calculating system. Further, the fact that calculation is based on sampled values of voltage and current eliminates reduction in accuracy which is caused in the conventional systems by the phase relations of voltage and current.

Apart from the foregoing cases where the back impedances at the installation end A and the other end B are equal, if the back impedances are different at the installation end A and at the other end B, the back impedance at the other end B is obtained on the basis of its reverse proportion to the back source capacity and substituted into $Z_A$ of equation (116), thus permitting an accurate calculation.

In an eighth method, the voltage and current are introduced from the power transmission system by sampling, and the data thus introduced are converted into a symmetric coordinate system by the method of symmetrical coordinates, so that a fault-location is calculated from the shunt ratio of the symmetrical component current in the symmetric coordinate system.

Types of power transmission systems to which the method under consideration is applicable and equivalent circuits in the form of symmetric coordinate system will be described first below, and then by theoretical analysis, the principle of the method will be developed.

Calculation of a fault-location requires several factors:

(a) Number of lines utilized for each phase of a power transmission system involved: A power transmission system employs either one or two lines for each phase, on which the method of calculation depends.

(b) Manner of grounding: The power transmission system is grounded either at both ends or at one end.

(c) Load condition: The presence or absence of a load.

(d) Types of fault: Faults in a power transmission system include a one-line or two-line grounding fault and inter-line short-circuiting fault, etc.

Each calculation of a fault-location varies with different combinations of these factors. Specific cases will be described below. Different combinations of the above-mentioned factors, especially, in association with the grounding fault are shown in Table 1, in which 1$\phi$-G and 2$\phi$-G represent the cases of one phase grounding fault and two phases grounding fault respectively.

Table 1

| Type of fault | System Grounding Load | One line/phase | | | | Two lines/phase | | | |
|---|---|---|---|---|---|---|---|---|---|
| | | Both ends | | One end | | Both ends | | One end | |
| | | present | absent | present | absent | present | absent | present | absent |
| 1φ-G | | Case 1 | Case 2 | Case 3 | Case 4 | Case 9 | Case 10 | Case 11 | Case 12 |
| 2φ-G | | Case 5 | Case 6 | Case 7 | Case 8 | Case 13 | Case 14 | Case 15 | Case 16 |

Description will be made below in the order shown in Table 1.

Case 1

A system diagram for this case is shown in FIG. 26. The installation end is provided with a power source 310, a delta-connected transformer 312, and a star-connected transformer 314 with a neutral point thereof grounded through a grounding resistance. This installation end is connected through a power transmission line 316 to the other end which is provided with a star-connected transformer 318 with a neutral point grounded through a grounding resistance, a delta-connected transformer 320 and a load 322.

Figure 27:
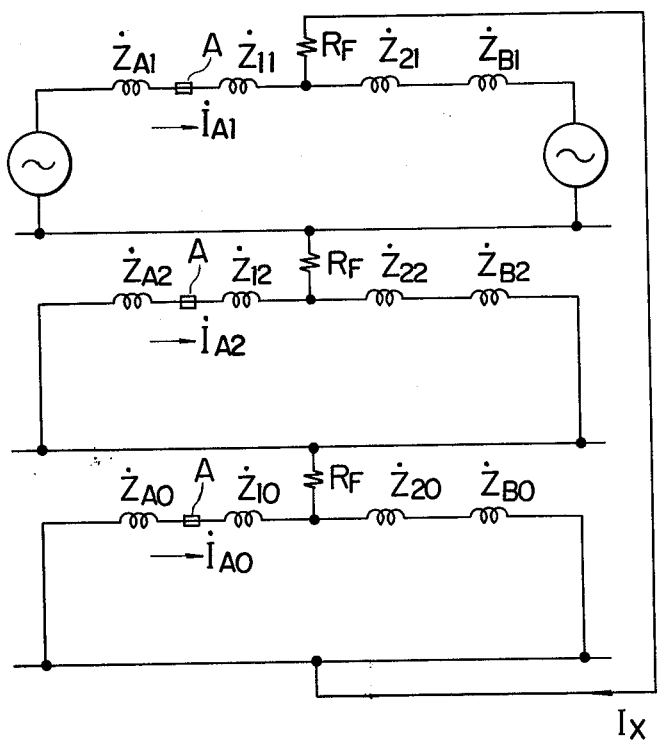

Assume one phase grounding fault occurs at point $P_F$. Currents of the respective phases are introduced and converted into positive-phase-sequence current, negative-phase-sequence current and zero-phase-sequence current by the method of symmetric coordinates. An equivalent circuit of the power transmission system in this case is shown in FIG. 27. In this drawing, impedances are also handled according to the method of symmetric coordinates. In this drawing, symbols $\dot{I}_{A1}$, $\dot{I}_{A2}$ and $\dot{I}_{A0}$ show positive-phase-sequence current, negative-phase-sequence current and zero-phase-sequence current respectively at the installation end; $R_F$ arc resistance; $m$ the ratio of the distance up to a fault point from the installation end to the total length of the power transmission line; $\dot{Z}_{A1}$, $\dot{Z}_{A2}$ and $\dot{Z}_{A0}$ positive-phase-sequence, negative-phase-sequence and zero-phase-sequence back impedances at the installation end respectively; $Z_{11}$, $Z_{12}$ and $Z_{10}$ positive-phase-sequence, negative-phase-sequence and zero-phase-sequence impedances of the power transmission line as viewed toward the installation end from the fault-location; $Z_{21}$, $Z_{22}$ and $Z_{20}$ positive-phase-sequence, negative-phase-sequence and zero-phase-sequence impedances of the power transmission line as viewed toward the other end from the fault location respectively and $\dot{Z}_{B1}$, $\dot{Z}_{B2}$ and $\dot{Z}_{B0}$ positive-phase-sequence, negative-phase-sequence and zero-phase-sequence back impedances at the other end.

In the wiring diagram of FIG. 26, equations below are established.

$$\dot{Z}_{A1} = \dot{Z}_{A2} = \dot{Z}_A \tag{123}$$

$$\dot{Z}_{11} = \dot{Z}_{12} = m\dot{Z}_{T1} \tag{124}$$

$$\dot{Z}_{21} = \dot{Z}_{22} = (1-m)\dot{Z}_{T1} \tag{125}$$

$$\dot{Z}_{B1} = \dot{Z}_{B2} = \dot{Z}_B \tag{126}$$

$$\dot{Z}_{10} = m\dot{Z}_{T0} \tag{127}$$

$$\dot{Z}_{20} = (1-m)\dot{Z}_{T0} \tag{128}$$

where $\dot{Z}_{T1}$ shows positive-phase-sequence impedance of the power transmission line, $\dot{Z}_{T2}$ negative-phase-sequence impedance of the same ($\dot{Z}_{T2} = \dot{Z}_{T1}$) and $\dot{Z}_{T0}$ the zero-phase-sequence impedance of the same.

$$\dot{I}_{A2} = \frac{\dot{Z}_{21} + \dot{Z}_{B1}}{\dot{Z}_A + \dot{Z}_{11} + \dot{Z}_{21} + \dot{Z}_{B1}} \dot{I}_X \tag{129}$$

$$\dot{I}_{A0} = \frac{\dot{Z}_{20} + \dot{Z}_{B0}}{\dot{Z}_{A0} + \dot{Z}_{10} + \dot{Z}_{20} + \dot{Z}_{B0}} \dot{I}_X \tag{130}$$

Substituting the relation of equations (123) to (128) into equations (129) and (130) above, equations (131) and (132) below are obtained.

$$\dot{I}_{A2} = \frac{(1-m)\dot{Z}_{T1} + \dot{Z}_B}{\dot{Z}_A + \dot{Z}_{T1} + \dot{Z}_B} \dot{I}_X \tag{131}$$

$$\dot{I}_{A0} = \frac{(1-m)\dot{Z}_{T0} + \dot{Z}_{B0}}{\dot{Z}_{A0} + \dot{Z}_{T0} + \dot{Z}_{B0}} \dot{I}_X \tag{132}$$

The ratio between $\dot{I}_{A2}$ and $\dot{I}_{A0}$ is introduced and the result is put into order as below.

$$(\dot{Z}_A + \dot{Z}_{T1} + \dot{Z}_B)(\dot{Z}_{T0} + \dot{Z}_{B0} - m\dot{Z}_{T0})\dot{I}_{A2} = (\dot{Z}_{A0} + \dot{Z}_{T0} + \dot{Z}_{B0})(\dot{Z}_{T1} + \dot{Z}_B - m\dot{Z}_{T1})\dot{I}_{A0} \tag{133}$$

Further, $m$ is obtained from equation (133).

$$m = \frac{(\dot{Z}_A + \dot{Z}_{T1} + \dot{Z}_B)(\dot{Z}_{T0} + \dot{Z}_{B0})\dot{I}_{A2} - (\dot{Z}_{A0} + \dot{Z}_{T0} + \dot{Z}_{B0})(\dot{Z}_{T1} + \dot{Z}_B)\dot{I}_{A0}}{(\dot{Z}_A + \dot{Z}_{T1} + \dot{Z}_B)\dot{Z}_{T0}\dot{I}_{A2} - (\dot{Z}_{A0} + \dot{Z}_{T0} + \dot{Z}_{B0})\dot{Z}_{T1}\dot{I}_{A0}} \tag{134}$$

This value $m$ shows the distance ratio up to the fault point from the installation end to the total length of the power transmission line, making possible detection of the fault location.

Case 2

Figure 28:
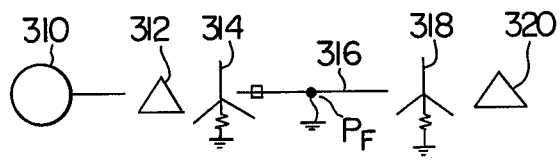
Figure 29:
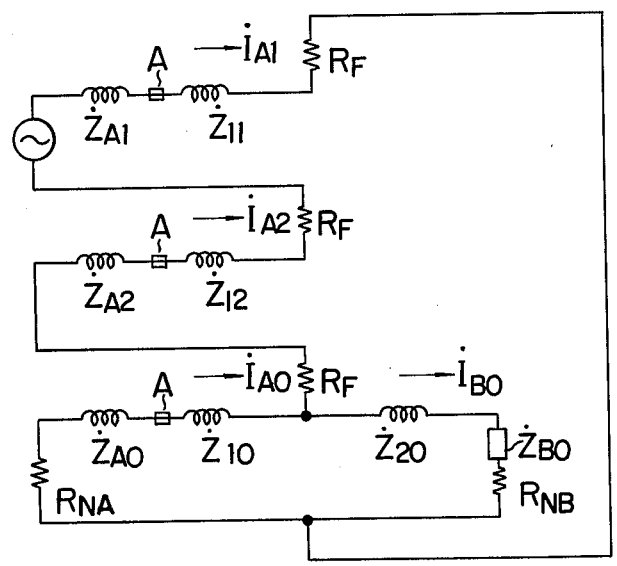

The system diagram for this case is shown in FIG. 28, and an equivalent circuit thereof in FIG. 29. In these drawings, like reference characters show like component elements as in FIGS. 26 and 27. Symbol $\dot{I}_{B0}$ shows the zero-phase-sequence current at the other end; $R_{NA}$ and $R_{NB}$ the grounding resistances at the installation end and the other end respectively; and $\dot{Z}_{T1}$, $\dot{Z}_{T2}$ and $\dot{Z}_{T0}$ positive-phase-sequence, negative-phase-sequence and zero-phase-sequence impedances of the power transmission line respectively.

$$\dot{Z}_{11} = m\dot{Z}_{T1} \tag{135}$$

$$\dot{Z}_{12} = m\dot{Z}_{T2} \tag{136}$$

$$\dot{Z}_{10} = m\dot{Z}_{T0} \tag{137}$$

$$\dot{Z}_{20} = (1-m)\dot{Z}_{T0} \tag{138}$$

Next, currents are related to each other as below.

$$\dot{I}_{A1} = \dot{I}_{A2} = \dot{I}_{A0} - \dot{I}_{B0} \tag{139}$$

The ratio between $\dot{I}_{A0}$ and $\dot{I}_{B0}$ is determined by the reverse ratio of zero-phase-sequence impedances at the fault location. Therefore, $$\frac{\dot{I}_{A0}}{\dot{I}_{B0}} = \frac{(1-m)\dot{Z}_{T0} + R_{NB} + \dot{Z}_{B0}}{R_{NA} + \dot{Z}_{A0} + m\dot{Z}_{T0}}. \tag{140}$$

From equation (140), $$m = \frac{-\dot{I}_{A0}(R_{NA} + \dot{Z}_{A0}) - \dot{I}_{B0}(\dot{Z}_{T0} + R_{NB} + \dot{Z}_{B0})}{\dot{Z}_{T0}\dot{I}_{A1}} \tag{141}$$

thus making possible detection of $m$.

Case 3

The system diagram and an equivalent circuit thereof are shown respectively in FIGS. 30 and 31, in which like component elements in FIGS. 26, 27 and 29 are denoted by like reference characters. $\dot{I}_{B1}$ and $\dot{I}_{B2}$ show positive-phase-sequence and negative-phase-sequence currents at the other end. Equations below are established.

$$\dot{Z}_{11} = m\dot{Z}_{T1} \tag{142}$$

$$\dot{Z}_{12} = m\dot{Z}_{T2} \tag{143}$$

$$\dot{Z}_{10} = m\dot{Z}_{T0} \tag{144}$$

$$\dot{Z}_{21} = (1-m)\dot{Z}_{T1} \tag{145}$$

$$\dot{Z}_{22} = (1-m)\dot{Z}_{T2} \tag{146}$$

Further, the currents of positive-phase-sequence and zero-phase-sequence are related to each other as $$\dot{I}_{A1} = \dot{I}_{A0} + \dot{I}_{B1} \tag{147}$$

where the positive-phase-sequence current $\dot{I}_{B1}$ at the other end is given as $$\dot{I}_{B1} = \dot{I}_{A1} - \dot{I}_{A0} \tag{148}$$

The relation between the positive-phase-sequence voltages at the installation end and the other end is expressed as $$\dot{E}_A - \dot{I}_{A1}(\dot{Z}_{A1} + m\dot{Z}_{T1}) = \dot{I}_{B1}\{(1-m)\dot{Z}_{T1} + \dot{Z}_{B1}\} \tag{149}$$

where $\dot{E}_A$ is the back voltage at the installation end. From equation (149), value $m$ is obtained as below.

$$m = \frac{\dot{E}_A - \dot{I}_{A1}\dot{Z}_{A1} - (\dot{Z}_{T1} + \dot{Z}_{B1})\dot{I}_{B1}}{\dot{I}_{A0}\dot{Z}_{T1}} \tag{150}$$

Cases 4 and 5

The principle of this method cannot be applied to these cases.

Case 6

Figure 33:
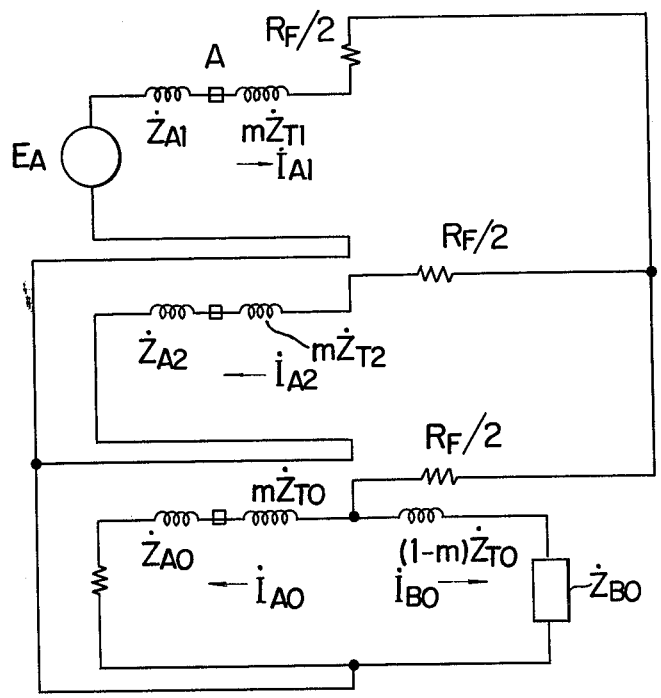

The system diagram for this case is shown in FIG. 32, and an equivalent circuit thereof in FIG. 33. In this and subsequent cases, the impedance of the power transmission line is indicated including $m$. Description of the preceding case almost applies to this case. From the ratio at the fault location, equation (151) below is introduced.

$$(\dot{Z}_{A0} + m\dot{Z}_{T0})\dot{I}_{A0} = \{(1-m)\dot{Z}_{T0} + \dot{Z}_{B0}\}\dot{I}_{B0} \tag{151}$$

The relation among the currents is $$\dot{I}_{A1} = \dot{I}_{A2} + \dot{I}_{A0} + \dot{I}_{B0} \tag{152}$$

$\dot{I}_{B0}$ is obtained from equation (151) and substituted into equation (152), as below.

$$\dot{I}_{A1} = \dot{I}_{A2} + \dot{I}_{A0}\frac{\dot{Z}_{T0} + \dot{Z}_{B0} + \dot{Z}_{A0}}{(1-m)\dot{Z}_{T0} + \dot{Z}_{B0}} \tag{153}$$

From equation (153) above, $m$ is determined as below.

$$m = \frac{(\dot{I}_{A1} - \dot{I}_{A2})(\dot{Z}_{T0} + \dot{Z}_{B0}) - \dot{I}_{A0}(\dot{Z}_{T0} + \dot{Z}_{B0} + \dot{Z}_{A0})}{\dot{Z}_{T0}(\dot{I}_{A1} - \dot{I}_{A2})} \tag{154}$$

Case 7

Figure 34:
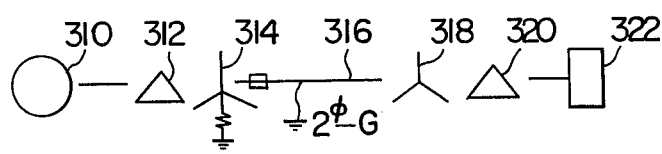
Figure 35:
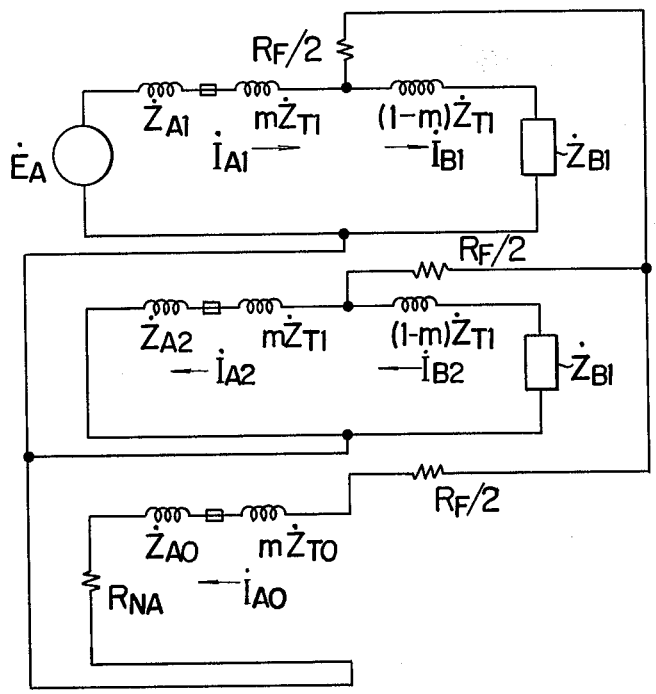

The system diagram for this case is shown in FIG. 34, and an equivalent circuit thereof in FIG. 35. The relation among currents at the fault-location gives the equations below.

$$(\dot{Z}_{A2} + m\dot{Z}_{T1})\dot{I}_{A2} = \{(1-m)\dot{Z}_{T1} + \dot{Z}_{B1}\}\dot{I}_{B2} \tag{155}$$

$$\dot{E}_A - (\dot{Z}_{A1} + m\dot{Z}_{T1})\dot{I}_{A1} = \{(1-m)\dot{Z}_{T1} + \dot{Z}_{B1}\}\dot{I}_{B1} \tag{156}$$

$$\dot{I}_{A1} = \dot{I}_{B1} + \dot{I}_{A2} + \dot{I}_{B2} + \dot{I}_{A0} \tag{157}$$

From equations (155) and (156), $\dot{I}_{B2}$ and $\dot{I}_{B1}$ are obtained and substituted into equation (157). Thus $$\dot{I}_{A1} = \frac{\dot{E}_A - (\dot{Z}_{A1} + m\dot{Z}_{T1})\dot{I}_{A1}}{(1-m)\dot{Z}_{T1} + \dot{Z}_{B1}} + \dot{I}_{12}\frac{\dot{Z}_{T1} + \dot{Z}_{B1} + \dot{Z}_{A2}}{(1-m)\dot{Z}_{T1} + \dot{Z}_{B1}} \tag{158}$$

From this equation (158), $m$ is obtained as below.

$$m = \frac{\dot{Z}_{B1} + \dot{Z}_{T1}}{\dot{Z}_{T1}} + \frac{1}{\dot{Z}_{T1}\dot{I}_{A0}}\{\dot{E}_A + \dot{I}_{A2}(\dot{Z}_{T1} + \dot{Z}_{B1} + \dot{Z}_{A2}) - \dot{I}_{A1}(\dot{Z}_{A1} + \dot{Z}_{B1} + \dot{Z}_{T1})\} \tag{159}$$

Case 8

The principle of the method under consideration is not applicable to this case.

Case 9

The system diagram for this case is shown in FIG. 36, and an equivalent circuit thereof in FIG. 37. From the relation among currents at the fault-location.

$$\dot{I}_{40} = \frac{(1-m)\dot{Z}_{T00}}{m\dot{Z}_{T00} + (1-m)\dot{Z}_{T00}}\dot{I}_X \tag{160}$$

$$\dot{I}_{A0} = \frac{(1-m)\dot{Z}_{T0} + \dot{Z}_{B0}}{\dot{Z}_{A0} + m\dot{Z}_{T0} + (1-m)\dot{Z}_{T0} + \dot{Z}_{B0}}\dot{I}_X \tag{161}$$

The ratio between $\dot{I}_{40}$ and $\dot{I}_{A0}$ is given as $$\frac{\dot{I}_{40}}{\dot{I}_{A0}} = \frac{(1-m)\dot{Z}_{T00}(\dot{Z}_{A0} + \dot{Z}_{T0} + \dot{Z}_{B0})}{\dot{Z}_{T00}\{\dot{Z}_{B0} + (1-m)\dot{Z}_{T0}\}} \quad (162)$$

From equation (162), $m$ is obtained as below.

$$m = \frac{\dot{I}_{40}\dot{Z}_{T00}(\dot{Z}_{B0} + \dot{Z}_{T0}) - \dot{I}_{A0}\dot{Z}_{T00}(\dot{Z}_{A0} + \dot{Z}_{T0} + \dot{Z}_{B0})}{\dot{Z}_{T0}\dot{Z}_{T00}\dot{I}_{40} - \dot{Z}_{T00}\dot{I}_{A0}(\dot{Z}_{A0} + \dot{Z}_{T0} + \dot{Z}_{B0})} \quad (163)$$

Case 10

Figure 38:
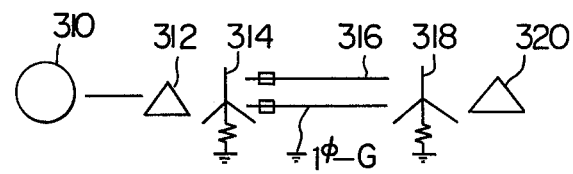
Figure 39:
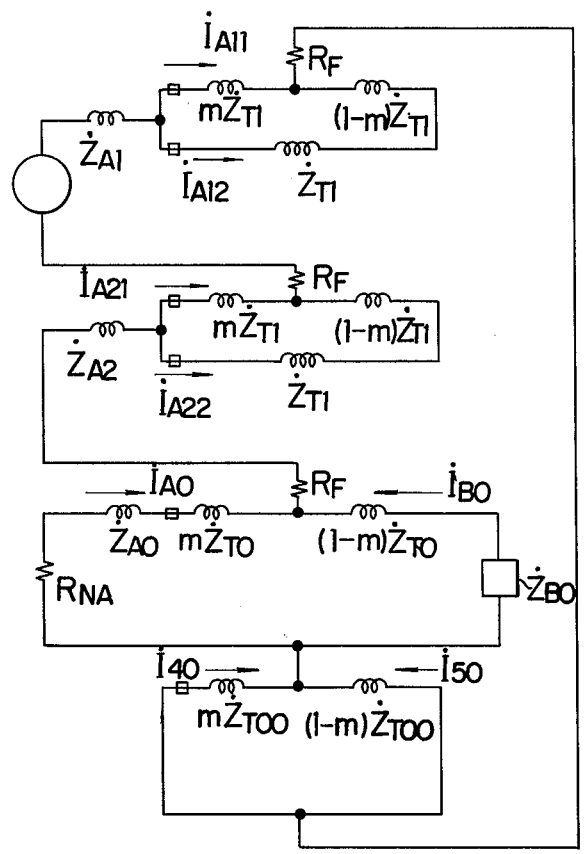

The system diagram for this case is shown in FIG. 38, and an equivalent circuit thereof in FIG. 39. The current relations at the fault-location gives $$m\dot{Z}_{T1}\dot{I}_{A11} = \{(1-m)\dot{Z}_{T1} + \dot{Z}_{T1}\}\dot{I}_{A12} \quad (164)$$

$$m\dot{Z}_{T1}(\dot{I}_{A11} + \dot{I}_{A12}) = 2\dot{Z}_{T1}\dot{I}_{A11} \quad (165)$$

Therefore $$m = \frac{2\dot{I}_{A12}}{\dot{I}_{A11} + \dot{I}_{A12}}. \quad (166)$$

In like manner, $$m\dot{Z}_{T1}\dot{I}_{A21} = \{(1-m)\dot{Z}_{T1} + \dot{Z}_{T1}\}\dot{I}_{A22} \quad (167)$$

From this equation (167), $m$ below is obtained.

$$m = \frac{2\dot{I}_{A22}}{\dot{I}_{A21} + \dot{I}_{A22}} \quad (168)$$

Case 11

The system diagram for this case is shown in FIG. 40, and an equivalent circuit thereof in FIG. 41. As in the preceding case, the relation among the currents gives $$m = \frac{\dot{Z}_{T1}(\dot{I}_{A0} - \dot{I}_{A21}) - (\dot{I}_{A21} + \dot{I}_{A22})(\dot{Z}_{A2} + \dot{Z}_{B1}) + \dot{Z}_{B1}\dot{I}_{A0}}{\dot{Z}_{T1} \cdot \dot{I}_{A0}}. \quad (169)$$

Case 12

The system diagram for this case is shown in FIG. 42, and an equivalent circuit thereof in FIG. 43. As in the preceding cases, $$\dot{I}_{A21} \cdot m\dot{Z}_{T1} = \{(1-m) + 1\}\dot{Z}_{T1} \cdot \dot{I}_{A22} \quad (170)$$

$$I_{A21} \cdot mZ_{T1} = 2Z_{T1}I_{A22} - mZ_{T1}I_{A22} \quad (171)$$

From these equations, $$m = \frac{2\dot{I}_{A22}}{\dot{I}_{A21} + \dot{I}_{A22}} \quad (172)$$

Case 13

This case is quite identical to case 9.

Case 14

Figure 44:
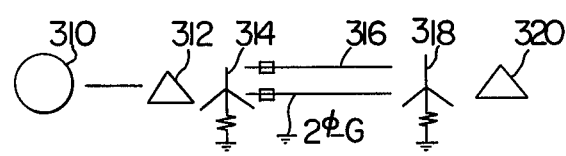
Figure 45:
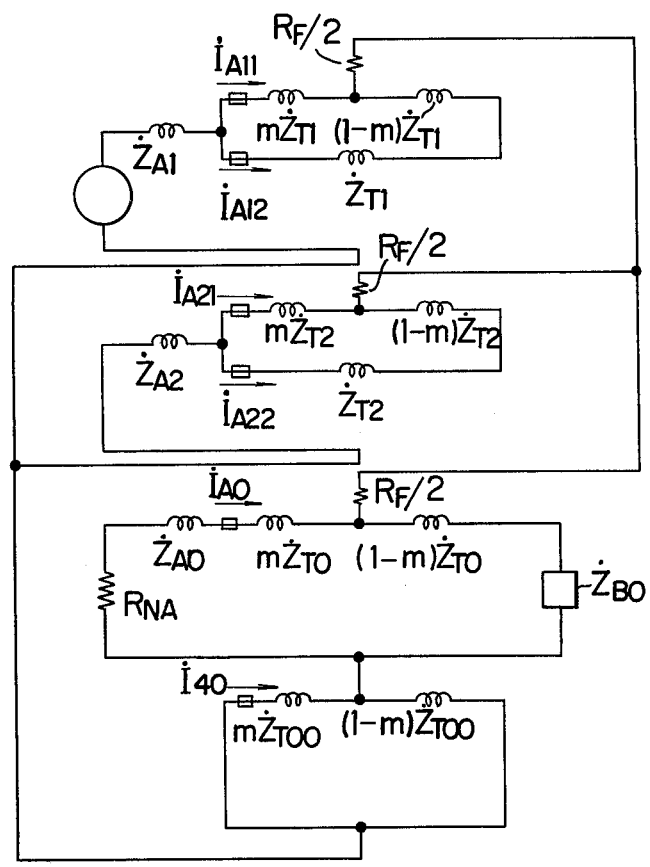

The system diagram for this case is shown in FIG. 44, and an equivalent circuit thereof in FIG. 45. As in the preceding case, $$m\dot{Z}_{T1}\dot{I}_{A11} = \{(1-m)\dot{Z}_{T1} + \dot{Z}_{T1}\}\dot{I}_{A12} \quad (173)$$

From this relation, $m$ is given as $$m = \frac{2\dot{I}_{A12}}{\dot{I}_{A11} + \dot{I}_{12}}. \quad (174)$$

Similarly, $$m\dot{Z}_{T2}\dot{I}_{A21} = \{(1-m)\dot{Z}_{T2} + \dot{Z}_{T2}\}\dot{I}_{A22} \quad (175)$$

From this equation (175), $$m = \frac{2\dot{I}_{A22}}{\dot{I}_{A21} + \dot{I}_{A22}}. \quad (176)$$

Case 15

Figure 46:
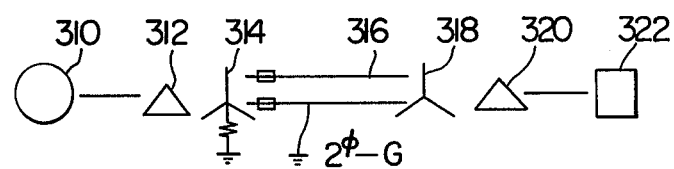
Figure 47:
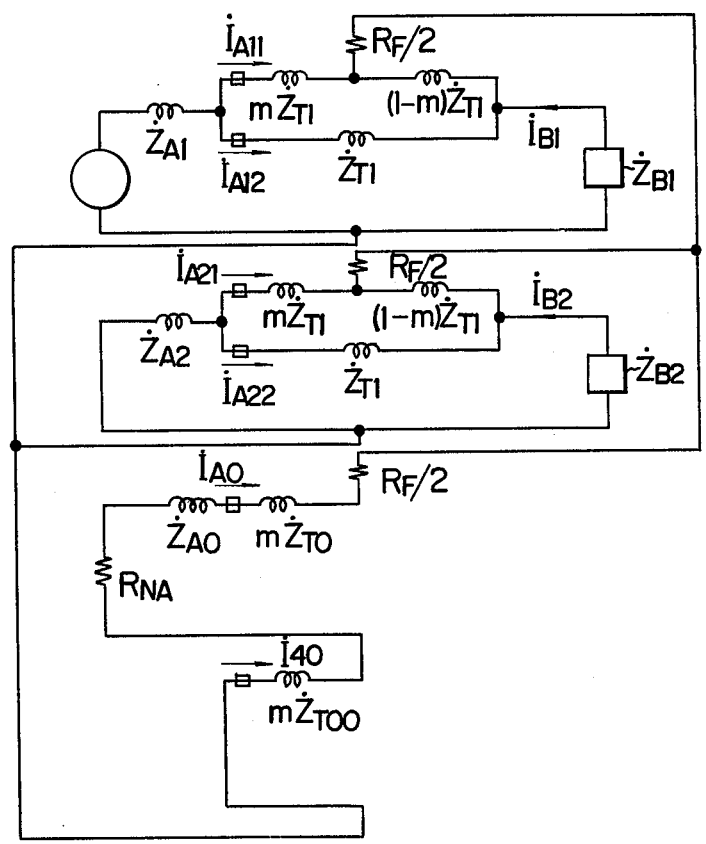

The system diagram for this case is shown in FIG. 46, and an equivalent circuit thereof in FIG. 47. As in the preceding case, $$\dot{I}_{A11} \cdot m\dot{Z}_{T1} = (1-m)(\dot{I}_{A12} + \dot{I}_{B1})\dot{Z}_{T1} + \dot{Z}_{T1}\dot{I}_{A12} \quad (177)$$

$$\dot{I}_{A21} \cdot m\dot{Z}_{T1} = (1-m)(\dot{I}_{A22} + \dot{I}_{B2})\dot{Z}_{T1} + \dot{Z}_{T1}\dot{I}_{A22} \quad (178)$$

$$\dot{I}_{A11} + \dot{I}_{A12} + \dot{I}_{B1} + \dot{I}_{A21} + \dot{I}_{A22} + \dot{I}_{B2} = -\dot{I}_{A0} \quad (179)$$

$\dot{I}_{B1}$ and $\dot{I}_{B2}$ are obtained from equations (177) and (178) respectively, and substituted into equation (179) so as to obtain $m$ as below.

$$m = 1 + \frac{\dot{I}_{A11} + \dot{I}_{A21} - \dot{I}_{A12} - \dot{I}_{A22}}{\dot{I}_{A0}}. \quad (180)$$

Case 16

Figure 48:
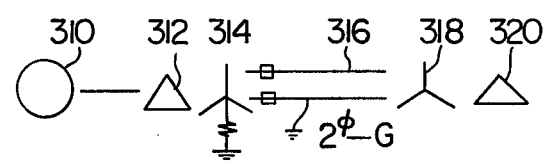
Figure 49:
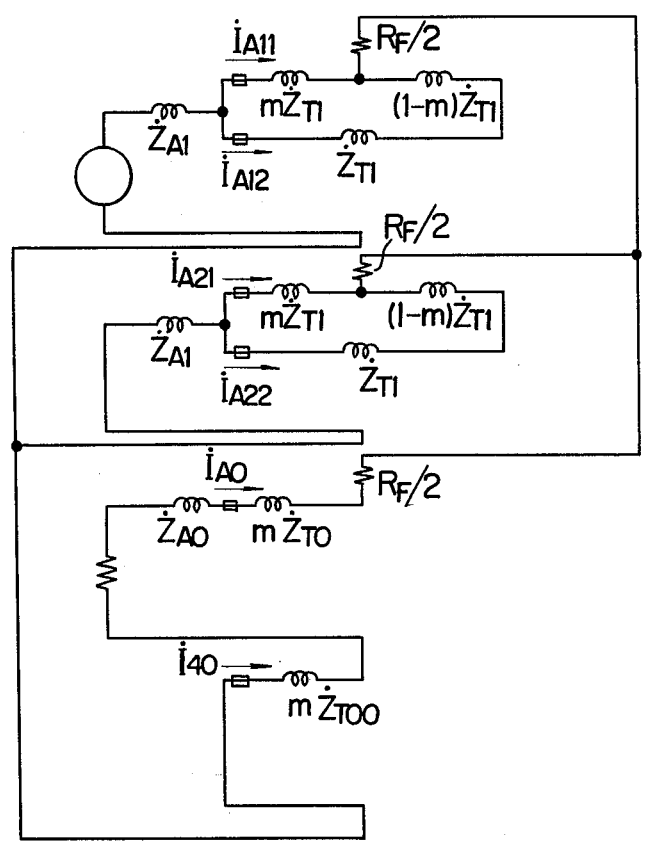

The system diagram for this case is shown in FIG. 48 and an equivalent circuit thereof in FIG. 49. As in the preceding case, $$\dot{I}_{A11} \cdot m\dot{Z}_{T1} = \{(1-m)\dot{Z}_{T1} + \dot{Z}_{T1}\}\dot{I}_{A12} \quad (181)$$

From this, $$m = \frac{2\dot{I}_{A12}}{\dot{I}_{A11} + \dot{I}_{A12}}. \quad (182)$$

Also, $$\dot{I}_{A21} \cdot m\dot{Z}_{T1} = \{(1-m)\dot{Z}_{T1} + \dot{Z}_{T1}\}\dot{I}_{A22} \quad (183)$$

From the equation (183) above, $m$ below is obtained.

$$m = \frac{2\dot{I}_{A22}}{\dot{I}_{A21} + \dot{I}_{A22}} \quad (184)$$

The cases 1 to 16 above concern calculation upon the grounding fault. This method is further applicable to inter-line short-circuiting faults. Such cases will be described below with reference to Table 2.

Table 2

| Type of fault | System Power source | | | |
|---|---|---|---|---|
| | One line/phase | | Two lines/phase | |
| | Both ends | One end | Both ends | One end |
| 2θ-S | Case 18 | | Case 19 | Case 20 |

Case 18

This method is not applicable to this case.

Cases 19 and 20

Figure 50:
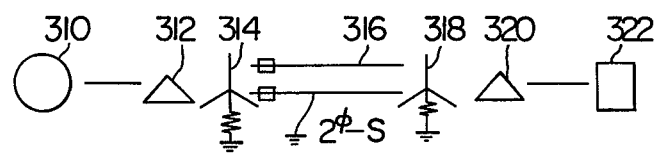
Figure 51:
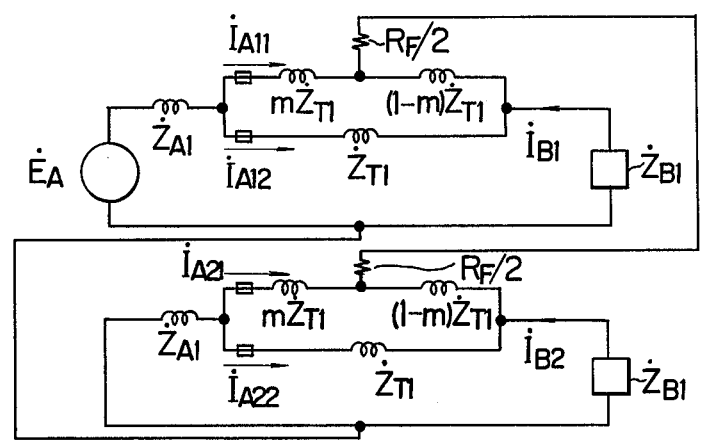

The system diagram of this case is shown in FIG. 50 and an equivalent circuit thereof in FIG. 51. As in the preceding case, $$\dot{I}_{A11} \cdot m\dot{Z}_{T1} = \dot{I}_{A12}\dot{Z}_{T1} + (1-m)\dot{Z}_{T1}(\dot{I}_{B1} + \dot{I}_{A12}) \quad (185)$$

$$\dot{I}_{A21} \cdot m\dot{Z}_{T1} + (\dot{I}_{A11} + \dot{I}_{A12} + \dot{I}_{B1})(1-m)\dot{Z}_{T1} = \dot{I}_{A22}\dot{Z}_{T1} \quad (186)$$

From these equations, $m$ is obtained below by solving the equations (185) and (186) for $m$.

$$m = \frac{\dot{I}_{A22} + \dot{I}_{A12} + \dot{I}_{A11}}{\dot{I}_{A21}} \quad (187)$$

Figure 52:
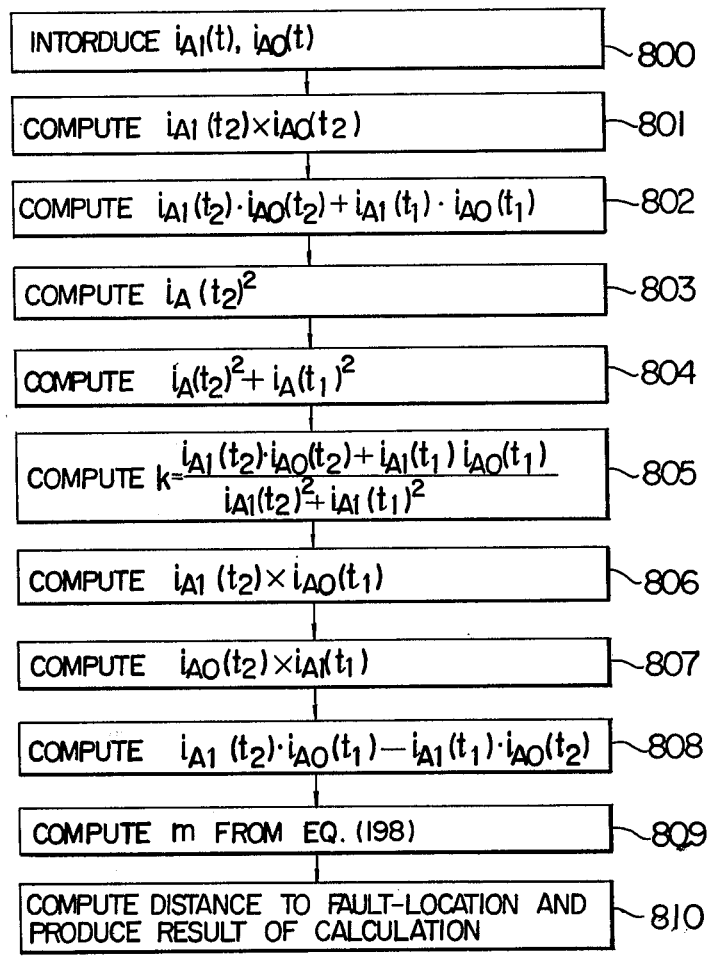
FIG. 52 is a flowchart of still another example of processes for fault-location calculation.

Actual processes for calculating the distance up to a fault location will be described below with specific reference to case 2 above. The process flowchart is shown in FIG. 52. First, description will be centered on numerical equations. From equation (139) is obtained equation (188) below.

$$\dot{I}_{B0} = \dot{I}_{A0} - \dot{I}_{A1} \quad (188)$$

Substituting this equation into equation (141), $$m = \frac{-\dot{I}_{A0}(R_{NA} + \dot{Z}_{A0} + \dot{Z}_{T0} + R_{NB} + \dot{Z}_{B0})}{\dot{I}_{A1}\dot{Z}_{T0}} + 1 + \frac{R_{NB} + \dot{Z}_{B0}}{\dot{Z}_{T0}} \quad (189)$$

In equation (189), each impedance is already known, and therefore the left sides of equations below are reduced to the simple forms on the right sides respectively.

$$\frac{R_{NA} + \dot{Z}_{A0} + \dot{Z}_{T0} + R_{NB} + \dot{Z}_{B0}}{\dot{Z}_{T0}} = k_1 + jk_2 \quad (190)$$

$$\frac{R_{NB} + \dot{Z}_{B0}}{\dot{Z}_{T0}} = k_3 + jk_4 \quad (191)$$

From these relations, equation (189) is rewritten as $$m = -\frac{\dot{I}_{A0}}{\dot{I}_{A1}}(k_1 + jk_2) + 1 + k_3 + jk_4. \quad (192)$$

Further, the instantaneous value of $\dot{I}_{A0}/\dot{I}_{A1}$ is given as $$\frac{\dot{I}_{A0}}{\dot{I}_{A1}} = -\left(\frac{i_{A1}(t_1)i_{A0}(t_1) + i_{A1}(t_2)i_{A0}(t_2)}{i_{A1}(t_1)^2 + i_{A1}(t_2)^2} + \right. \quad (193)$$

$$\left. j\frac{i_{A1}(t_2)i_{A0}(t_2) - i_{A1}(t_2)i_{A0}(t_1)}{i_{A1}(t_1)^2 + i_{A1}(t_2)^2}\right) = -(k_5 + jk_6),$$

where $i_{A1}(t_1)$ and $i_{A0}(t_1)$ are instantaneous values of $\dot{I}_{A1}$ and $\dot{I}_{A0}$ respectively at time point $t_1$, and $i_{A1}(t_2)$ and $i_{A0}(t_2)$ instantaneous values thereof at time point $t_2$ which is behind $t_1$ by $\pi/2\omega$. Also, these values may be expressed respectively as below.

$$i_{A1}(t_1) = I_{A1}\sin(\omega t_1) \quad (194)$$

$$i_{A0}(t_1) = I_{A0}\sin(\omega t + \gamma) \quad (195)$$

$$i_{A1}(t_2) = I_{A1}\cos(\omega t_1) \quad (196)$$

$$i_{A0}(t_2) = I_{A0}\cos(\omega t_1 + \gamma) \quad (197)$$

Since $m$ is a real number, it is obtained as $$m = -(k_1k_5 - k_2k_6) + 1 + k_3 \quad (198)$$

The process flowchart for above analysis and detection is shown in FIG. 52. At step 800, positive-phase-sequence and zero-phase-sequence currents are introduced; at step 801, $i_{A1}(t_2) \cdot i_{A0}(t_2)$ is obtained from the product of the present pieces of information; at step 802, $i_{A1}(t_2) \cdot i_{A0}(t_2)$ is added to $i_{A1}(t_1) \cdot i_{A0}(t_1)$; at step 803; the square of $i_{A1}(t_2)$ is obtained; at step 804, $i_A(t_2)^2$ is added to $i_A(t_1)^2$; at step 805, the result of step 802 is divided by that of step 804 to obtain $k_5$; at step 806, $i_{A0}(t_2)$ is multiplied by $i_{A1}(t_1)$ as of $\pi/2\omega$ earlier; at step 807, $i_{A1}(t_2)$ is multiplied by $i_{A0}(t_1)$ as of $\pi/2\omega$ earlier, at step 808, the result of step 807 is subtracted from that of step 806 and divided by the result of step 804 thereby to produce $k_6$; and at step 809, $m$ is produced by use of values $k_1$ and $k_2$ from equation (198) and indicated at step 810.

Figure 53:
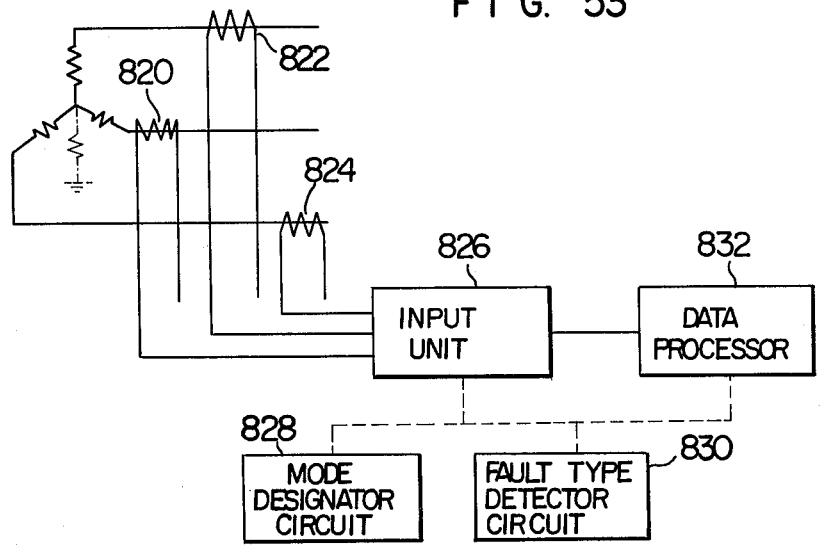
FIG. 53 is a schematic diagram showing a further embodiment of the present invention.

The foregoing processes are applicable also to the other cases. An embodiment capable of processing a plurality of the above cases in a power transmission system in which one line is employed for each phase is shown in FIG. 53. In this drawing, the respective phase currents are introduced by current transformers at 820, 822 and 824, and applied to an input unit 826. The input unit 826 decides which phase current should be actually received, depending on the case involved. This decision is made by being controlled by a mode designating circuit 828 and a fault type detector circuit 830. Data is applied from the input unit 826 to a processor 832. This processor 832 is also controlled by the mode designating circuit 828 and the detector circuit 830 for executing its own process in response to a command. The data processor 832 thus performs predetermined process in response to the data from the input unit 826 for calculation of a fault-location.

The above-mentioned methods have been discussed without referring to the time point when the fault-location calculation is started, for the mere purpose of simplification of explanation and illustration. But, it will be appliciated that, as already described earlier, although the fault-location calculating operation may be started immediately after the fault-occurrence has been detected, it would better be started immediately upon the reception of a signal indicating the circuit breaker has been opened from its closed state in view of more accurate fault-location calculation due to the use of data which was reduced in DC components of the power transmission system current.

We claim:
1. A digital fault-location calculating system for a power transmission system comprising:
first means coupled to said power transmission system for obtaining information indicating conditions of said power transmission system including voltage and current information;
a computer; and
second means coupled between said first means and said computer for transferring the information obtained by said first means from said first means to said computer, said second means transferring a signal indicating on-off conditions of a circuit breaker provided in said power transmission system from said circuit breaker to said computer;
said computer having at least two functions which are performed on the basis of the information transferred thereto through said second means and in accordance with predetermined processes, a first one of said at least two functions being the detection of occurrence of a fault in said power transmission system, a second one of said at least two functions being the calculation of distance to the fault point from the installation point of said digital fault-location calculating system on said power transmission system, said second function being performed only upon the detection of occurrence of a fault in said power transmission system by said first function and after said computer receives a circuit breaker open signal indicating said circuit breaker has been opened from its closed state.

2. A digital fault-location calculating system according to claim 1, in which said second function of said computer is performed on the basis of the pieces of information obtained by said first means immediately before said circuit breaker has been opened from its closed state among the information obtained by said first means.

3. A digital fault-location calculating system according to claim 2, in which said power transmission system subjected to fault-location calculation connects two power stations at its opposite ends, said digital fault-location calculating system being installed in the power station at one end of said power transmission system, said first means receiving the power transmission system voltage and current information at said one end of said power transmission system and further receiving the power transmission system voltage and current information at the other end of said power transmission system through an electric communication line, said computer performing vectorial operations by use of the respective power transmission system voltage and current information at said one and the other ends of said power transmission system received by said first means, thereby accomplishing said first and second functions thereof.

4. A digital fault-location calculating system according to claim 3, in which said first function of said computer comprises the steps of calculating the value of $I_A^2$ from the equation $I_A^2 = i_A(t_n)^2 + i_A(t_{n+1})^2$, comparing $I_A^2$ with $I_0^2$, and producing a signal indicating the fault occurrence when the relation $I_A^2 < I_0^2$ is not satisified, where $i_A(t_n)$ and $i_A(t_{n+1})$ are sampled values of current information at respective time points $t_n$ and $t_{n+1}$ received at the end of said power transmission system at which said digital fault-location calculating system is installed, $I_0$ is a reference setting, and $t_{n+1} = t_n + \pi/2\omega$, $\omega$ being an angular frequency.

5. A digital fault-location calculating system according to claim 4, in which said second function of said computer comprises the steps of calculating $\dot{V}_A - \dot{V}_B$, calculating $\dot{I}_A + \dot{I}_B$, calculating $\dot{Z}_T \cdot \dot{I}_B$, calculating $\dot{V}_A - \dot{V}_B + \dot{Z}_T \cdot \dot{I}_B$; dividing $\dot{V}_A - \dot{V}_B + \dot{Z}_T \cdot \dot{I}_B$ by $\dot{I}_A + \dot{I}_B$ to thereby produce $\dot{Z}_1$; and calculating the distance from said one end of said power transmission system to the fault point on the basis of the produced $\dot{Z}_1$; where $\dot{V}_A$ and $\dot{I}_A$ are voltage and current respectively at said one end of said power transmission system, $\dot{I}_B$ is the current at the other end of said power transmission system, and $\dot{Z}_T$ is the line impedance from said one end to the other end of said power transmission system.

6. A digital fault-location calculating system according to claim 2, in which said power transmission system subjected to fault-location calculation connects two power stations at its opposite ends, said digital fault-location calculating system being installed in the first power station at one end of said power transmission system, another digital fault-location calculating system identical to said first mentioned digital fault-location calculating system being installed in the second power station at the other end of said power transmission system, said first mentioned digital fault-location calculating system installed in said first power station and said another digital fault-location calculating system installed in said second power station performing their functions independently of each other to thereby calculate the respective distances to the fault point from said one and the other ends of said power transmission system, the result of the fault-location calculation performed by said first mentioned digital fault-location calculating system and the current information at said one end of said power transmission system introduced into said first mentioned digital fault-location calculating system being transferred to said another digital fault-location calculating system and vice versa so that the result of the fault-location calculation performed by each digital fault-location calculating system is corrected on the basis of the data transferred from the opposite digital fault-location calculating system.

7. A digital fault-location calculating system according to claim 6, in which said first function of said computer comprises the steps of calculating the value of $I_A^2$ from the equation $I_A^2 = i_A(t_n)^2 + i_A(t_{n+1})^2$, comparing $I_A^2$ with $I_0^2$, and producing a signal indicating the fault occurrence when the relation $I_A^2 < I_0^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_0$ is a reference setting, and $t_{n+1} = t_n + \pi/2\omega$, $\omega$ being an angular frequency.

8. A digital fault-location calculating system according to claim 7, in which said second function of said computer comprises the steps of calculating $v_A(t_1) \cdot i_A(t_2)$; calculating $v_A(t_2) \cdot i_A(t_1)$; calculating $v_A(t_1) \cdot i_A(t_2) - v_A(t_2) \cdot i_A(t_1)$; calculating $i_A(t_1)^2 + i_A(t_2)^2 = I_A^2$; calculating $$\frac{v_A(t_1) \cdot i_A(t_2) - v_A(t_2) \cdot i_A(t_1)}{I_A^2} = X_{FL1};$$

introducing $I_B^2$ and $X_{FL2}$ as a result of operation performed by said another digital fault-location system; calculating $I_B^2/I_A^2 = k^2$; calculating $X_{FL1}/k^2$; calculating $X_{FL2} - X_T + X_{FL1}/k^2$; calculating $1/k^2$; calculating $1/k^2 - 1$; calculating $$\frac{X_{FL2} - X_T + \dfrac{X_{FL1}}{k^2}}{\dfrac{1}{k^2} - 1} = X_1;$$

and calculating and producing the distance from said one end of said power transmission system to the fault point on the basis of the calculated value of $X_1$; where $$I_B{}^2 = i_B(t_1)^2 + i_B(t_2)^2;$$
$$X_{FL2} = \frac{v_B(t_1) \cdot i_B(t_2) - v_B(t_2) \cdot i_B(t_1)}{I_B{}^2};$$

$v_A(t_1)$ and $i_A(t_1)$ are respective sampled values of the voltage and current at said one end of said power transmission system at time point $t_1$; $v_A(t_2)$ and $i_A(t_2)$ are respective sampled values of the voltage and current at said one end of said power transmission system at time point $t_2$; $v_B(t_1)$ and $i_B(t_1)$ are respective sampled values of the voltage and current at said other end of said power transmission system at the time point $t_1$; $v_B(t_2)$ and $i_B(t_2)$ are respective sampled values of the voltage and current at said other end of said power transmission system at the time point $t_2$, $t_2$ being a sampling time point which is at or just before the time point at which said circuit breaker open signal is received, $t_1$ being the time point prior to the time point $t_2$ by $\pi/2\omega$, where $\omega$ is an angular frequency; $X_T$ is the reactance component of the line impedance from said one end to said other end of said power transmission system; and $X_{FL1}$ and $X_{FL2}$ are the respective reactance components of the power transmission system impedances as viewed from said one and the other end of said power transmission system toward the fault-location.

9. A digital fault-location calculating system according to claim 2, in which said power transmission system subjected to fault-location calculation connects two power stations at its opposite ends, said digital fault-location calculating system being installed in the power station at one end of said power transmission system, said first means receiving the power transmission system voltage and current information at said one end of said power transmission system and further receiving the power transmission system current information at the other end of said power transmission system, said computer calculating the power transmission system impedance at said one end of said power transmission system by use of the received power transmission system voltage and current information at said one end of said power transmission system and correcting the calculated power transmission system impedance at said one end of said power transmission system by use of the respective current information at said one and the other ends of said power transmission system to calculate the line impedance from said one end of said power transmission system to the fault point to thereby calculate the distance from said one end of said power transmission system to the fault point without any error which might be caused by a fault-location resistance and power flow.

10. A digital fault-location calculating system according to claim 9, in which said first function of said computer comprises the steps of calculating the value of $I_A{}^2$ from the equation $I_A{}^2 = i_A(t_n)^2 + i_A(t_{n+1})^2$, comparing $I_A{}^2$ with $I_0{}^2$, and producing a signal indicating the fault occurrence when the relation $I_A{}^2 < I_0{}^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_0$ is a reference setting, and $t_{n+1} = t_n + \pi/2\omega$, $\omega$ being an angular frequency.

11. A digital fault-location calculating system according to claim 10, in which said second function of said computer comprises the steps of calculating $v_A(t_1) \cdot i_A(t_2) - v_A(t_2) \cdot i_A(t_1)$ thereby to produce $V_A I_A \sin\theta_1$; calculating $v_A(t_1) \cdot i_A(t_1) + v_A(t_2) \cdot i_A(t_2)$ thereby to produce $V_A I_A \cos\theta_1$; calculating $i_A(t_1)^2 + i_A(t_2)^2$ thereby to produce $I_A{}^2$; calculating $i_C(t_1) \cdot i_A(t_2) - i_C(t_2) \cdot i_A(t_1)$ thereby to produce $I_C I_A \sin\theta$; calculating $i_C(t_1) \cdot i_A(t_1) + i_C(t_2) \cdot i_A(t_2)$ thereby to produce $I_C I_A \cos\theta$; calculating $$\left\{ V_A I_A \sin\theta_1 - V_A I_A \cos\theta_1 \frac{I_C I_A \sin\phi}{I_C I_A \cos\phi} \right\} \div I_A{}^2$$

thereby to produce $X_1$ as a result; comparing $X_1$ with $X_0$; and when the relation $X_1 \leqq X_0$ is satisfied, calculating and producing the distance from said one end of said power transmission system to the fault point by use of the produced $X_1$; where $v_A(t_1)$ and $i_A(t_1)$ are respective sampled values of the voltage $\dot{V}_A$ and current $\dot{I}_A$ at said one end of said power transmission system at time point $t_1$; $v_A(t_2)$ and $i_A(t_2)$ are respective sampled values of the voltage $\dot{V}_A$ and current $\dot{I}_A$ at time point $t_2$; $i_C(t_1)$ is the sum of $i_A(t_1)$ and $i_B(t_1)$; $i_C(t_2)$ is the sum of $i_A(t_2)$ and $i_B(t_2)$; $i_B(t_1)$ and $i_B(t_2)$ are sampled values of the current $\dot{I}_B$ at said other end of said power transmission system at time points $t_1$ and $t_2$ respectively, $t_2$ being a sampling time point which is at or just before the time point at which said circuit breaker open signal is received, $t_1$ being the time point prior to the time point $t_2$ by $\pi/2\omega$ where $\omega$ is an angular frequency; $V_A$ and $I_A$ are the maximum values of the voltage $\dot{V}_A$ and the current $\dot{I}_A$ respectively; $I_C$ is the maximum value of the current $\dot{I}_C$ which is the sum of $\dot{I}_A$ and $\dot{I}_B$; $\theta_1$ is the phase difference between $\dot{V}_A$ and $\dot{I}_A$; $\theta$ is the phase difference between $\dot{I}_A$ and $\dot{I}_C$; $X_1$ is the reactance component of the line impedance from said one end of said power transmission system to the fault point; and $X_0$ is a predetermined reference value.

12. A digital fault-location calculating system according to claim 2, in which said power transmission system subjected to fault-location calculation connects two power stations at its opposite ends, said digital fault-location calculating system being installed in the power station at one end of said power transmission system, said first means receiving the power transmission system voltage and current information at each of said one and the other ends of said power transmission system, said computer calculating by digital operations the power transmission system impedance at said one end of said power transmission system by use of the sampled values of the power transmission system voltage and current information at said one end of said power transmission system and correcting the calculated power transmission system impedance by use of the sampled value of the power transmission system voltage information at the other end of said power transmission system and the maximum value of the power transmission system current at the other end of said power transmission system to thereby calculate the line impedance and in turn the distance to the fault point from said one end of said power transmission system.

13. A digital fault-location calculating system according to claim 12, in which said first function of said computer comprises the steps of calculating the value of $I_A^2$ from the equation $I_A^2 = i_A(t_n)^2 + i_A(t_{n+1})^2$, comparing $I_A^2$ with $I_0^2$, and producing a signal indicating the fault occurrence when the relation $I_A^2 < I_0^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_O$ is a reference setting, and $t_{n+1} = t_n + \pi/2\omega$, $\omega$ being an angular frequency.

14. A digital fault-location calculating system according to claim 13, in which said second function of said computer comprises the steps of calculating $v_A(t_2)\cdot i_A(t_1) - v_A(t_1)\cdot i_A(t_2)$ thereby to produce $V_A I_A \sin\theta_1$; calculating $v_A(t_2)\cdot i_A(t_2) + v_A(t_1)\cdot i_A(t_1)$ thereby to produce $V_A I_A \cos\theta_1$; calculating $v_A(t_1)^2 + v_A(t_2)^2$ thereby to produce $V_A^2$; calculating $v_A(t_2)\cdot v_B(t_1) - v_A(t_1)\cdot v_B(t_2)$ thereby to produce $V_A V_B \sin\theta_2$; calculating $v_A(t_1)\cdot v_B(t_1) + v_A(t_2)\cdot v_B(t_2)$ thereby to produce $V_A V_B \cos\theta_2$; calculating $i_A(t_1)^2 + i_A(t_2)^2$ thereby to produce $I_A^2$; calculating $V_A I_A \sin\theta_1 \div I_A^2$ thereby to produce $Z_{FL1} \sin\theta_1$; calculating $V_A I_A \cos\theta_1 \div I_A^2$ thereby to produce $Z_{FL1} \cos\theta_1$; calculating $V_A^2 \sin\theta_2 \div V_A^2$ thereby to produce $\sin\theta_2$ under the assumption of $V_A \approx V_B$ and therefore $V_A V_B \sin\theta_2 \approx V_A^2 \sin\theta_2$; calculating $V_A^2 \cos\theta_2 \div V_A^2$ thereby to produce $\cos\theta_2$ under the assumption of $V_A \approx V_B$ and therefore $V_A V_B \cos\theta_2 \approx V_A^2 \cos\theta_2$; calculating $I_B \div I_A \times \sin\theta_2$ thereby to produce $C \sin\theta_2$, where $C = I_B/I_A$; calculating $C \times \cos\theta_2$ thereby to produce $C \cos\theta_2$; calculating $$Z_{FL1} \sin\theta_1 - \frac{Z_{FL1} \cos\theta_1}{1 + C \cos\theta_2} \cdot C \sin\theta_2$$

thereby to produce the result $Z_1$; and calculating and producing the distance from said one end of said power transmission system to the fault point by use of the produced value $Z_1$; where $v_A(t_1)$ and $i_A(t_1)$ are sampled values of the voltage $\dot{V}_A$ and current $\dot{I}_A$ respectively at said one end of said power transmission system at time point $t_1$; $v_A(t_2)$ and $i_A(t_2)$ are sampled values of the voltage $\dot{V}_A$ and the current $\dot{I}_A$ respectively at time point $t_2$; $v_B(t_1)$ and $v_B(t_2)$ are sampled values of the voltage $\dot{V}_B$ at said other end of said power transmission system at time points $t_1$ and $t_2$ respectively, $t_2$ being a sampling time point which is just or just before the time point at which said circuit breaker open signal is received, $t_1$ being the time point prior to the time point $t_2$ by $\pi/2\omega$ where $\omega$ is an angular frequency; $V_A$, $I_A$ and $V_B$ are the maximum values of the voltage $\dot{V}_A$, current $\dot{I}_A$ and voltage $\dot{V}_B$ respectively; $I_B$ is the maximum value of the current $\dot{I}_B$ at said other end of said power transmission system; $\theta_1$ is the phase difference between $\dot{V}_A$ and $\dot{I}_A$; $\theta_2$ is the phase difference between $\dot{I}_A$ and $\dot{I}_B$; $Z_{FL1}$ is the maximum value of the power transmission system impedance $\dot{Z}_{FL1}$ as viewed from said one end of said power transmission system toward the fault-location; and $Z_1$ is the maximum value of the line impedance $\dot{Z}_1$ from said one end of said power transmission system to said fault point.

15. A digital fault-location calculating system according to claim 2, in which said power transmission system subjected to fault-location calculation connects two power stations at its opposite ends, said digital fault-location calculating system being installed in the power station at one end of said power transmission system, said first means receiving the power transmission system voltage and current information at said one end of said power transmission system, said computer calculating the resistance component of the line impedance from said one end of said power transmission system to the fault point by use of the sampled values of the power transmission system voltage and current information received by said first means so that when the calculated resistance component exceeds a predetermined reference value said computer calculates the reactance component of said line impedance and at the same time estimates the phase difference between the respective currents at said one and the other ends of said power transmission system by use of the power transmission system voltage and current information received by said first means to thereby correct the calculated reactance component of said line impedance by use of said estimated phase difference to produce the distance to the fault point from said one end of said power transmission system.

16. A digital fault-location calculating system according to claim 15, in which said first function of said computer comprises the steps of calculating the value of $I_A^2$ from the equation $I_A^2 = i_A(t_n)^2 + i_A(t_{n+1})^2$, comparing $I_A^2$ with $I_0^2$, and producing a signal indicating the fault occurrence when the relation $I_A^2 < I_0^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_O$ is a reference setting and $t_{n+1} = t_n + \pi/2\omega$, $\omega$ being an angular frequency.

17. A digital fault-location calculating system according to claim 16, in which said second function of said computer comprises the steps of calculating $I_A Z_T \sin(\omega t + \beta) = e(t)$ thereby to produce $e(t)$; calculating $v_A(t) + e(t) = \hat{v}_B(t)$ thereby to produce $\hat{v}_B(t)$; comparing $v_A(t)$ with $\hat{v}_B(t)$ thereby to produce the phase difference $\hat{\theta}_2$ therebetween; producing $Z_{FL1} \cos\theta_1$ on the basis of $v_A(t)$ and $i_A(t)$; comparing $Z_{FL1} \cos\theta_1$ with $R_{AB}$; when the relation $Z_{FL1} \cos\theta_1 > R_{AB}$ is satisfied, producing $X_R$ on the basis of the relation $X_R = Z_{FL1} \sin(\theta_1 - k\hat{\theta}_2)$; when the relation $Z_{FL1} \cos\theta_1 > R_{AB}$ is not satisfied, producing $X_R$ on the basis of the relation $X_R = Z_{FL1} \sin\theta_1$; and calculating and producing the distance from said one end of said power transmission system to the fault point on the basis of the produced $X_R$; where $v_A(t)$ and $i_A(t)$ are sampled values of the voltage $\dot{V}_A$ and current $\dot{I}_A$ respectively at said one end of said power transmission system at time point $t$; $Z_T$ is the maximum value of the line impedance $\dot{Z}_T$ between said one and the other ends of said power transmission system; $\beta$ is the impedance angle of $\dot{Z}_T$; $Z_{FL1}$ is the maximum value of the power transmission system impedance $\dot{Z}_{FL1}$ as viewed from said one end of said power transmission system toward the fault-location; $\hat{v}_B(t)$ is the estimated value of the voltage $V_B$ at said other end of said power transmission system at time point $t$; $I_A$ is the maximum value of $\dot{I}_A$; $\theta_1$ is the phase difference between $\dot{V}_A$ and $\dot{I}_A$; $\hat{\theta}_2$ is the estimated value of $\theta_2$ which is the phase difference between $\dot{I}_A$ and $\dot{I}_B$, $\dot{I}_B$ being the current at said other end of said power transmission system; $k$ is a pregiven constant; $R_{AB}$ is the resistance component of $\dot{Z}_T$; and $X_R$ is the reactance component of $\dot{Z}_{FL1}$.

18. A digital fault-location calculating system according to claim 2, in which said power transmission system subjected to fault-location calculation connects two power stations at its opposite ends, said digital fault-location calculating system being installed in the power station at one end of said power transmission system, said first means receiving the power transmission system voltage and current information at said one end of said power transmission system and further receiving the phase difference between the respective currents at said one and the other ends of said power transmission system, said computer performing digital operations by use of sampled values of the power transmission system voltage and current information at said one end of said power transmission system to calculate the power transmission system impedance at said one end of said power transmission system and correct the calculated power transmission system impedance by use of the sine and cosine of the received phase difference between the respective currents at said one and the other ends of said power transmission system to thereby calculate the line impedance to the fault point from said one end of said power transmission system to produce the distance to the fault point from said one end of said power transmission system.

19. A digital fault-location calculating system according to claim 18, in which said first function of said computer comprises the steps of calculating the value of $I_A^2$ from the equation $I_A^2 = i_A(t_n)^2 + i_A(t_{n+1})^2$, comparing $I_A^2$ with $I_O^2$, and producing a signal indicating the fault occurrence when the relation $I_A^2 < I_O^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_O$ is a reference setting, and $t_{n+1} = t_n + \pi/2\omega$, $\omega$ being an angular frequency.

20. A digital fault-location calculating system according to claim 19, in which said second function of said computer comprises the steps of calculating $i_A(t_1)^2 + i_A(t_2)^2$ thereby to produce $I_A^2$; calculating $v_A(t_2) \cdot i_A(t_1) - v_A(t_1) \cdot i_A(t_2)$ thereby to produce $V_A I_A \sin \theta_1$; calculated $v_A(t_2) \cdot i_A(t_2) + v_A(t_1) \cdot i_A(t_1)$ thereby to produce $V_A I_A \cos \theta_1$; dividing $V_A I_A \sin \theta_1$ by $I_A^2$ thereby to produce $Z_{FL1} \sin \theta_1$; dividing $V_A I_A \cos \theta_1$ by $I_A^2$ thereby to produce $Z_{FL1} \cos \theta_1$; introducing data $\theta_2$ thereby to produce $\sin \theta_2$ and $\cos \theta_2$; calculating $$\frac{Z_{FL1} \sin \theta_1}{Z_T - Z_{FL1} \sin \theta_1},$$

the result of which is hereinafter referred to as C; calculating $$Z_{FL1} \sin \theta_1 - \frac{Z_{FL1} \cos \theta_1}{1 + C \cos \theta_2} C \sin \theta_2$$

thereby to produce the value of $Z_1$ as the result of this step; and calculating and producing the distance from said one end of said power transmission system to the fault point on the basis of the produced value $Z_1$; where $v_A(t_1)$ and $i_A(t_1)$ are sampled values of the voltage $V_A$ and current $I_A$ respectively at said one end of said power transmission system at time point $t_1$; $v_A(t_2)$ and $i_A(t_2)$ are sampled values of $V_A$ and $I_A$ respectively at time point $t_2$, $t_2$ being a sampling time point which is at or just before the time point at which said circuit breaker open signal is received, $t_1$ being the time point prior to the time point $t_2$ by $\pi/2\omega$ where $\omega$ is an angular frequency; $V_A$ and $I_A$ are the maximum values of $V_A$ and $I_A$ respectively; $\theta_1$ is the phase difference between $V_A$ and $I_A$; $\theta_2$ is the phase difference between $I_A$ and $I_B$ which is the current at said other end of said power transmission system; $Z_{FL1}$ is the maximum value of the power transmission impedance $Z_{FL1}$ as viewed from said one end of said power transmission system toward the fault-location; $Z_T$ is the maximum value of the line impedance $Z_T$ from said one end of said power transmission system to said other end of the same; and $Z_1$ is the maximum value of the line impedance from said one end of said power transmission system to said fault point.

21. A digital fault-location calculating system according to claim 2, in which said power transmission system subjected to fault-location calculation connects two power stations at its opposite ends and employs two power transmission lines for each phase thereof, said digital fault-location calculating system being installed in the power station at one end of said power transmission system, said first means receiving the power transmission system voltage and current information at said one end of said power transmission system, said computer performing digital operations such that said computer estimates the voltage at the other end of said power transmission system by use of sampled values of the power transmission system voltage and current information received by said first means before the occurrence of a fault, then estimates the current at the other end of said power transmission system during the fault by use of the current information in sound one of the two power transmission lines by any phase in which the fault has occurred and the estimated voltage at the other end of said power transmission system, calculates the reactance and resistance components of line impedance from said one end of said power transmission system to the fault point by use of the sampled power transmission system voltage and current information received by said first means, and then calculates the line reactance from said one end of said power transmission line to said fault point by use of said estimated voltage, said estimated current and said calculated reactance and resistance components to thereby produce the distance from said one end of said power transmission system to said fault point.

22. A digital fault-location calculating system according to claim 21, in which said first function of said computer comprises the steps of calculating the value of $I_A^2$ from the equation $I_A^2 = i_A(t_n)^2 + i_A(t_{n+1})^2$, comparing $I_A^2$ with $I_O^2$, and producing a signal indicating the fault occurrence when the relation $I_A^2 < I_O^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_O$ is a reference setting, and $t_{n+1} = t_n + \pi/2\omega$, $\omega$ being an angular frequency.

23. A digital fault-location calculating system according to claim 2, in which said computer converts sampled values of voltage and current information transferred through said second means into values in symmetric coordinate system and calculates the distance from the portion at which said digital fault-location calculating system is installed to the fault point by use of the relations between the symmetric current components in the symmetric coordinate system.

24. A digital fault-location calculating system according to claim 23, in which said first function of said computer comprises the steps of calculating the value of $I_A^2$ from the equation $I_A^2 = i_A(t_n)^2 + i_A(t_{n+1})^2$, comparing $I_A^2$ with $I_O^2$, and producing a signal indicating the fault occurrence when the relation $I_A^2 < I_O^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_O$ is a reference setting, and $t_{n+1} = t_n + \pi/2\omega$, $\omega$ being an angular frequency.

25. A digital fault-location calculating system according to claim 2, in which said first function of said computer comprises the steps of calculating the value of $I_A^2$ from the equation $I_A^2 = i_A(t_n)^2 + i_A(t_{n+1})^2$, comparing $I_A^2$ with $I_O^2$, and producing a signal indicating the fault occurrence when the relation $I_A^2 < I_O^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_O$ is a reference setting, and $t_{n+1} = t_n + \pi/2\omega$, $\omega$ being an angular frequency.

26. A digital fault-location calculating system according to claim 1, in which said second function of said computer is performed after a trip signal is transferred to said circuit breaker from said computer upon the detection of occurrence of a fault by said first function of said computer.

27. A digital fault-location calculating system according to claim 26, in which said first function of said computer comprises the steps of calculating the value of $I_A^2$ from the equation $I_A^2 = i_A(t_n)^2 + i_A(t_{n+1})^2$, comparing $I_A^2$ with $I_O^2$, and producing a signal indicating the fault occurrence when the relation $I_A^2 < I_O^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_O$ is a reference setting, and $t_{n+1} = t_n + \pi/2\omega$, $\omega$ being an angular frequency.

28. A digital fault-location calculating system according to claim 1, in which said first function of said computer comprises the steps of calcuating the value of $I_A^2$ from the equation $I_A^2 = i_A(t_n)^2 + i_A(t_{n+1})^2$, comparing $I_A^2$ with $I_O^2$, and producing a signal indicating the fault occurrence when the relation $I_A^2 < I_O^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_O$ is a reference setting, and $t_{n+1} = t_n + \pi/2\omega$, $\omega$ being an angular frequency.

29. A digital fault-location calculating system according to claim 1, in which said first function of said computer comprises the steps of calculating the value of $I_A^2$ from the equation $I_A^2 = i_A(t_n)^2 + i_A(t_{n+1})^2$, comparing $I_A^2$ with $I_O^2$, and producing a signal indicating the fault occurrence when the relation $I_A^2 < I_O^2$ is not satisfied, where $i_A(t_n)$ and $i_A(t_{n+1})$ are sampled values of current information at respective time points $t_n$ and $t_{n+1}$ received at the end of said power transmission system at which said digital fault-location calculating system is installed, $I_O$ is a reference setting, and $t_{n+1} = t_n + \pi/2\omega$, $\omega$ being an angular frequency.

30. A digital fault-location calculating system for a power transmission system comprising:
  first means coupled to said power transmission system for obtaining information indicating conditions of said power transmission system at both ends of said power transmission system;
  a computer; and
  second means coupled between said first means and said computer for transferring the information obtained by said first means from said first means to said computer, said second means transferring a signal indicating on-off conditions of a circuit breaker provided in said power transmission system from said circuit breaker to said computer;
  said computer having at least two functions which are performed on the basis of the information transferred thereto through said second means and in accordance with predetermined processes, a first one of said at least two functions being the detection of occurrence of a fault in said power transmission system, a second one of said at least two functions being the calculation of distance to the fault point from the installation point of said digital fault-location calculating system on said power transmission system, and second function being performed only upon the detection of occurrence of a fault in said power transmission system by said first function and after said computer receives a circuit breaker open signal indicating said circuit breaker has been opened from its closed state.

* * * * *